(12) United States Patent
Sirinorakul et al.

(10) Patent No.: US 11,901,308 B2
(45) Date of Patent: Feb. 13, 2024

(54) SEMICONDUCTOR PACKAGES WITH INTEGRATED SHIELDING

(71) Applicant: UTAC Headquarters Pte. Ltd., Singapore (SG)

(72) Inventors: Saravuth Sirinorakul, Bangkok (TH); Il Kwon Shim, Singapore (SG); Kok Chuen Lock, Dongguan (CN); Roel Adeva Robles, Singapore (SG); Eakkasit Dumsong, Bangkok (TH)

(73) Assignee: UTAC HEADQUARTERS PTE. LTD., Singapore (SG)

( * ) Notice: Subject to any disclaimer, the term of this patent is extended or adjusted under 35 U.S.C. 154(b) by 93 days.

(21) Appl. No.: 17/382,283

(22) Filed: Jul. 21, 2021

(65) Prior Publication Data

US 2022/0028798 A1 Jan. 27, 2022

Related U.S. Application Data

(60) Provisional application No. 63/054,788, filed on Jul. 21, 2020.

(51) Int. Cl.
| | |
|---|---|
| *H01L 23/552* | (2006.01) |
| *H01L 23/36* | (2006.01) |
| *H01L 23/31* | (2006.01) |
| *H01L 23/00* | (2006.01) |
| *H01L 21/56* | (2006.01) |
| *H01L 23/495* | (2006.01) |

(52) U.S. Cl.
CPC ............ *H01L 23/552* (2013.01); *H01L 21/56* (2013.01); *H01L 23/3107* (2013.01); *H01L 23/36* (2013.01); *H01L 23/49503* (2013.01); *H01L 24/32* (2013.01); *H01L 2224/32245* (2013.01)

(58) Field of Classification Search
CPC ... H01L 23/552; H01L 23/36; H01L 23/3107; H01L 23/495; H01L 23/49503
USPC .................................................. 257/659, 675
See application file for complete search history.

(56) References Cited

U.S. PATENT DOCUMENTS

| | | | | |
|---|---|---|---|---|
| 5,294,826 | A * | 3/1994 | Marcantonio | ....... H01L 23/4334 257/E23.128 |
| 5,552,635 | A * | 9/1996 | Kim | ........................ H01L 23/42 257/E23.09 |
| 5,596,231 | A * | 1/1997 | Combs | ................ H01L 23/4334 257/776 |
| 6,614,102 | B1 | 9/2003 | Hoffman et al. | |
| 6,720,649 | B2 * | 4/2004 | Huang | ................ H01L 23/4334 257/796 |
| 7,808,087 | B2 * | 10/2010 | Zhao | ..................... H01L 23/552 257/670 |
| 7,960,818 | B1 * | 6/2011 | Davis | ................ H01L 23/49503 257/676 |

(Continued)

*Primary Examiner* — Nitin Parekh
(74) *Attorney, Agent, or Firm* — HORIZON IP PTE LTD.

(57) ABSTRACT

The present disclosure is directed to improving EMI shielding to provide more reliable semiconductor packages. The semiconductor package may be, for example, a lead frame including one or multiple dies attached thereto. The semiconductor package may include only wire bonds or a combination of clip bonds and wire bonds. An integrated shielding structure may be disposed in between the package substrate and the encapsulant to shield internal and/or external EMI. For example, a top surface of the integrated shield structure is exposed.

20 Claims, 48 Drawing Sheets

(56) References Cited

U.S. PATENT DOCUMENTS

| | | | |
|---|---|---|---|
| 2004/0266068 A1* | 12/2004 | Matayabas, Jr. | H01L 23/3135 257/E23.125 |
| 2005/0095875 A1* | 5/2005 | Huang | H01L 23/3128 257/E23.092 |
| 2006/0223237 A1* | 10/2006 | Combs | H01L 23/3128 257/E23.101 |
| 2007/0267734 A1* | 11/2007 | Zhao | H01L 21/561 257/E23.092 |
| 2011/0049685 A1* | 3/2011 | Park | H01L 23/3107 257/E23.114 |
| 2012/0126378 A1* | 5/2012 | San Antonio | H01L 23/552 257/659 |
| 2014/0167231 A1* | 6/2014 | Fan | H01L 23/552 257/659 |
| 2019/0043810 A1* | 2/2019 | Kapusta | H01L 24/19 |

* cited by examiner

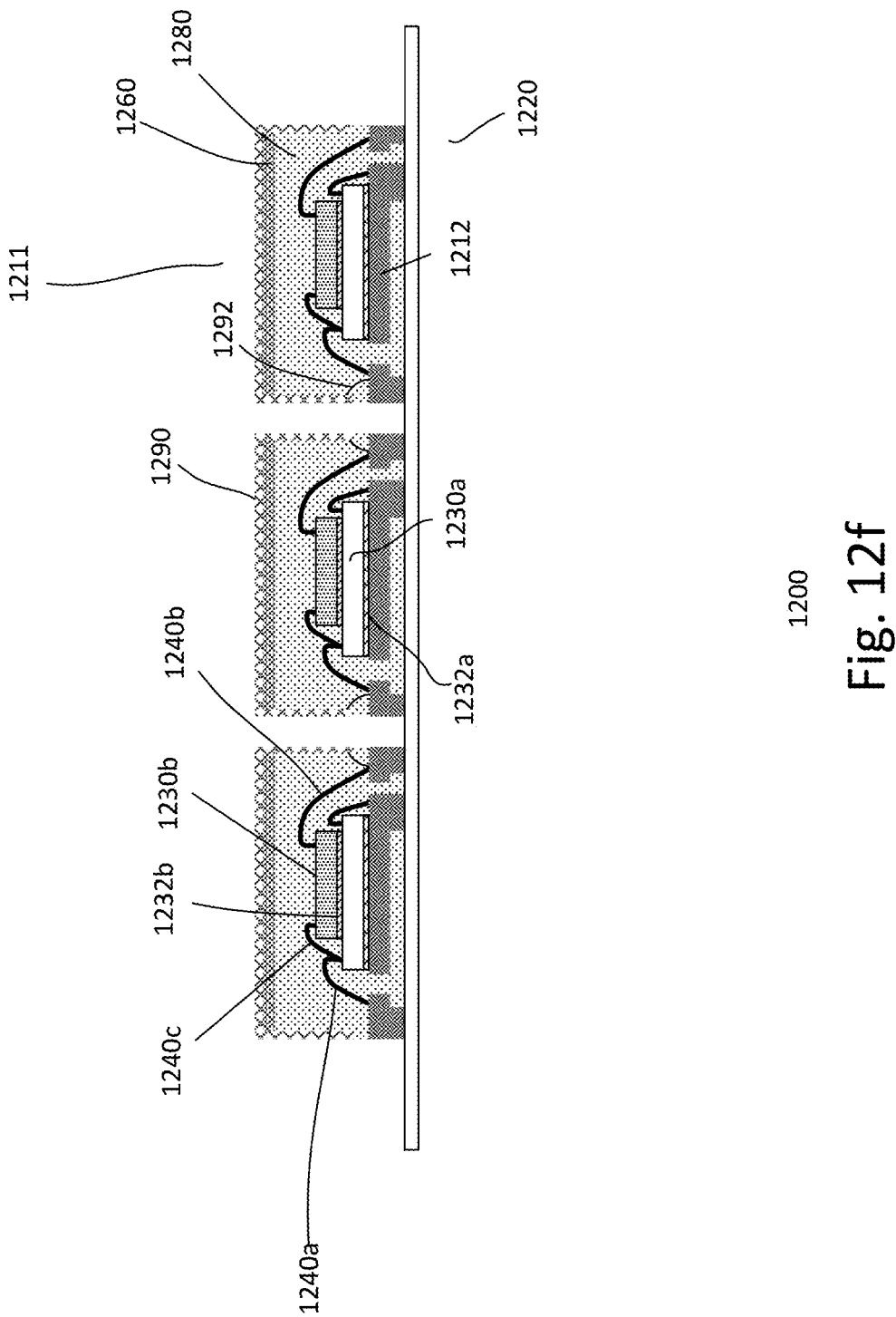

SEMICONDUCTOR PACKAGES WITH INTEGRATED SHIELDING

CROSS-REFERENCE TO RELATED APPLICATION

This application claims the benefit of U.S. Provisional Application Ser. No. 63/054,788, filed on Jul. 21, 2020, which is herein incorporated by reference in its entirety for all purposes.

FIELD OF THE INVENTION

The present invention generally relates to semiconductor packages and the manufacturing method of such packages. More specifically, the present invention is directed to improving EMI shielding within the package to provide more reliable semiconductor packages.

BACKGROUND

The recent rapid dissemination of smartphones and other mobile and wearable electronic terminals reflects the demand for faster, thinner and smaller products which are more compact and power-efficient. To meet these requirements, manufacturers are packing more electronic components or modules within a small footprint to support high performance and advanced functionalities. As a result of the close proximity between the modules or devices, it is important to employ excellent shielding solutions to avoid electromagnetic interferences (EMI) issues which can negatively impact reliability.

Typically, EMI shielding may be performed by placing a metal enclosure such as a grounded metal can over individual modules or devices to be shielded. However, this increases the package size and therefore reduces the overall competitive functionalities and compactness of the product. Moreover, existing EMI shields suffer from various design and production limitations.

Therefore, from the foregoing discussion, there is a desire to provide an integrated EMI shield within a footprint of the package for effective EMI shielding, which in turn improves reliability of semiconductor packages.

SUMMARY

In one embodiment, a method for forming a device includes providing a package substrate configured with a die attach pad (DAP) and package pads, attaching a die to the DAP, wherein the die is electrically coupled to the package pads, and attaching an electromagnetic interference (EMI) shield structure to the package substrate. The EMI shield structure is disposed over the die on the DAP, wherein the EMI shield structure is electrically coupled to ground.

In another embodiment, a device includes a package substrate configured with a die attach pad (DAP) and package pads, a die disposed on the DAP, the die is electrically coupled to the package pads, and an electromagnetic interference (EMI) shield structure. The EMI shield structure includes a planar member covering the die, wherein the EMI shield structure is electrically coupled to ground.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 12a to 12f show another embodiment of a process for forming semiconductor packages with shield structures by parallel processing.

DETAILED DESCRIPTION

Embodiments relate to semiconductor packages and the manufacturing method of such packages. More specifically, the present invention is directed to improving EMI shielding within the package to provide more reliable semiconductor packages. A semiconductor package may include a single or multiple semiconductor dies or chips. The semiconductor package may include only clip bonds or only wire bonds or a combination of clip bonds and wire bonds. In addition, in the case of a multiple dies package, the dies may be configured in a planar or stacked configuration or a combination thereof.

Figure 1A:
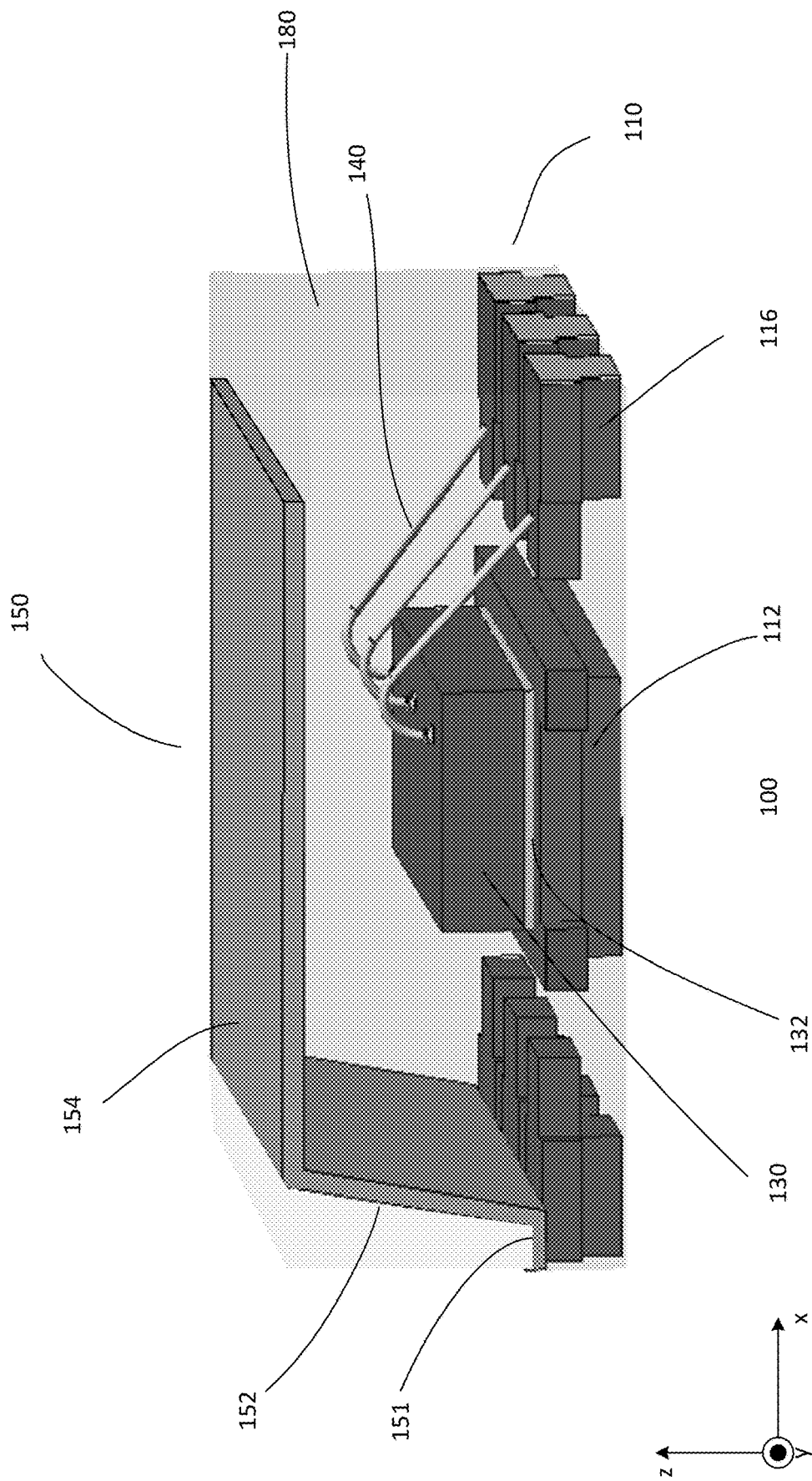
FIGS. 1a to 1b show simplified 3D and side views of an embodiment of a semiconductor package with a shielding structure.
Figure 1B:
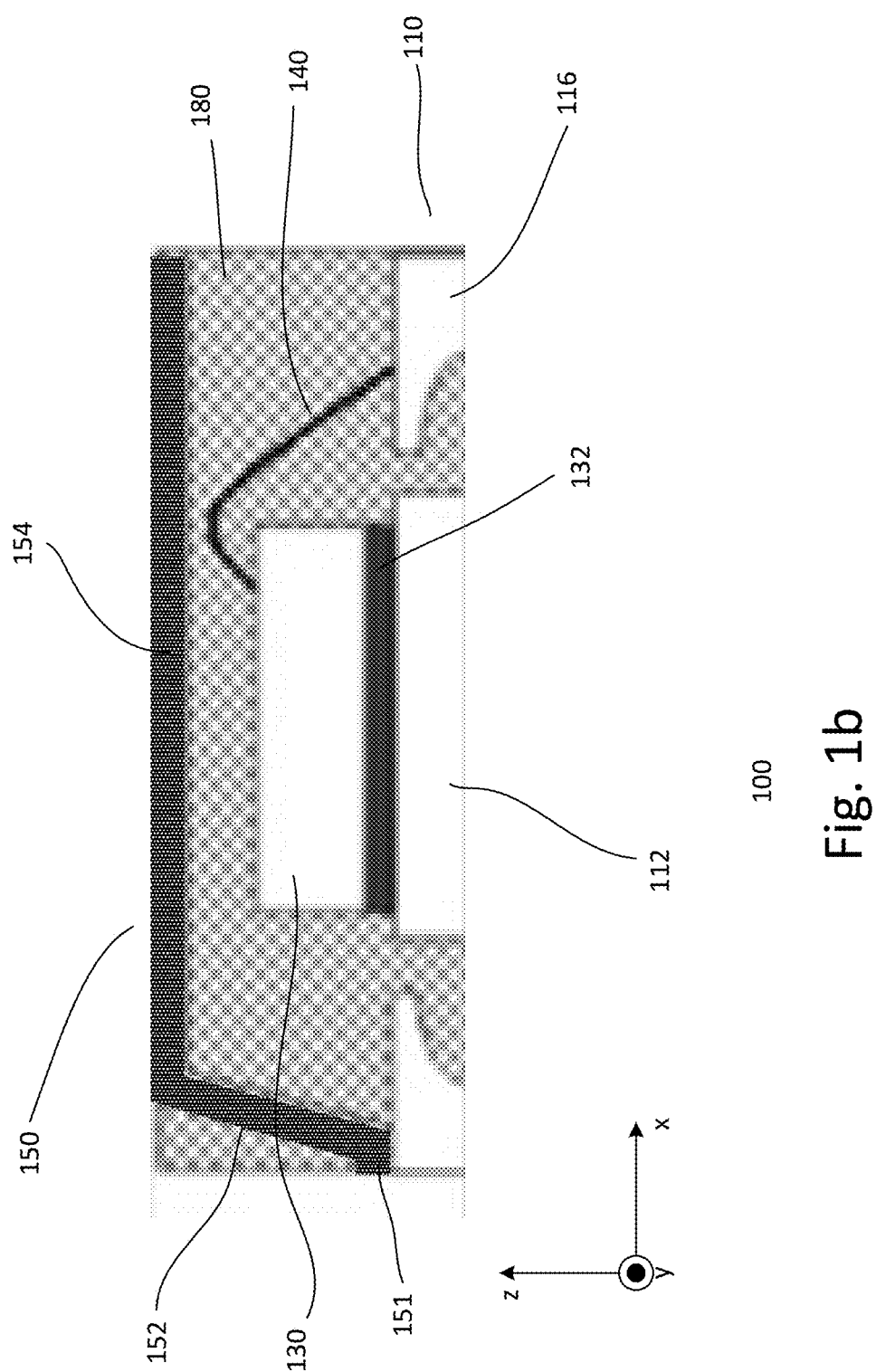

FIGS. 1a and 1b show 3-dimensional (3D) and side views of an embodiment of a semiconductor package 100. The semiconductor package 100, for example, is a package for an integrated circuit (IC). The IC, for example, is a power IC, such as a power metal oxide semiconductor field effect transistor (MOSFET). Providing a semiconductor package for other types of ICs may also be useful.

As shown, the semiconductor package includes a package substrate 110 having opposing first and second major surfaces. The first major surface may be referred to as the top or active package surface and the second major surface may be referred to as the bottom package surface. Other designations for the surfaces may also be useful.

The package substrate, in one embodiment, is a lead frame, such as a copper (Cu) or copper alloy lead frame. Other types of conductive materials, such as aluminum (Al), nickel (Ni), silver (Ag), gold (Au), alloys thereof, or a combination thereof may also be used to form the lead frame. Providing other types of package substrates, including laminate package substrates, ceramic substrates and mold-based substrates, for the semiconductor package may also be useful.

The lead frame, for example, may be a lead frame strip with a row or matrix of lead frames or package substrate units. This enables processing of multiple packages in parallel before they are subsequently singulated into individual packages.

The package substrate, as shown, is configured with a die-attach pad (DAP) 112 and package pads 116 or fingers. The package pads provide connections to the die pads of a die of the package. The number of package pads may depend on the configuration of the die and/or the package. The package pads may be disposed on opposing sides of the DAP. As shown, the package pads are disposed on opposing sides of the DAP along the y direction. Other configurations of the package pads may also be useful. It is also understood that not all package pads are active package pads for connecting the die pads of the die. A package substrate may be designed to accommodate more than one type of die, providing design flexibility. In addition, the package substrate may be configured for other types of dies, such as flip chips.

The DAP is configured to accommodate a die 130. For example, a die is attached to the active surface of the DAP. An adhesive 132 may be used to attach the die to the DAP. The adhesive may be an adhesive tape or a thermal or UV curable adhesive. Other types of adhesives may also be used. In some cases, where the DAP serves as a terminal or terminals, a conductive adhesive may be employed to connect the DAP to a die pad on the bottom surface of the die (bottom die surface attached to the DAP).

As illustrated, the die 130 includes three die pads on the top surface of the die (top die surface not attached to the DAP). For example, the die is a power MOSFET with three terminals. As for the package substrate, it is configured with six package pads, three on each opposing side of the DAP. The three die pads are coupled to the package pads 116 on one side of the die by wire bonds 140. For example, the package pads on the other opposing side of the DAP are inactive package pads (not connected to the die pads). Other configurations of the package substrate and the die, including the die pads and package pads, may also be useful. For example, the die may have more die pads, or the package substrate may have more package pads, or the package substrate may be configured to include multiple DAPs for attaching multiple dies to the package in a planar configuration (e.g., x-y plane). In some embodiments, the package may be configured to attach multiple dies in a stack configuration or a combination of a stacked (e.g., the z direction) and a planar configuration.

In other embodiments, the die may be a flip chip. For example, the package substrate is configured to accommodate a flip chip. The package substrate may include package pads to accommodate a flip chip. In the case of a flip chip, no wire bonds are needed. The die includes bumps which are coupled to package pads directly. Other configurations of the die and the package substrate may also be useful.

In one embodiment, the semiconductor package includes a shield structure 150 for protecting the die against EMI. For example, the shield structure is formed of a conductive shielding material that is capable of reflecting external electromagnetic (EM) field and/or absorbing the external EM field for grounding before it reaches the die. The shield structure may be grounded by being coupled to a package pad which is designated as a ground pad (ground package pad). In one embodiment, the EMI shield structure is formed of a copper (Cu) or Cu-alloy. Other types of EMI shielding materials, such as silver (Ag) or Ag-alloy, may also be useful. At the same time, the shield structure also reduces or minimizes release of internal EM field to the surrounding external environment or devices.

The EMI shield structure is configured to be disposed over the package substrate. For example, the shield structure is configured to cover a top of the die. In some embodiments, the shield structure is configured to cover the top of the die and at least one side of the die. For example, the shield structure is configured to cover the top and one side, two sides, three sides or four sides of the die.

The shield structure, in one embodiment, has an L-shaped or a step-shaped profile. Providing the shield structure with other profile shapes may also be useful. The shield structure, in one embodiment, is formed of a Cu or a Cu-alloy. Other types of metallic materials, such as Ag or Ag-alloy, which prevent the penetration of EM field to the die may also be useful.

In one embodiment, the shield structure includes a planar member 154 and a leg member 152. The members are disposed relative to each other to form an L-shaped or a step-shaped profile for the shield structure. It is understood that the angle of the leg and planar members need not be 90°. For example, the angle of the leg and planar members is slightly greater than 90°. In one embodiment, the leg member includes a foot member 151 at an opposing end to the planar member.

The planar member is configured to cover the die. As shown, the planar member covers the die but does not extend to the edge of the package. The leg member is configured to elevate the planar member from the package substrate so that the planar member can cover the die. The leg member is configured to elevate the planar member sufficiently so it does not contact the wire bonds. For example, the planar member should be at least about more than +/−75 microns above the wire bonds. Providing a leg member which elevates the planar member over the die by other heights or distances above the wire bonds may also be useful. The foot member is configured to attach to the package substrate. In one embodiment, the foot member is a planar member which attaches to the package substrate. Other configurations of the foot member may also be useful.

As shown, the shield structure is configured to attach to the three package pads on the opposing side of the package pads coupled to the die pads. For example, the package pads are shorted together by the shield structure. Since these package pads are not connected to the die pads, they do not interfere with the operations of the die. In some cases, these package pads which are connected to the shield structure may be connected to ground. For example, such package pads are referred to as ground package pads. In the case where there are active package pads not connected to ground, the shield structure is configured to not be connected thereto. The shield structure may be attached to the package substrate using an adhesive, such as a thermal or UV curable adhesive or adhesive tape. Other techniques for attaching the shield structure to the package substrate may also be useful.

In one embodiment, the shield structure is formed from a single conductive sheet which has to be cut and shaped. For example, an opening may be formed by stamping and then bent to the desired shape. Other techniques for forming the shield structure may also be useful.

An encapsulant 180 encapsulates the die and package substrate. The encapsulant, for example, is a mold compound, such as an epoxy molding compound. Other types of encapsulants may also be useful. In one embodiment, the encapsulant covers the die, wire bonds and at least sides of the shield structure. As shown, the sides of the encapsulant are aligned with the edges of the package substrate. In other embodiments, the encapsulant may extend slightly beyond the sides of the lead frame. A top surface of the encapsulant may be coplanar with the top of the shield structure. In some embodiments, the top surface of the encapsulant may be above the top of the shield structure. The encapsulant also fills the gaps in the package substrate, leaving the bottom of the package pads exposed. Other configurations of the encapsulant may also be useful.

In some embodiments, the package may include an EMI shield lining (not shown) provided on sides of the package substrate not covered by the encapsulant. For example, the EMI shield lining is coated on the exposed outer sidewalls of the package substrate not covered by the encapsulant. The shield lining may be formed of a conductive material such as a Cu or Cu-alloy material. Other suitable conductive materials for the shield lining or other configurations of coating the package may also be possible. The shield lining may be coated using a plating process. For example the shield lining may be formed by plating a film or a liquid-based lining before a curing process is performed thereafter. Forming the shield lining by other techniques may also be possible.

Figure 1C:
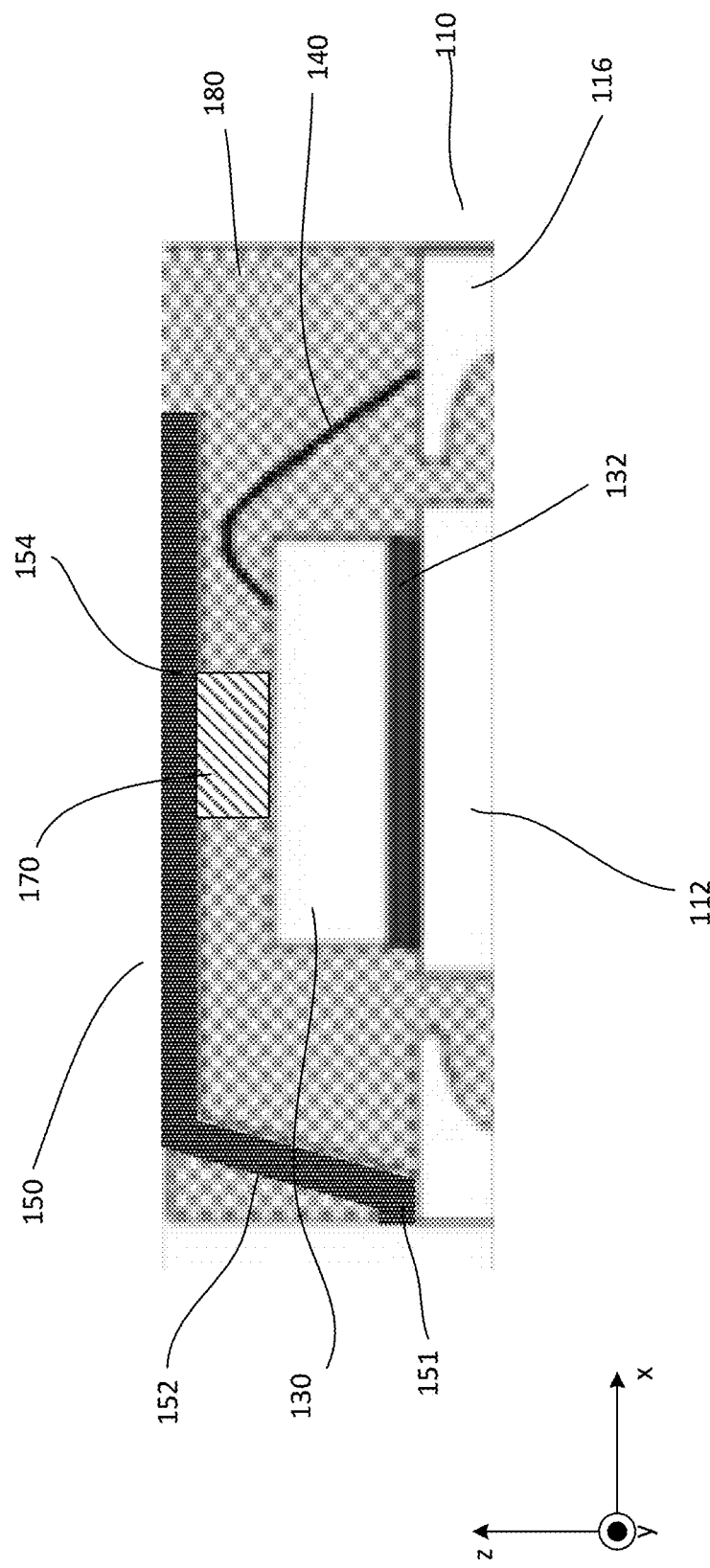
FIG. 1c shows a simplified side view of an embodiment of a semiconductor package with a shielding structure and a thermal interface material.

FIG. 1c shows a simplified side view of another embodiment of a semiconductor package 100. The package is similar to that described in FIGS. 1a to 1b. Common elements may be not be described or described in detail.

As shown, the top surface of the die is provided with a thermal interface layer (TIL) 170. The TIL contacts the top surface of the die 130 and the bottom surface of the shield structure 150. The TIL, for example, is a thermal conductive layer. The TIL may be an electrically or non-electrically conductive material. In one embodiment, the TIL may be an epoxy-based thermal conductive material, such as a copper or silver filled epoxy. Other types of thermal conductive material, such as silicon, may also be employed for the TIL. The TIL serves as a bridging contact to enhance thermal coupling between the shield structure and the die. For example, this enables the EMI shield structure to further serve as a heat dissipator or sink.

Figure 2A:
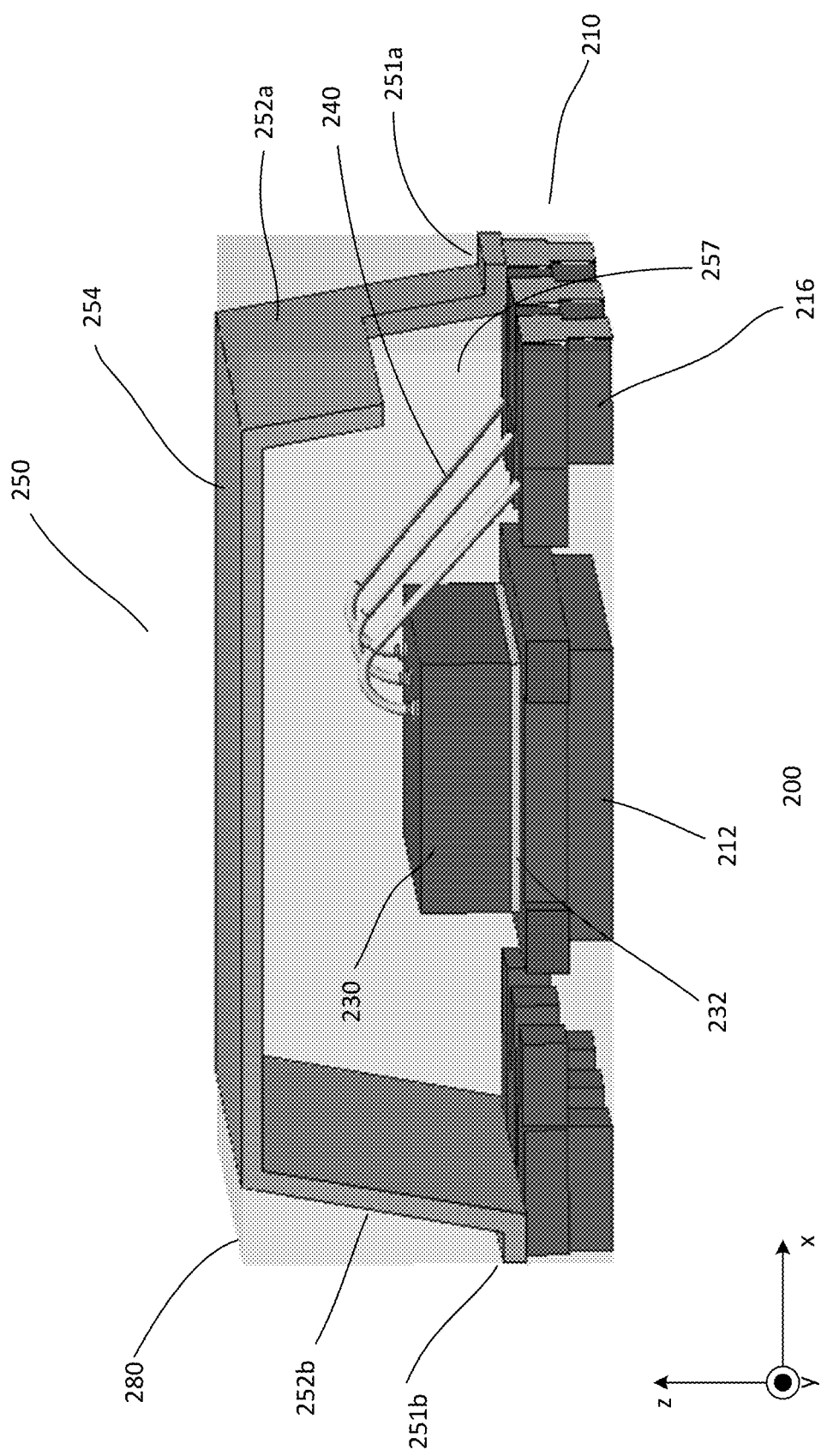
FIGS. 2a to 2b show simplified 3D and side views of another embodiment of a semiconductor package with a shielding structure.
Figure 2B:
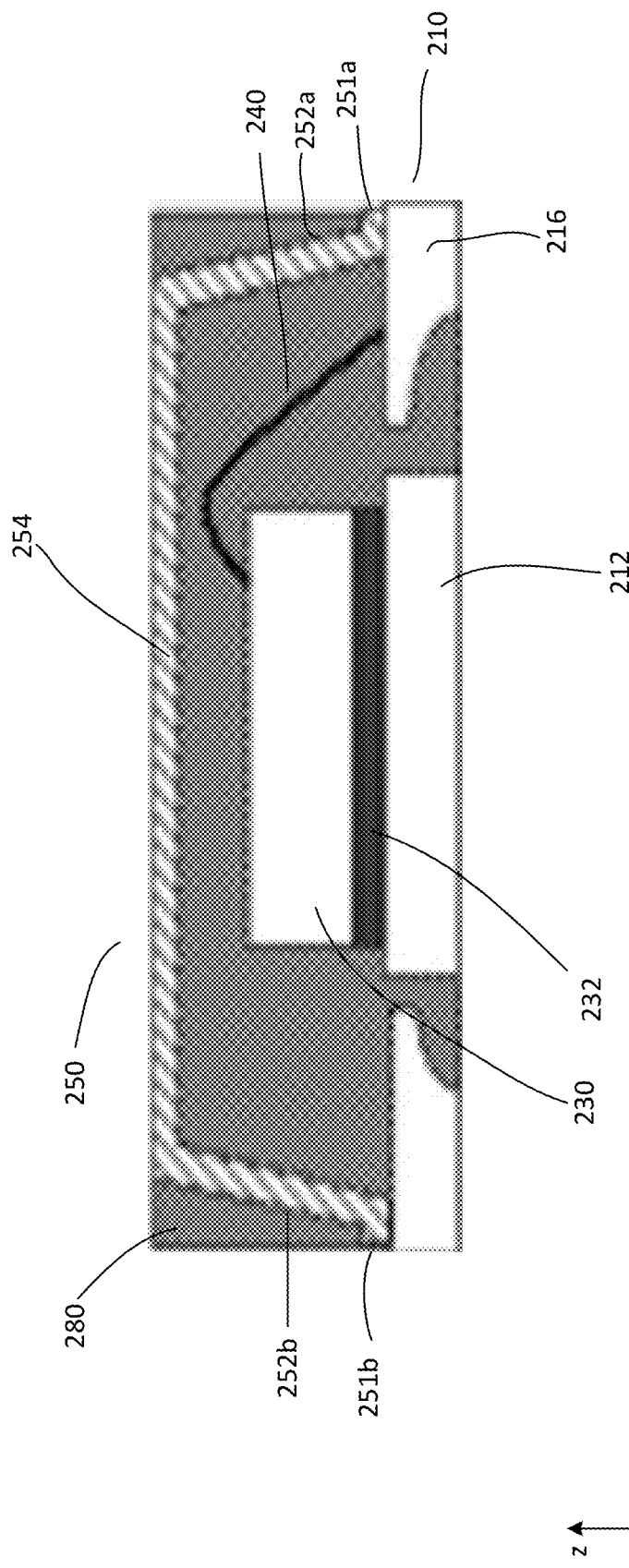

FIGS. 2a and 2b show 3-dimensional (3D) and side views of an embodiment of a semiconductor package 200. The semiconductor package 200, for example, is a package for an integrated circuit (IC), such as a power MOSFET. Providing a semiconductor package for other types of ICs may also be useful. The package is similar to that described in FIGS. 1a to 1b. Common elements may not be described or described in detail.

As shown, the semiconductor package includes a package substrate 210 with a DAP 212 and package pads 216. A die 230 is attached to the DAP by an adhesive 232. Wire bonds 240 electrically connect die pads of the die to the package pads. In other embodiments, the die may be a flip chip. Other configurations of the package substrate and die may also be useful.

An EMI shield structure 250 is attached to the package substrate. In one embodiment, the shield structure is a Cu or a Cu-alloy shield structure with a U-shaped profile. In one embodiment, the shield structure includes a planar member 254 and first and second leg members 252a-b. The members are disposed relative to each other to form a U-shaped profile for the shield structure. It is understood that the angle of the leg members and the planar member need not be 90° nor do they need to be the same. For example, the angles of the leg members and planar member may be slightly greater than 90°. In one embodiment, the leg members include foot members 251a-b at an opposing end to the planar member. The foot members are configured to connect the shield structure to the package substrate 210.

As shown, the planar member covers the top of the die while the leg members cover opposing sides of the dies. The leg members are also configured to elevate the planar member above the die so it does not contact the wire bonds 240. The foot members are configured to attach the shield structure to the package substrate. In one embodiment, the foot members are planar members which attach to the package substrate. Other configurations of the foot member may also be useful.

As shown, the second leg member 252b of the shield structure is configured to attach to the three package pads on the opposing side of the package pads coupled to the die pads. For example, the package pads are shorted together by the shield structure. These package pads, for example, are ground package pads commonly coupled to ground. As for the first leg member 252a, it is configured to couple to one of the three package pads on the other opposing side. Since one of the package pads coupled to the die pads of the die is coupled to ground, the first leg member is configured only to couple to the package pad coupled to ground. The first leg member includes a cut out section 257 to avoid contacting the other package pads. In some cases, the package pads may include package pads not coupled to any die pads. Those package pads may be connected to the first leg member. The shield structure may be attached to the package substrate using an adhesive, such as a thermal or UV curable adhesive or adhesive tape. Other techniques for attaching the shield structure to the package substrate may also be useful.

In one embodiment, the shield structure is formed from a single conductive sheet which has to be cut and shaped. For example, an opening may be formed by stamping and then bent to the desired shape. Other techniques for forming the shield structure may also be useful.

An encapsulant 280 encapsulates the die and the package substrate. The encapsulant, for example, may be a mold compound. Other types of encapsulants may also be useful. In one embodiment, the encapsulant covers the die, wire bonds and sides of the shield member. For example, the encapsulant is configured to adhere to the sides of the shield member while leaving the top of the shield member exposed. As shown, the sides of the encapsulant are aligned with the edges of the package substrate. In other embodiments, the encapsulant may extend slightly beyond the sides of the package substrate. A top surface of the encapsulant may be coplanar with the top of the shield structure. In some embodiments, the top surface of the encapsulant may be above the top of the shield structure. The encapsulant also fills the gaps in the package substrate, leaving the bottom of the package pads exposed. As shown, the package is a leadless package. Other configurations of the encapsulant, as well as other types of packages, including a package with leads, may also be useful.

Figure 2C:
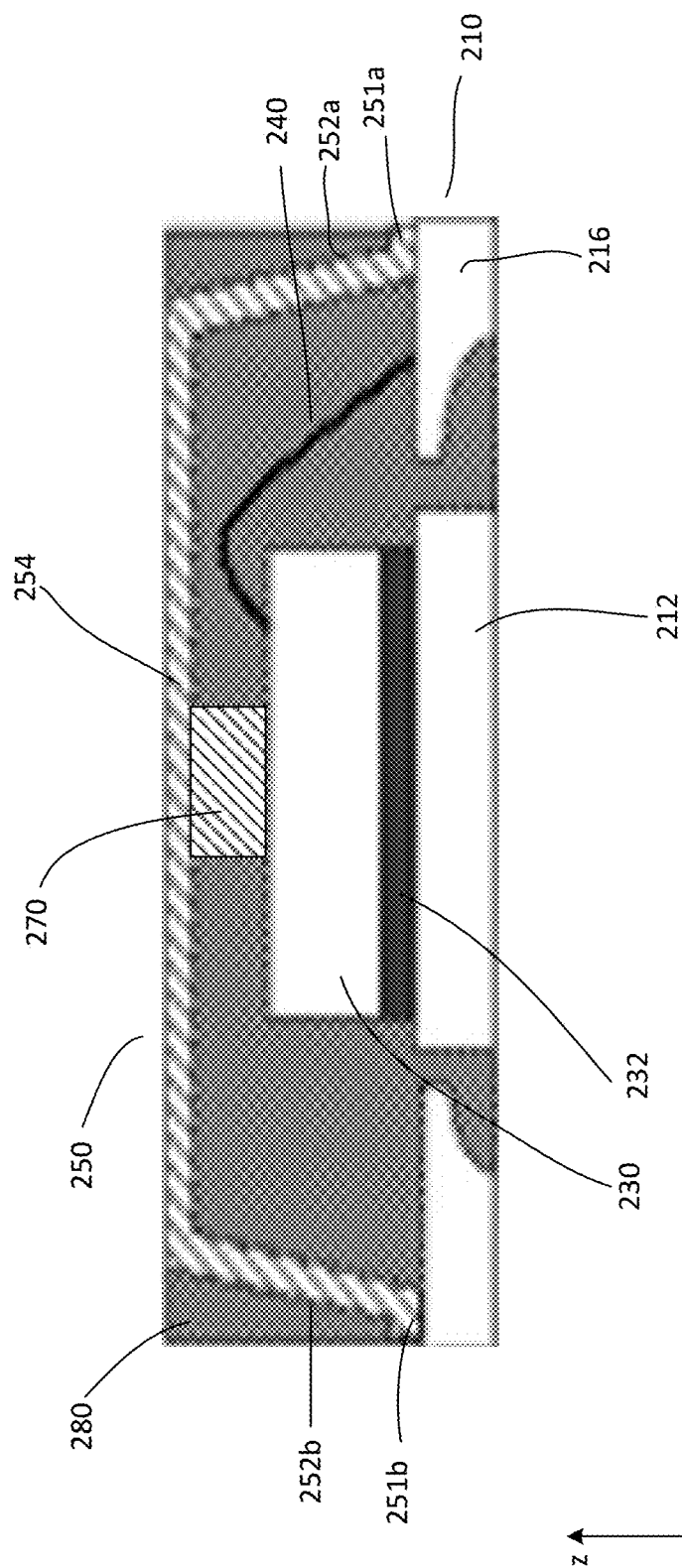
FIG. 2c shows a simplified side view of another embodiment of a semiconductor package with a shielding structure and a thermal interface material.

FIG. 2c shows a simplified side view of another embodiment of a semiconductor package 200. The package is similar to that described in FIGS. 2a to 2b and 1c. Common elements may not be described or described in detail.

As shown, the top surface of the die is provided with the thermal interface layer (TIL) 270. The TIL contacts the top surface of the die 230 and the bottom surface of the shield structure 250. The TIL, in one embodiment, is a thermally conductive adhesive material. Other types of thermally conductive materials may also be useful. The TIL serves as a bridging contact to enhance thermal coupling between the shield structure and the die, enabling the EMI shield structure to further serve as a heat sink.

Figure 3A:
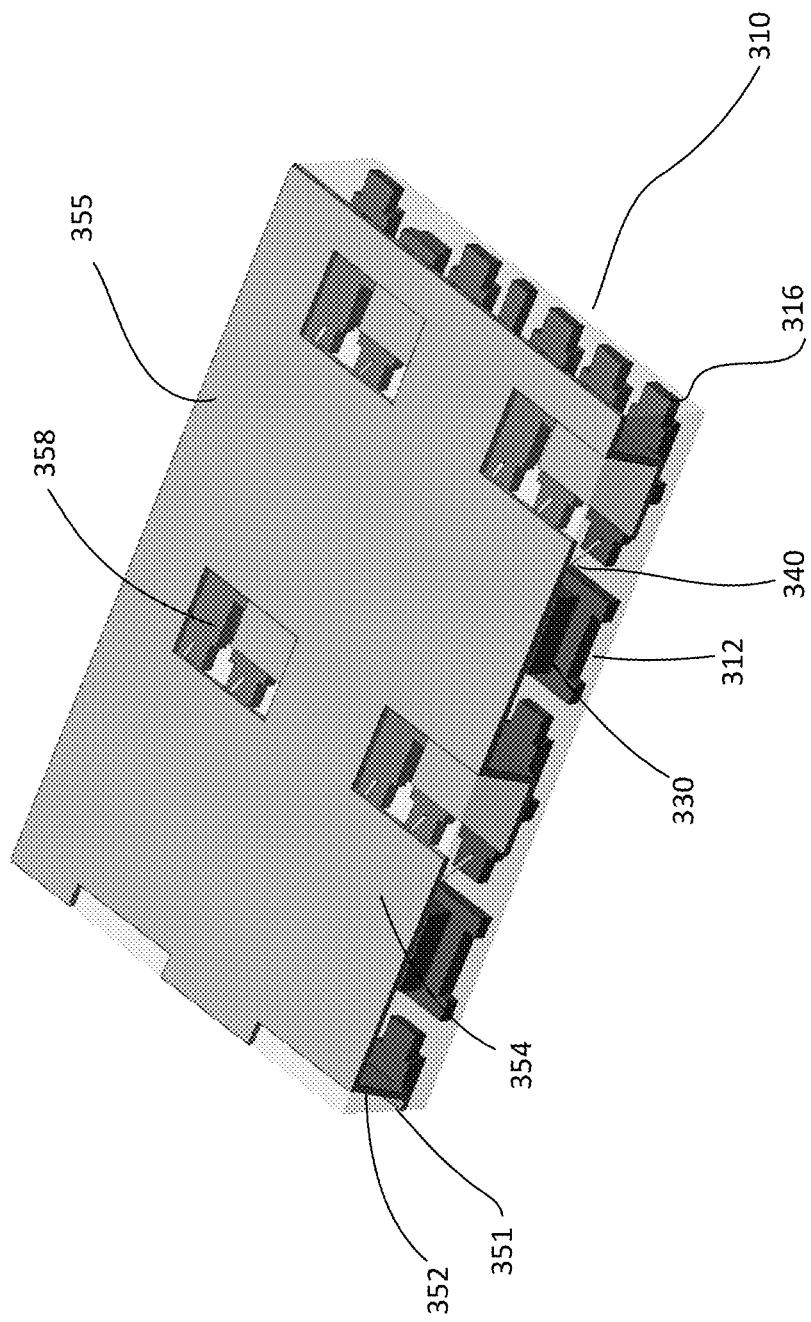
FIGS. 3a to 3c show 3D, top and side views of an embodiment of a package substrate strip with multiple packages processed in parallel prior to singulation of the shield structures.
Figure 3B:
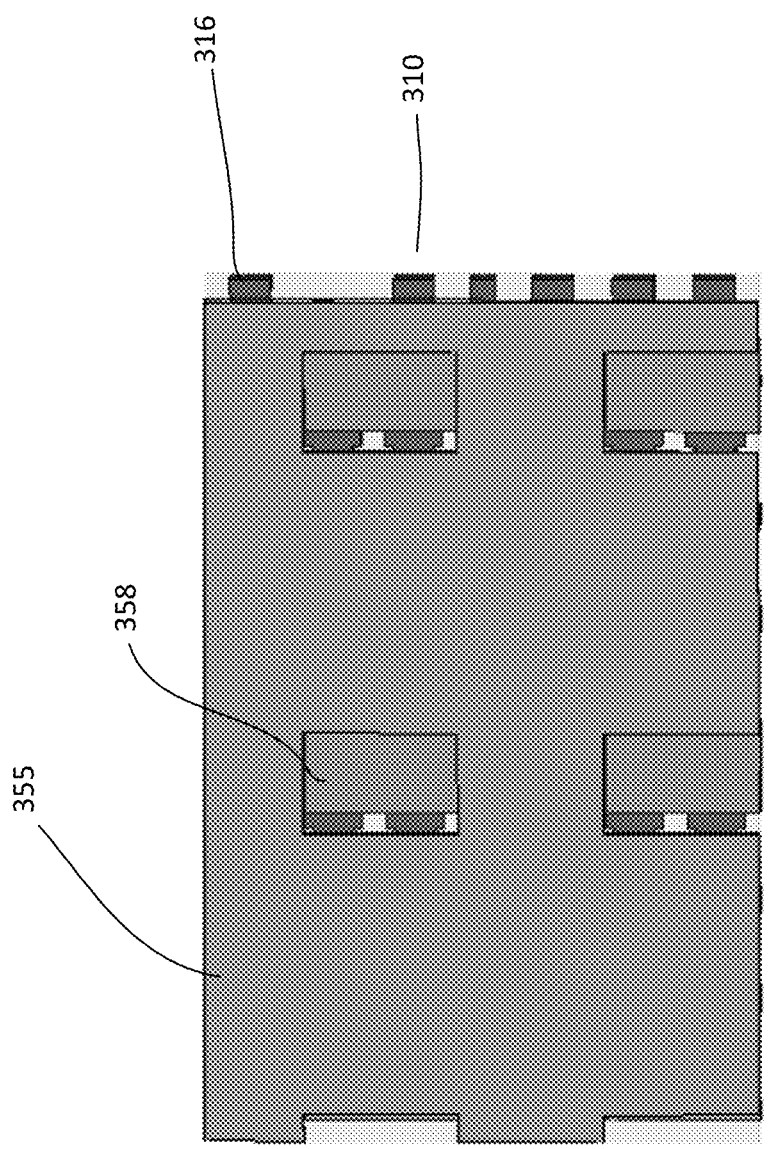
Figure 3C:
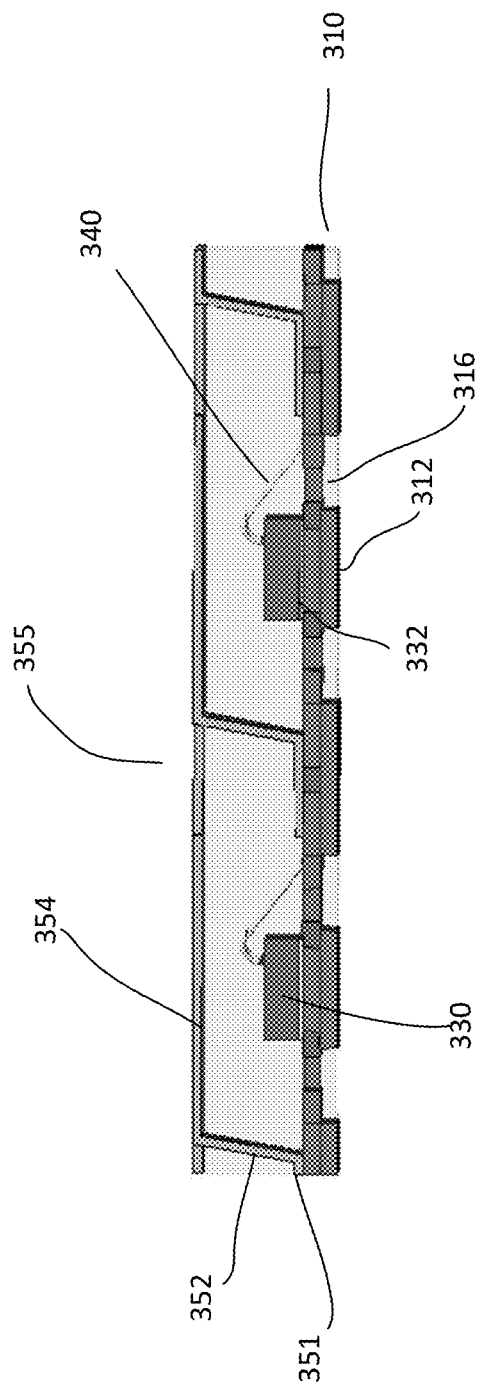

FIGS. 3a to 3c show 3D, top and side views of an embodiment of a package substrate strip with multiple packages processed in parallel prior to singulation of the shield structures. The semiconductor packages are similar to those described in FIGS. 1a to 1c. Common elements may not be described or described in detail.

As shown, a package substrate strip 310 having a plurality of package substrates is processed to form a plurality of packages. For example, dies 330 are attached to DAPs 312 of the packages by an adhesive 332 and connected to package pads 316 by wire bonds 340.

A shield sheet 355 patterned with a plurality of shield structures is attached to the package substrate strip with the dies. The shield sheet is patterned with openings 358 and shaped to form L-shaped shield structures with planar members 354 and leg members 352 with foot members 351. In other embodiments, the shield sheet may be patterned to form U-shaped shield structures. Patterning the shield sheet to form shield structures having other profiles may also be useful. The foot members are attached to the package substrate strip using an adhesive. This fixes the shield sheet to the package substrate strip.

Figure 3D:
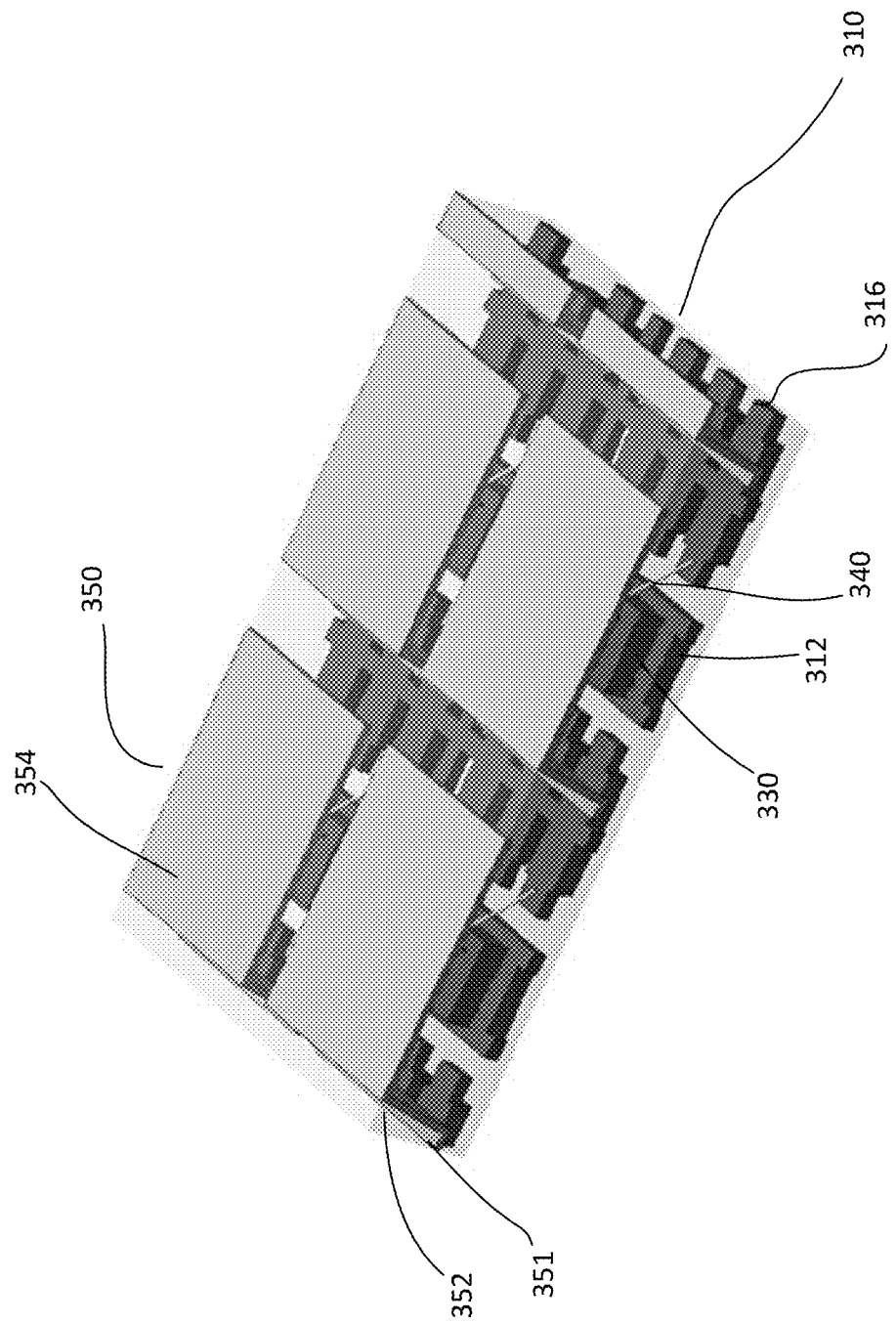
FIG. 3d shows a 3D view of an embodiment of a package substrate strip with multiple packages processed in parallel after shield structure singulation.

Referring to FIG. 3d, the shield sheet is patterned to singulate it into individual shield structures 350. The patterning process, for example, may include chemical etching. Other techniques for patterning the shield sheet such as laser cutting may also be useful.

Figure 4:
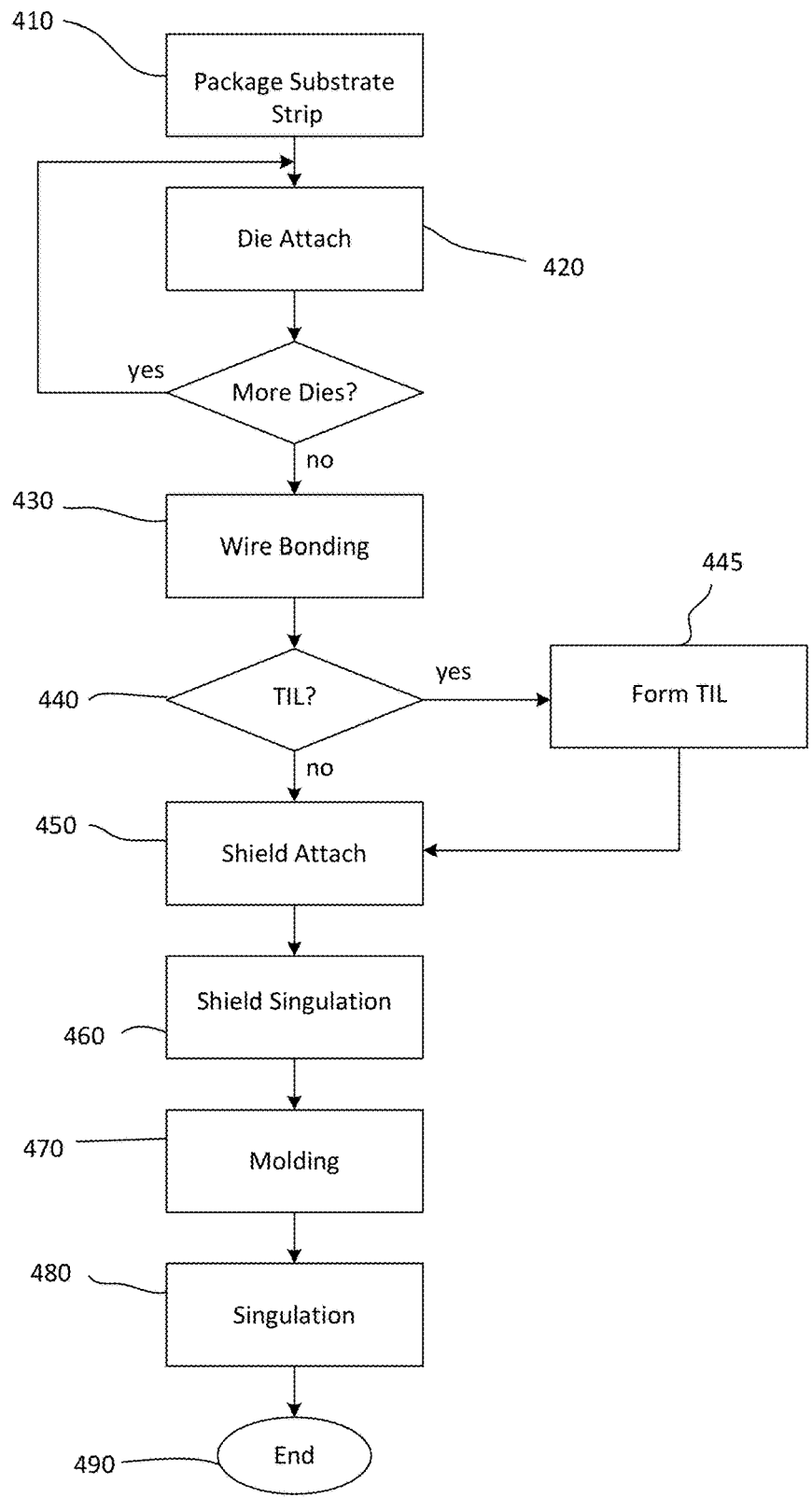
FIG. 4 shows an embodiment of a process flow for forming semiconductor packages.

FIG. 4 shows an embodiment of a process 400 for forming semiconductor packages with shield structures. At 410, a package substrate strip is provided. The package substrate strip, for example, is a lead frame strip with a plurality of lead frames. Other types of package substrate strips may also be useful. Dies are attached to the package substrate strip at 420. For example, adhesives are employed to attach dies to the DAPs of the package substrates of the package substrate strips. If there are more dies to attach, the process repeats 420 until there are no more dies to attach. For example, in the case of a multiple die stack configuration, a second die is stacked on top of a first die attached to the DAP of each package substrate. The die adhesive is employed to couple the second die to the first die. Once there are no more dies to attach, the process continues to 430.

After die attach, wire bonds are formed at 430 to connect the dies to the package substrates of the package substrate strip.

At 440, the process determines whether any thermal interface layer (TIL) is formed on the package substrate strip. If no TIL is to be formed, the process continues to 450. If the TIL is to be formed, the process continues to 445. In some embodiments, a TIL is formed on the top surface of the die attached to the DAP of each package substrate. For example, TILs are formed on package substrates with a single die configuration. In other embodiments where the package substrates include a multiple die stack configuration, a TIL is formed on the top surface of an uppermost die of a die stack.

To form the TIL, a thermal conductive layer may be deposited on the top surface of the die. The TIL may be an electrically or non-electrically conductive material. For example, the TIL, such as a silver filled epoxy, is formed by a plating process. Other techniques for forming the TIL may also be useful. Once the TIL is formed, the process continues to 450.

At 450, a shield sheet patterned with shield structures is attached to the package substrate strip. The shield sheet is singulated into individual shield structures at 460. For example, a patterning process patterns the shield sheet and removes parts to separate it into individual shield structures attached to the package substrate strip. Each shield structure is configured to cover the top of the die on its respective package substrate. In cases where the package substrate includes a TIL formed on the top of the die, the shield structure is configured to cover both the TIL and die. For example, a bottom surface of the shield structure contacts a top surface of the TIL. This enhances thermal coupling between the shield structure and the die. For example, this enables the shield structure to further serve as a heat dissipator or sink.

After shield sheet singulation, the package substrate strip is subjected to a molding process at 470. For example, an encapsulant encapsulates the packages of the package substrate strip by a transfer molding process. After molding, the package substrate strip is singulated into individual packages in 480. For example, the package strip is sawed in the x and y direction to singulate the package strip into individual packages. Other singulation processes may also be employed. The process terminates at 490. For example, the process ends after forming the singulated individual packages.

Figure 5A:
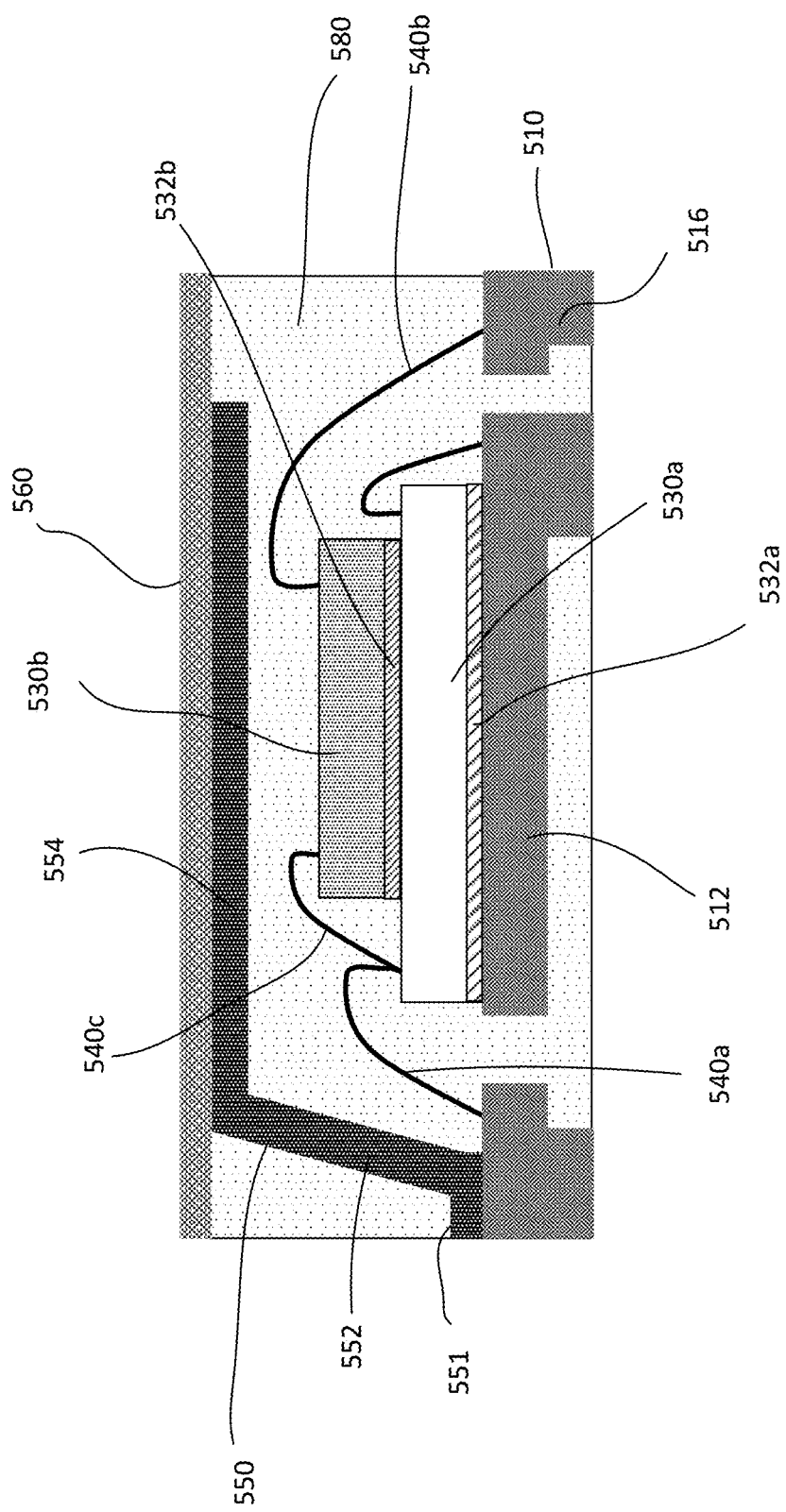
FIGS. 5a to 5d, 6a to 6b, 7a to 7b and 8a to 8b show simplified side views of various embodiments of semiconductor packages.
Figure 5B:
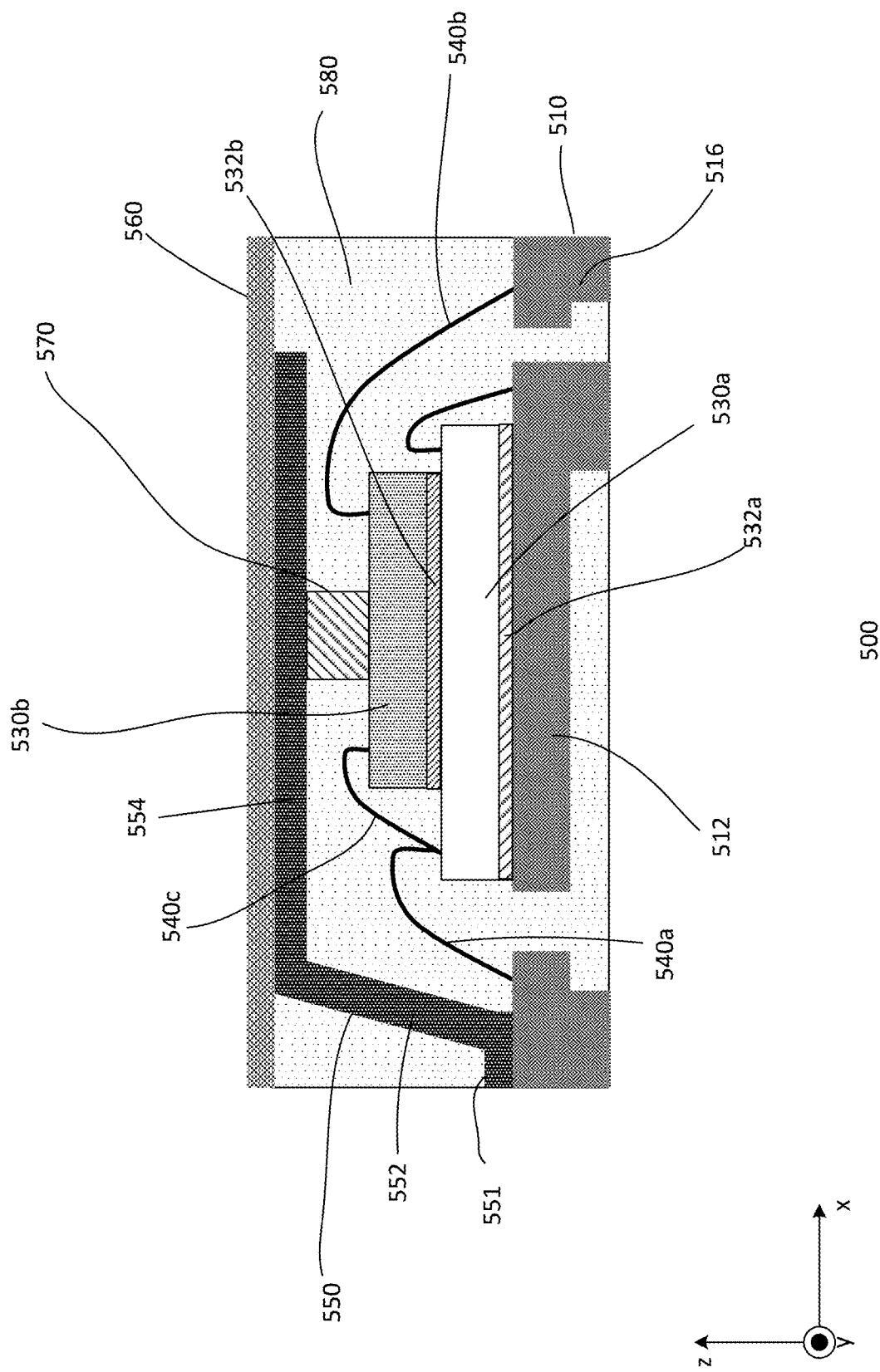

FIGS. 5a to 5b show embodiments of a semiconductor package 500. The semiconductor package may be similar to those described in FIGS. 1a to 1c and 2a to 2c. Common elements may not be described or described in detail.

As shown, the semiconductor package includes a package substrate 510. The package substrate, in one embodiment, is a lead frame, such as a copper (Cu) or copper alloy lead frame. Providing other types of package substrates, including laminate package substrates, ceramic substrates and mold-based substrates, for the semiconductor package may also be useful. The package substrate, for example, may be a package substrate strip with a row or matrix of package substrate units.

The package substrate is configured with a die-attach pad (DAP) 512 and package pads 516. The package pads provide connections to die pads of a die of the package. The number of package pads may depend on the configuration of the die and/or the package. The package pads may be disposed on opposing sides of the DAP. As shown, the package pads are disposed on opposing sides of the DAP along the y direction. In addition, package pads may be provided as part of the DAP. Other configurations of the package pads may also be useful. It is also understood that not all package pads are active package pads for connecting the die pads of the die. For example, a lead frame may be designed to accommodate more than one type of die, providing design flexibility.

The DAP, as shown, is configured to accommodate a die stack. For example, a first die 530*a* is attached to the active surface of the DAP and a second die 530*b* is disposed on a top surface of the first die (top die surface not attached to the DAP). A first die adhesive 532*a* may be used to attach the bottom surface of the first die to the DAP and a second die adhesive 532*b* may be used to attach the bottom surface of the second die to the top surface of the first die. The adhesive may be an adhesive tape, a thermal curable adhesive or a UV curable adhesive. Other types of adhesives may also be used.

As shown, a footprint of the first die is larger than the second die. This allows the die pads of the first die (first die pads) to be exposed. Other configurations of dies may also be useful. For example, the second die may have through silicon vias connected directly to the first die pads and access to the first die may be through the die pads of the second die (second die pads). Although 2 dies are shown for the die stack, it may include more than 2 dies. Other configurations, such as attaching multiple dies in a planar configuration or just a single die, may also be useful.

Wire bonds connect the dies to the package substrate. In one embodiment, first wire bonds 540*a* connect the first die to the package substrate, second wire bonds 540*b* connect the second die to the package substrate and inter-die wire bonds 540*c* interconnect the first and second dies. Other configurations for connecting the dies or chips to the package substrate as well as inter-die connections may also be useful. For example, the dies may be flip chips, or a combination of both different types of dies. For example, in the case of a stack of two chips, one may be a flip chip and the other may be a wire bonded die. In the case of a single die, the die can be a flip chip or a wire bonded die.

In one embodiment, the semiconductor package includes a first shield structure 550 for protecting the die against EMI. The first shield structure is configured to be disposed over the die. For example, the first shield structure is configured to cover a top and a side of the die. The first shield structure, in one embodiment, has an L-shaped or stepped-shaped profile, similar to the shield structure described in FIGS. 1*a* to 1*c*. For example, the shield structure includes a planar member 554 and a leg member 552 configured to form a L-shaped profile. The leg member may include a foot member 551 for attaching to the package substrate. The planar member is configured to cover the die. As shown, the planar member covers the die but does not extend to the edge of the package.

In one embodiment, a second shield structure 560 is disposed over the first shield structure. The second shield structure, in one embodiment, is an EMI shield film. The shield film may be a conductive film such as a silver filled film. Other conductive materials such as an epoxy-based conductive material like silver filled epoxy may also be employed. Other types of shield films may also be useful. The shield film may be, for example, a pre-formed EMI shield film that is attached to the top surface of the encapsulant by a conductive adhesive. Other techniques for providing or attaching the second shield structure on the top surface of the encapsulant may also be useful. For example, the shield film may be formed using a conductive film which is deposited by a printing process. A curing process is performed thereafter to form the EMI shield film. The second shield structure is configured to have the same footprint as the package. For example, the second shield structure completely covers the top surface of the first shield structure. Other configurations of the second shield structure may also be useful.

An encapsulant 580 encapsulates the dies and the package substrate. The encapsulant, for example, is a mold compound, such as an epoxy molding compound. Other types of encapsulants may also be useful. In one embodiment, the encapsulant covers the die, wire bonds, and at least sides of the shield structures. As shown, the sides of the encapsulant are aligned with the edges of the package substrate. In other embodiments, the encapsulant may extend slightly beyond the sides of the package substrate. A top surface of the encapsulant may be coplanar with the top of the shield film. Other configurations of the encapsulant may also be useful. The configuration, for example, may depend on the type of the package substrate.

The semiconductor package may be provided with a thermal interface layer (TIL) 570, as shown in FIG. 5*b*. The TIL contacts the top surface of the second die 530*b* and the bottom surface of the first shield structure 550. The TIL is a thermal conductive layer, such as an epoxy-based thermal conductive material. For example, the TIL may be a copper or silver filled epoxy. Other types of thermal conductive material may also be useful.

As described, the shield structure may include multiple shield structures, such as the first and second shield structures. Providing other numbers of shield structures, including one, is also useful. Further, as described, the semiconductor package is configured with a die stack having first and second dies. Other configurations, such as a single die, a die stack with other numbers of dies as well multiple die stacks or a combination thereof, may also be useful.

Figure 5C:
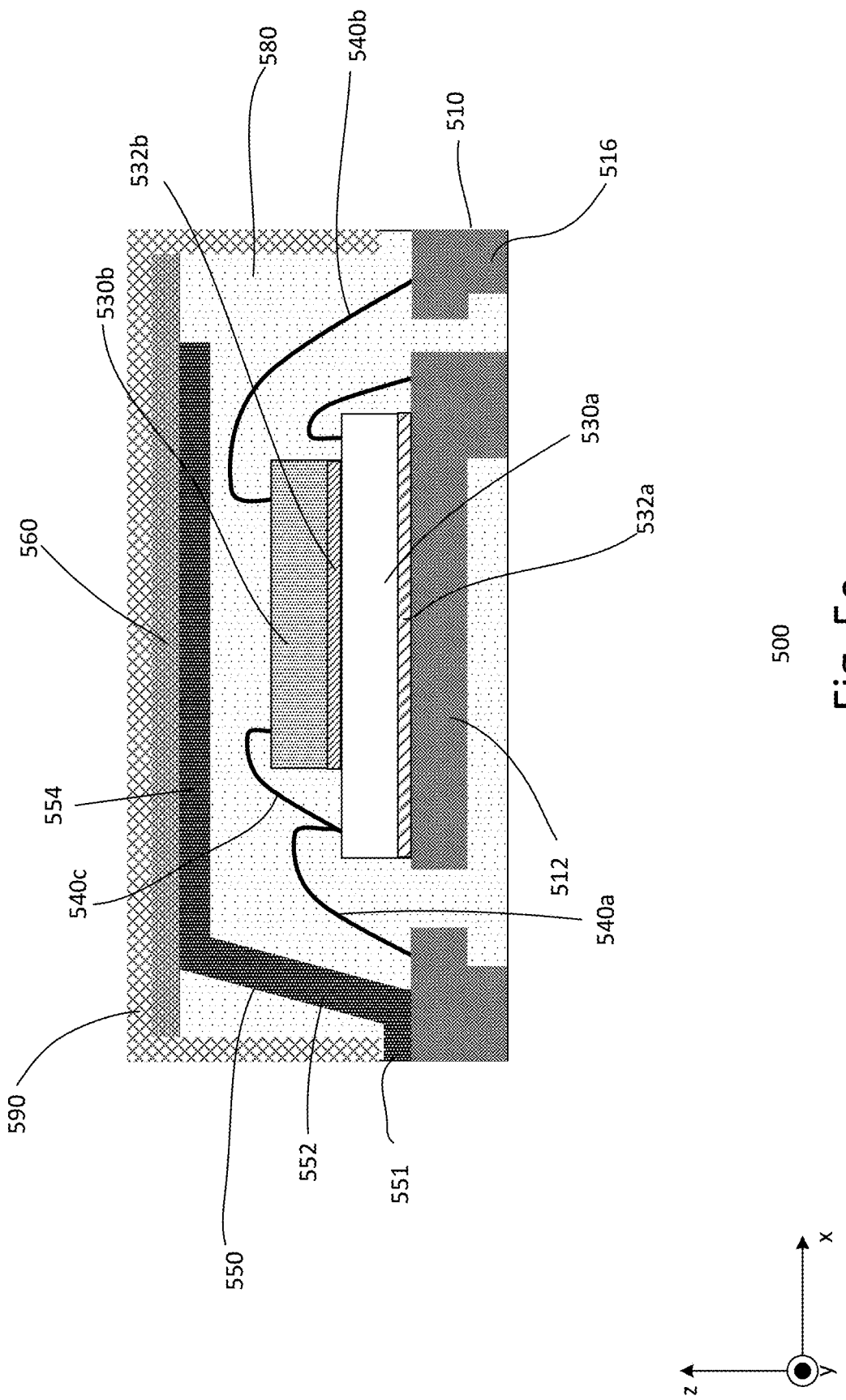
Figure 5D:
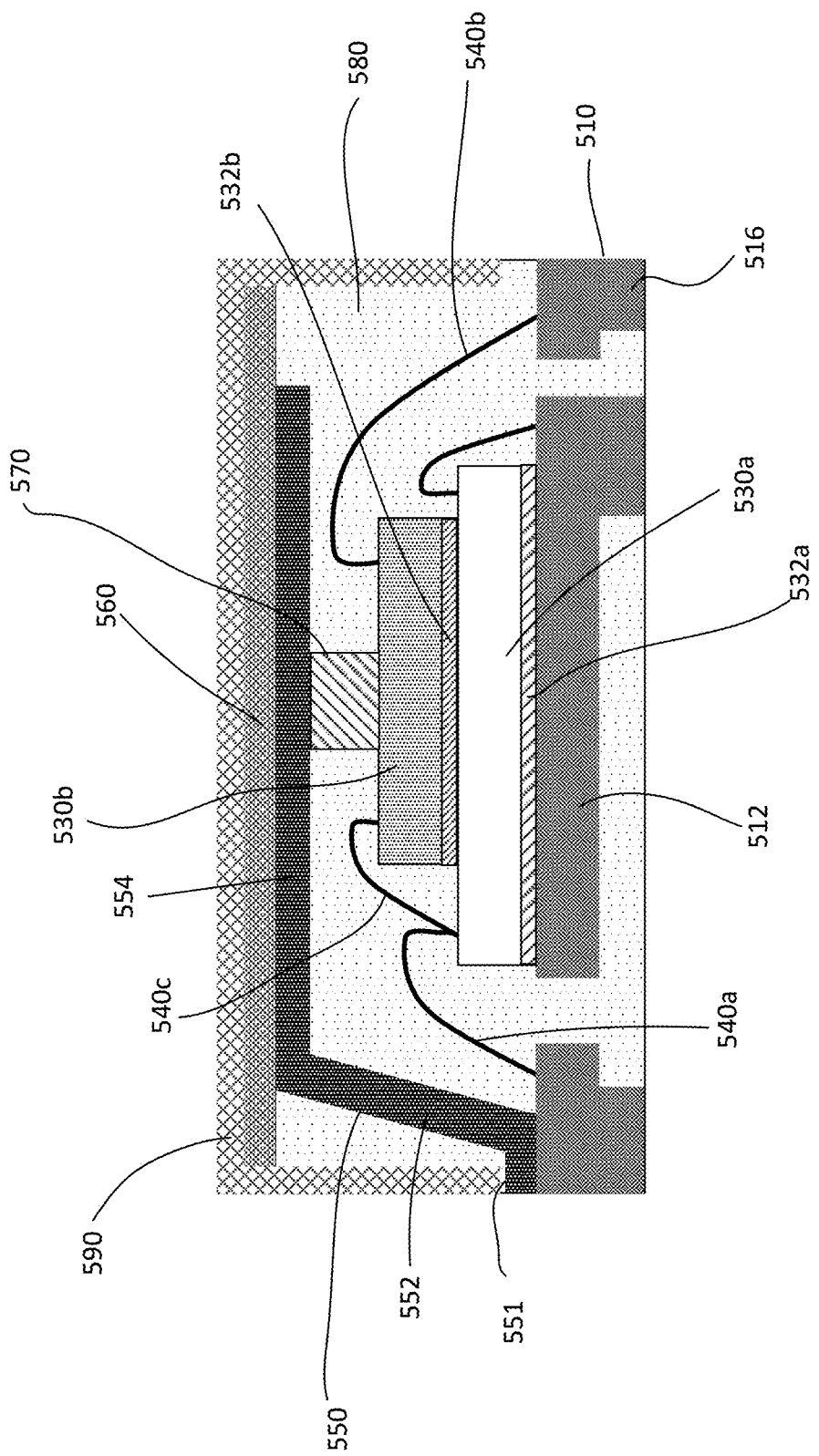

FIGS. 5*c* to 5*d* show other embodiments of a semiconductor package 500. The semiconductor package is similar to those described in FIGS. 5*a* to 5*b*. Common elements may not be described or described in detail.

As shown, the semiconductor package includes a die stack with first and second dies 530*a-b* attached to a DAP 512 of a package substrate 510 by first and second die adhesives 532*a-b* and connected by wire bonds 540*a-c* to the package pads 516. A first shield structure 550 is coupled to the package substrate and covers the die stack. As shown, the first shield structure has an L-shaped or stepped-shaped profile, as described in FIGS. 1*a* to 1*c*. A second shield structure 560 is attached to the top of the first shield structure. The second shield structure, for example, is a shield film such as a curable conductive film.

An encapsulant encapsulates the die stack and package substrate. In one embodiment, the encapsulant covers the die, wire bonds, and at least sides of the shield structures. As shown, a top surface of the encapsulant may be coplanar with the top of the shield film while sidewalls of the encapsulant are aligned with the edges of the package substrate. In one embodiment, the encapsulant includes lower sidewall portions which are aligned with the edges of the package substrate and upper sidewall portions which are recessed slightly from the lower sidewall portions. For example, the upper sidewall portions are recessed above the lower sidewall portions to avoid shorting. Other configurations of the encapsulant may also be useful.

In one embodiment, a third shield structure 590 is formed on the package. The third shield structure, for example, serves as an external shield structure for shielding external EMI. The external shield structure, for example, may be a Cu or Cu-alloy shield. Other conductive materials may also be used to form the external shield structure. Other types of external shield structures may also be useful. The external shield structure, for example, is formed by plating and surrounds the package. For example, the external shield structure is plated onto the package after singulation, and covers the top surface of the second shield structure as well as upper sidewall portions of the encapsulant. In some embodiments, the external shield structure covers the top surface of the second shield structure as well as sides of the upper sidewall portions of the encapsulant. For example, the external shield structure is configured to cover the top surface of the second shield structure and two sides or four sides of the upper sidewall portions of the encapsulant. Other techniques for forming the external shield structure, such as sputtering, screen printing or spray coating may also be useful.

In one embodiment, the package may also be provided with a thermal interface layer (TIL) 570, as shown in FIG. 5*d*. For example, the TIL contacts the top surface of the second die 530*b* and the bottom surface of the first shield structure 550 to enhance thermal coupling between the shield structures and the dies.

Figure 6A:
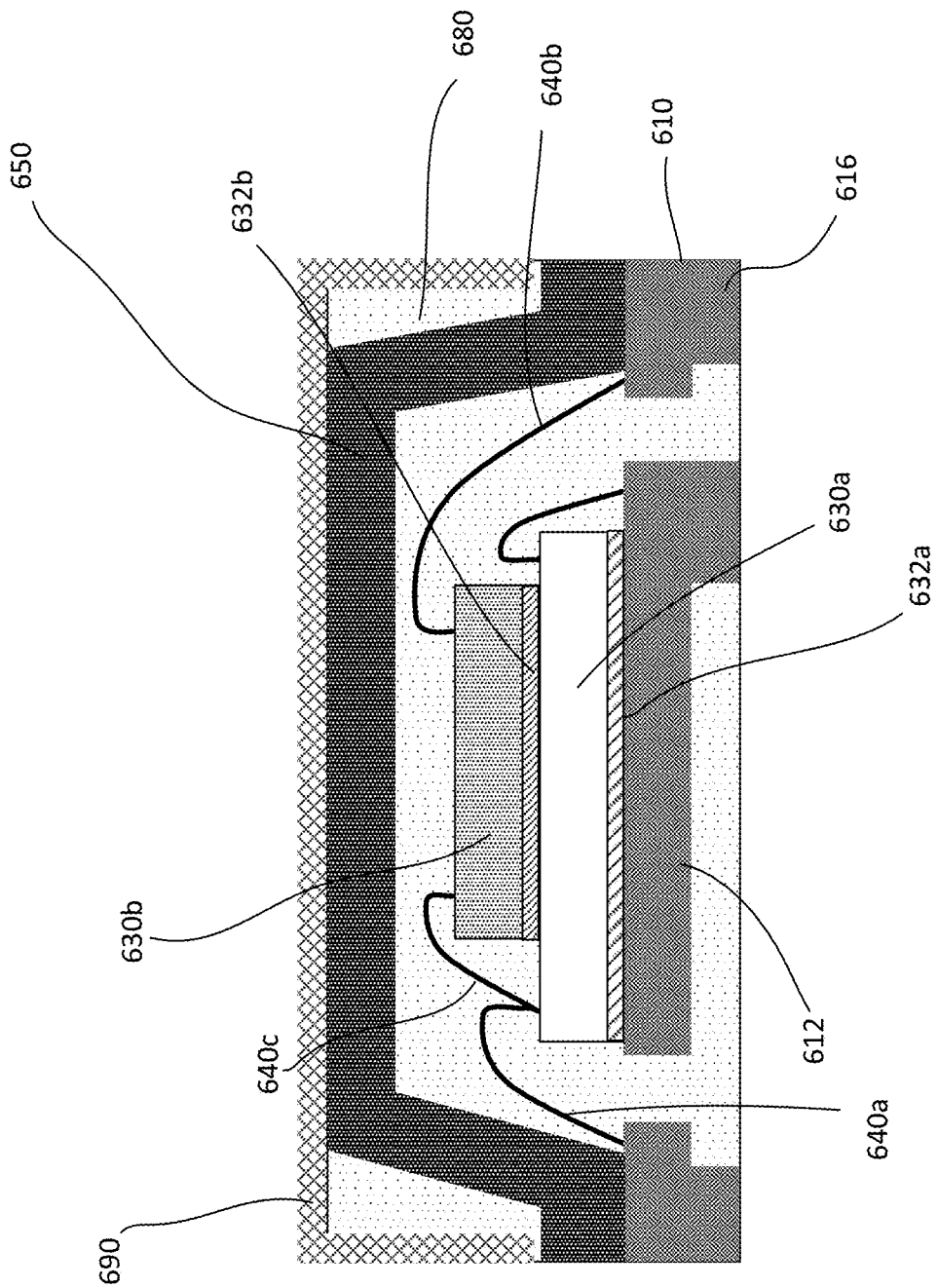
Figure 6B:
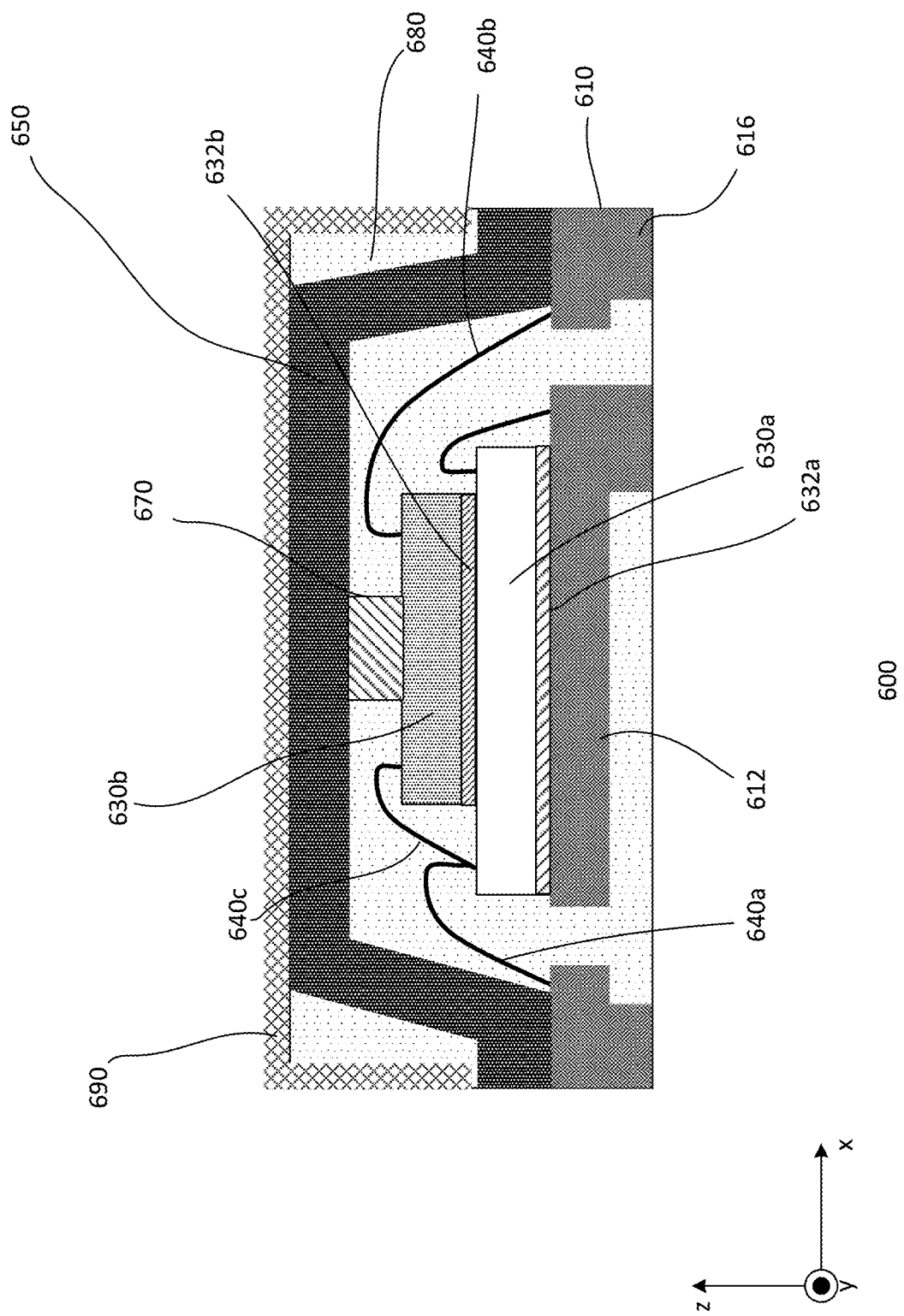

FIGS. 6*a* to 6*b* show embodiments of a semiconductor package 600. The semiconductor package may be similar to those described in FIGS. 1*a* to 1*c*, 2*a* to 2*c* and 5*a* to 5*d*. Common elements may not be described or described in detail.

As shown, the semiconductor package includes a die stack with first and second dies 630*a-b* attached to a DAP 612 of a package substrate 610 by first and second die adhesives 632*a-b* and connected by wire bonds 640*a-c* to the package pads 616. Other die configurations and other configurations of connecting the dies to the package substrate may also be useful.

A first shield structure 650 is coupled to the package substrate and covers the die stack. As shown, the first shield structure has a U-shaped profile, as described in FIGS. 2*a* to 2*c*. For example, the first shield structure includes a planar member with first and second leg members. An encapsulant 680 encapsulates the die stack and the package substrate. As shown, a top surface of the encapsulant may be coplanar with the top of the first shield structure while sidewalls of the encapsulant are aligned with the edges of the package substrate. In one embodiment, the encapsulant includes lower sidewall portions which are aligned with the edges of the package substrate and upper sidewall portions which are recessed slightly from the lower sidewall portions.

In one embodiment, a second shield structure 690 is formed on the package. The second shield structure, for example, serves as an external shield structure for shielding external EMI. The external shield structure, for example, may be a Cu or Cu-alloy shield. Other types of external shield structures may also be useful. The external shield structure, for example, is formed by plating and surrounds the package. For example, the external shield structure is plated onto the package after singulation, and covers the top surface of the first shield structure and upper sidewall portions of the encapsulant. In some embodiments, the external shield structure covers the top surface of the first shield structure and sides of the upper sidewall portions of the encapsulant. Other techniques for forming the external shield structure may also be useful.

In one embodiment, the package may include a TIL 670, as shown in FIG. 6*b*. For example, the TIL contacts the top surface of the second die 630*b* and the bottom surface of the first shield structure 650 to enhance thermal coupling between the shield structures and the dies.

Figure 7A:
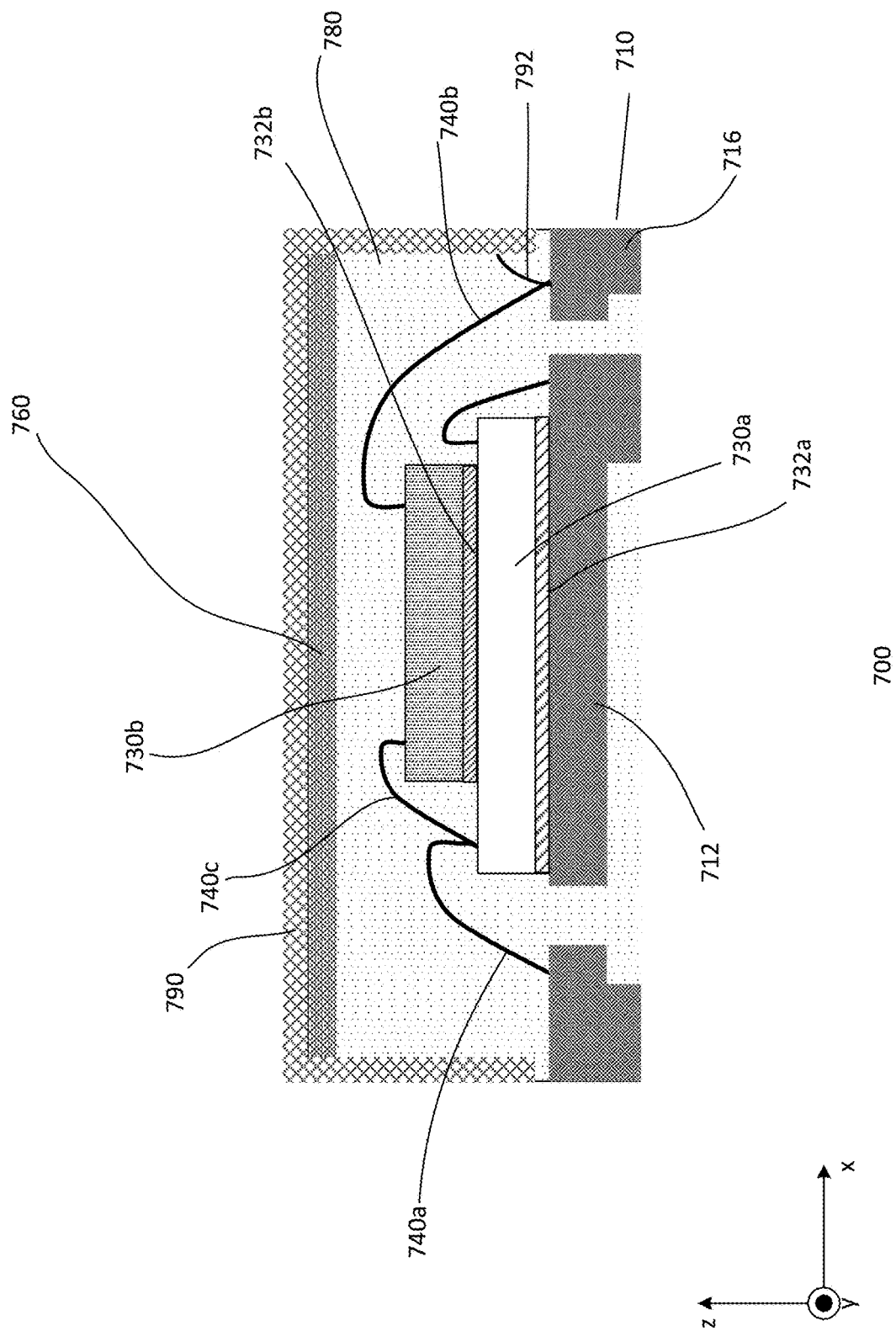
Figure 7B:
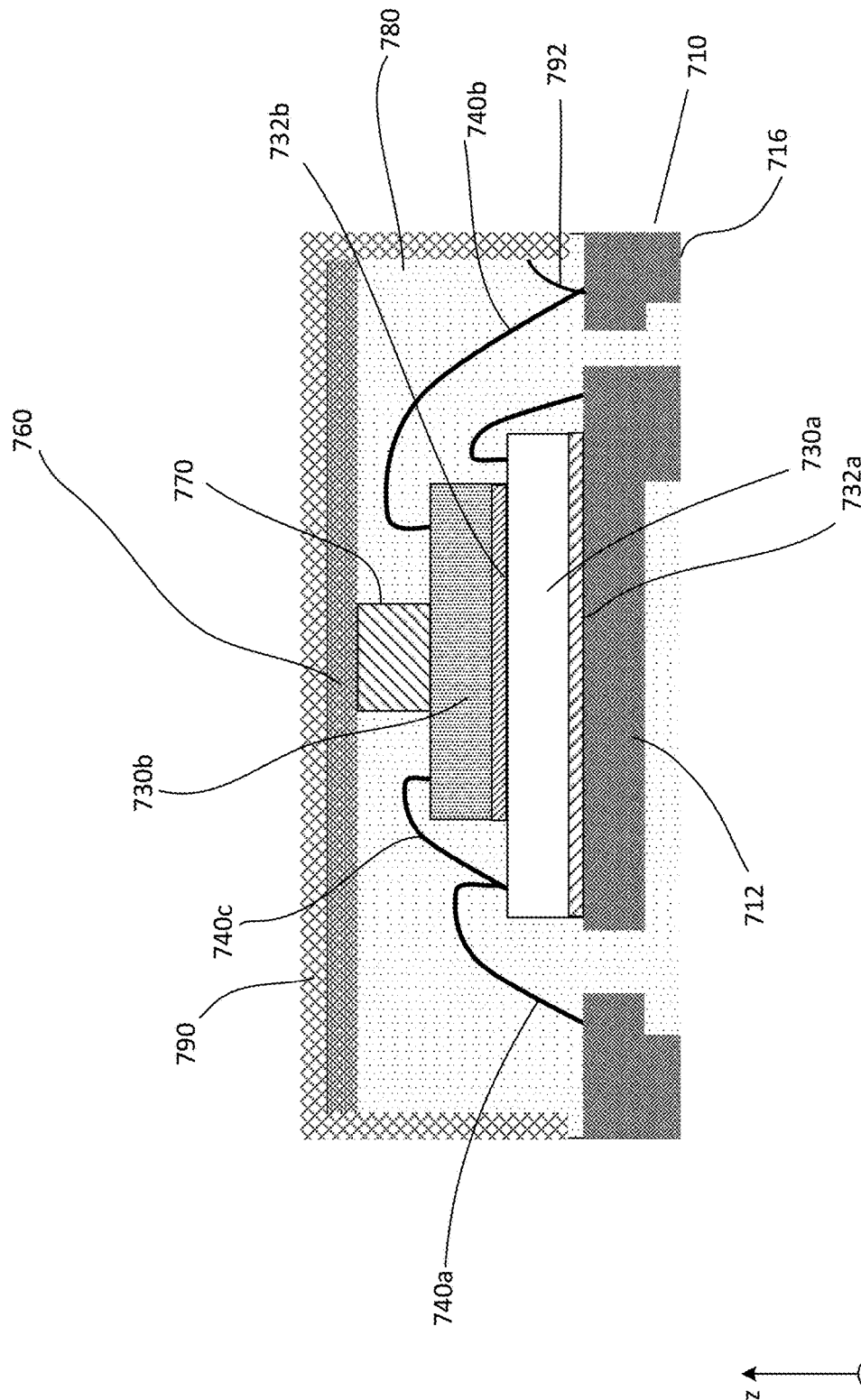

FIGS. 7*a* to 7*b* show embodiments of a semiconductor package 700. The semiconductor package may be similar to those described in FIGS. 1*a* to 1*c*, 2*a* to 2*c*, 5*a* to 5*d* and 6*a* to 6*b*. Common elements may not be described or described in detail.

As shown, the semiconductor package includes a die stack with first and second dies 730*a-b* attached to a DAP 712 of a package substrate 710 by first and second die adhesives 732*a-b* and connected by wire bonds 740*a-c* to the package pads 716. Other die configurations and other configurations of connecting the dies to the package substrate may also be useful.

An encapsulant 780 encapsulates the die stack and the package substrate. As shown, the side walls of the encapsulant are aligned with the edges of the package substrate and a top surface of the encapsulant is disposed above the dies and the wire bonds. In one embodiment, the encapsulant includes lower sidewall portions which are aligned with the edges of the package substrate and upper sidewall portions which are recessed slightly from the lower sidewall portions. Other configurations of the encapsulant may also be useful.

A first shield structure 760 is disposed on the package substrate and covers the die stack. As shown, the first shield structure is an EMI shield film such as that described in FIGS. 5*a* to 5*d*. However, unlike FIGS. 5*a* to 5*d*, the shield structure is attached to the top surface of the encapsulant. For example, the shield structure is a curable conductive film, such as a silver filled epoxy, deposited on the top surface of the encapsulant by a printing process. Other types of films may also be useful. Other techniques for providing or attaching the first shield structure on the top surface of the encapsulant may also be useful. The first shield structure is configured to have the same footprint as the package. For example, the first shield structure completely covers the top surface of the encapsulant. Other configurations of the first shield structure may also be useful.

In one embodiment, a second shield structure 790 is formed on the package. The second shield structure, for example, serves as an external shield structure for shielding external EMI. The external shield structure, for example, may be a Cu or Cu-alloy shield. Other types of external shield structures may also be useful. The external shield structure, for example, is formed by plating and surrounds the package. For example, the external shield structure is plated onto the package after singulation, and covers the top and side surfaces of the first shield structure as well as upper sidewall portions of the encapsulant. In some embodiments, the external shield structure covers the top and side surfaces of the first shield structure as well as sides of the upper sidewall portions of the encapsulant. Other techniques for forming the external shield structure may also be useful.

In one embodiment, the external shield structure is coupled to the package substrate by a wire bond 792. The wire bond, for example, may be referred to as the shield wire bond. As shown, the shield wire bond connects the external shield structure to a package pad on the package substrate. In one embodiment, the shield wire bond is connected to a ground package pad on the package substrate to ground the external shield structure. Since the external shield structure is connected to the shield wire bond, it is also connected to ground. Likewise, the shield film which is coupled to the external shield structure is also connected to ground. In one embodiment, the package pad to which the shield wire bond is connected is not connected to any wire bonds connected to a die of the package.

In one embodiment, the package may include a TIL 770, as shown in FIG. 7*b*. For example, the TIL contacts the top surface of the second die 730*b* and the bottom surface of the shield film 760 to enhance thermal coupling between the shield structures and the dies.

Figure 8A:
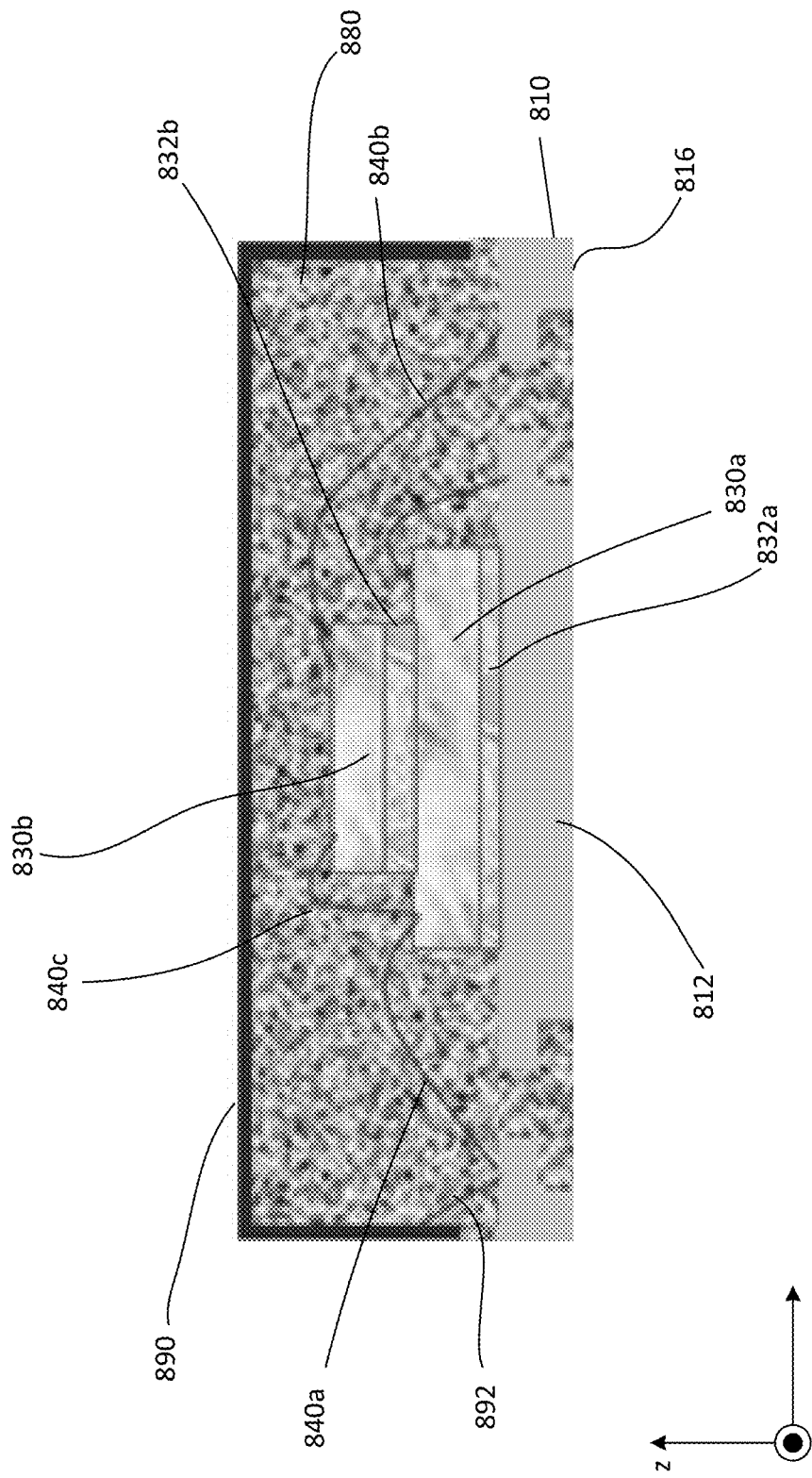
Figure 8B:
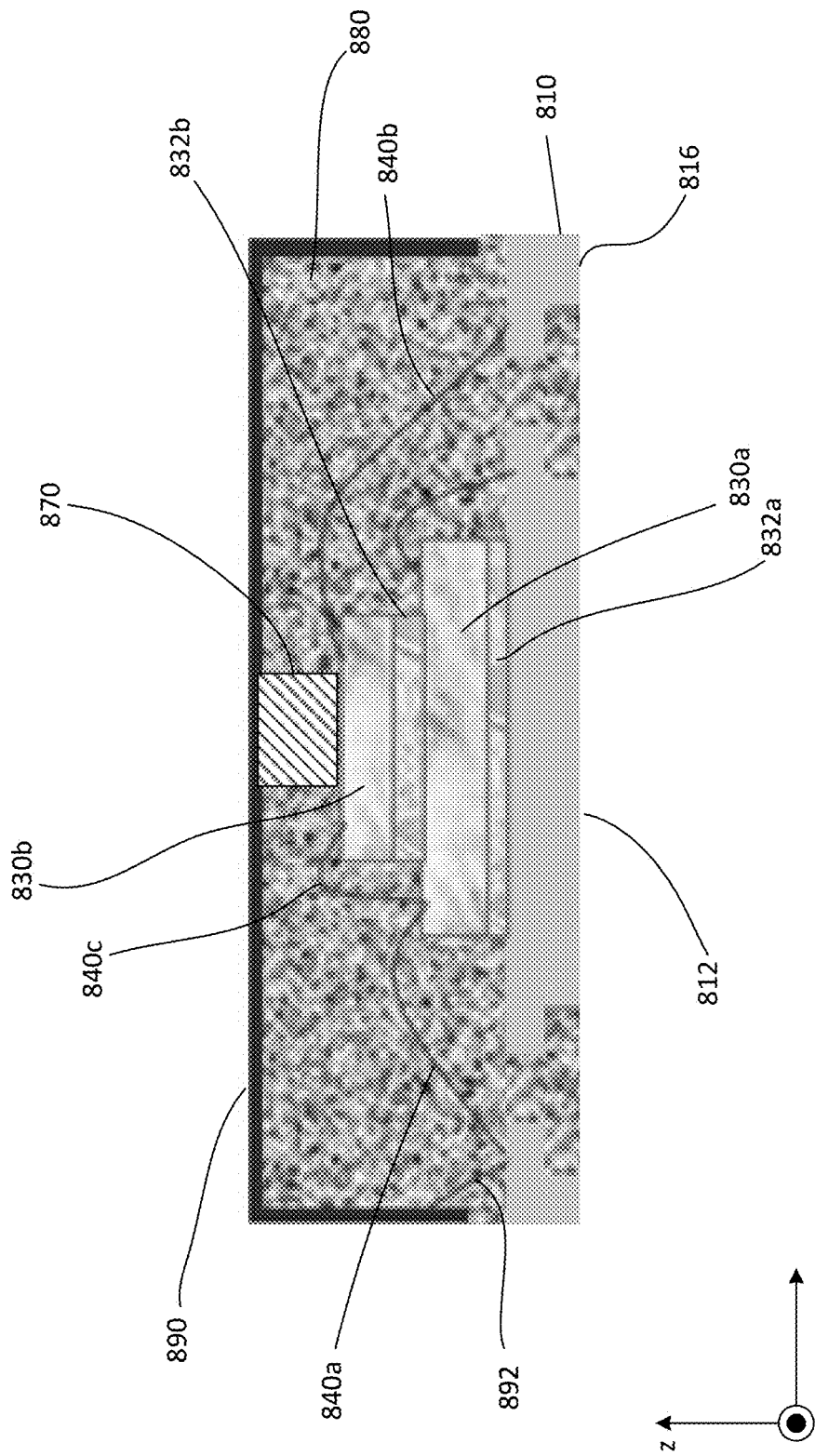

FIGS. 8*a* to 8*b* show other embodiments of a semiconductor package 800. The semiconductor package may be similar to those described in FIGS. 1*a* to 1*c*, 2*a* to 2*c*, 5*a* to 5*d*, 6*a* to 6*b* and FIGS. 7*a* to 7*b*. Common elements may not be described or described in detail.

As shown, the semiconductor package includes a die stack with first and second dies 830*a-b* attached to a DAP 812 of a package substrate 810 by first and second die adhesives 832*a-b* and connected by wire bonds 840*a-c* to the package pads 816. Other die configurations and other configurations of connecting the dies to the package substrate may also be useful.

An encapsulant 880 encapsulates the die stack and package substrate. As shown, the side walls of the encapsulant are aligned with the edges of the package substrate and a top surface of the encapsulant is disposed above the dies and the wire bonds. In one embodiment, the encapsulant includes lower sidewall portions which are aligned with the edges of the package substrate and upper sidewall portions which are recessed slightly from the lower sidewall portions. Other configurations of the encapsulant may also be useful.

In one embodiment, an external shield structure 890 is formed on the package. The external shield structure, for example, serves as an EMI shield. The external shield structure, for example, may be a Cu or Cu-alloy shield. Other types of EMI shields may also be useful. The external shield structure, for example, is formed by plating and surrounds the package. For example, the external shield structure is plated onto the package after singulation, and covers the top surface and upper sidewall portions of the encapsulant. In some embodiments, the external shield structure covers the top surface and sides of the upper sidewall portions of the encapsulant. Other techniques for forming the external shield structure may also be useful.

In one embodiment, the external shield structure is coupled to the package substrate by a wire bond 892. The wire bond, for example, may be referred to as the shield wire bond. As shown, the shield wire bond connects the shield structure to a package pad on the package substrate. In one embodiment, the shield wire bond is connected to a ground package pad on the package substrate to ground the external shield. Since the external shield structure is connected to the shield wire bond, it is also connected to ground. In one embodiment, the package pad to which the shield wire bond is connected is not connected to any wire bonds connected to a die of the package.

In one embodiment, the package may be provided with a TIL 870, as shown in FIG. 8*b*. For example, the TIL contacts the top surface of the second die 830*b* and the bottom surface of the external shield structure 890 to enhance thermal coupling between the shield structure and the dies.

Figure 9A:
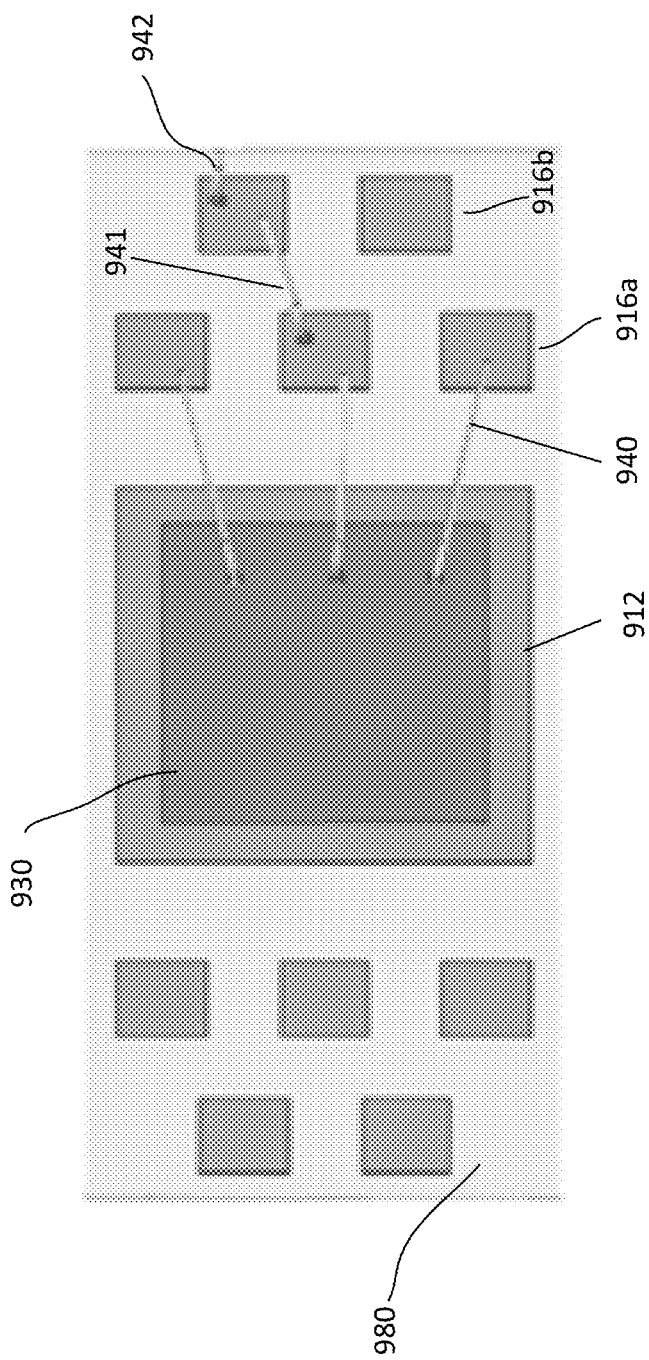
FIGS. 9a to 9b show simplified top and side views of another embodiment of a semiconductor package.
Figure 9B:
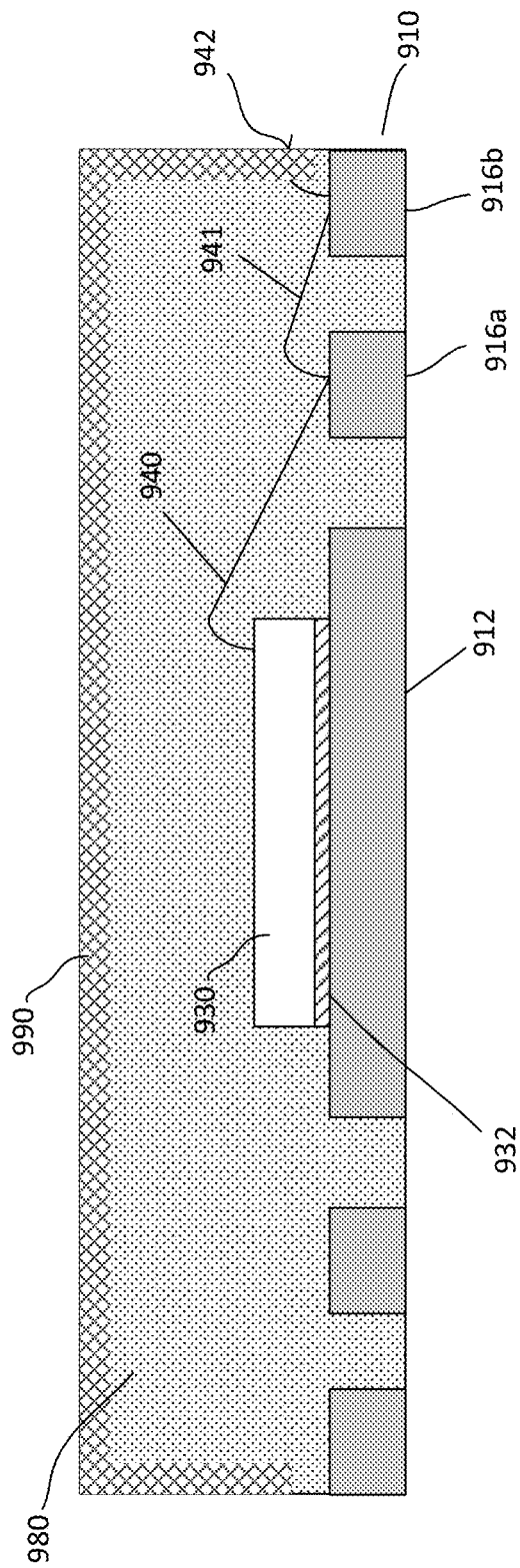

FIGS. 9*a* to 9*b* show top and side views of another embodiment of a semiconductor package 900. The semiconductor package may be similar to those described in FIGS. 8*a* to 8*b*. Common elements may not be described or described in detail.

As shown, the semiconductor package includes a package substrate 910 configured with a die-attach pad (DAP) 912 and package pads 916*a-b*. The package pads, for example, are arranged in two rows on opposing sides of the DAP. The DAP, as shown, is attached to a die 930 by a first die adhesive 932. A top surface of the die includes three die pads which are coupled to the package pads 916*a* by first wire bonds 940. In one embodiment, inter-pad wire bond 941 may be provided to interconnect package pads. Other die configurations and other configurations of connecting dies to the package substrate may also be useful.

An encapsulant 980 encapsulates the die and the package substrate. As shown, the side walls of the encapsulant are aligned with the edges of the package substrate and a top surface of the encapsulant is disposed above the die and the wire bonds. In one embodiment, the encapsulant includes lower sidewall portions which are aligned with the edges of the package substrate and upper sidewall portions which are recessed slightly from the lower sidewall portions. Other configurations of the encapsulant may also be useful.

In one embodiment, an external shield structure 990 is formed on the package. The external shield structure, for example, serves as an EMI shield. The external shield structure, for example, may be a Cu or Cu-alloy shield. Other types of EMI shields may also be useful. The external shield structure, for example, is formed by plating and surrounds the package. For example, the external shield structure is plated onto the package after singulation, and covers the top surface and upper sidewall portions of the encapsulant. In some embodiments, the external shield structure covers the top surface and sides of the upper sidewall portions of the encapsulant. Other techniques for forming the external shield structure may also be useful.

In one embodiment, the external shield structure is coupled to the package substrate by a wire bond. The wire bond, for example, may be referred to as a shield wire bond 942. As shown, the shield wire bond connects the shield structure to a package pad on the package substrate. In one embodiment, the shield wire bond 942 is connected to the ground package pad on the package substrate to ground the external shield. Since the external shield structure is connected to the shield wire bond, it is also connected to ground. In one embodiment, as shown, the package pad to which the shield wire bond is connected is connected to another wire bond that is coupled to a die of the package. Other configurations of the shield wire bond may also be useful.

FIGS. 10*a* to 10*g* show an embodiment of a process 1000 for parallelly forming semiconductor packages with shield structures. The semiconductor packages may be similar to those described in FIGS. 5*c* to 5*d*.

Figure 10A:
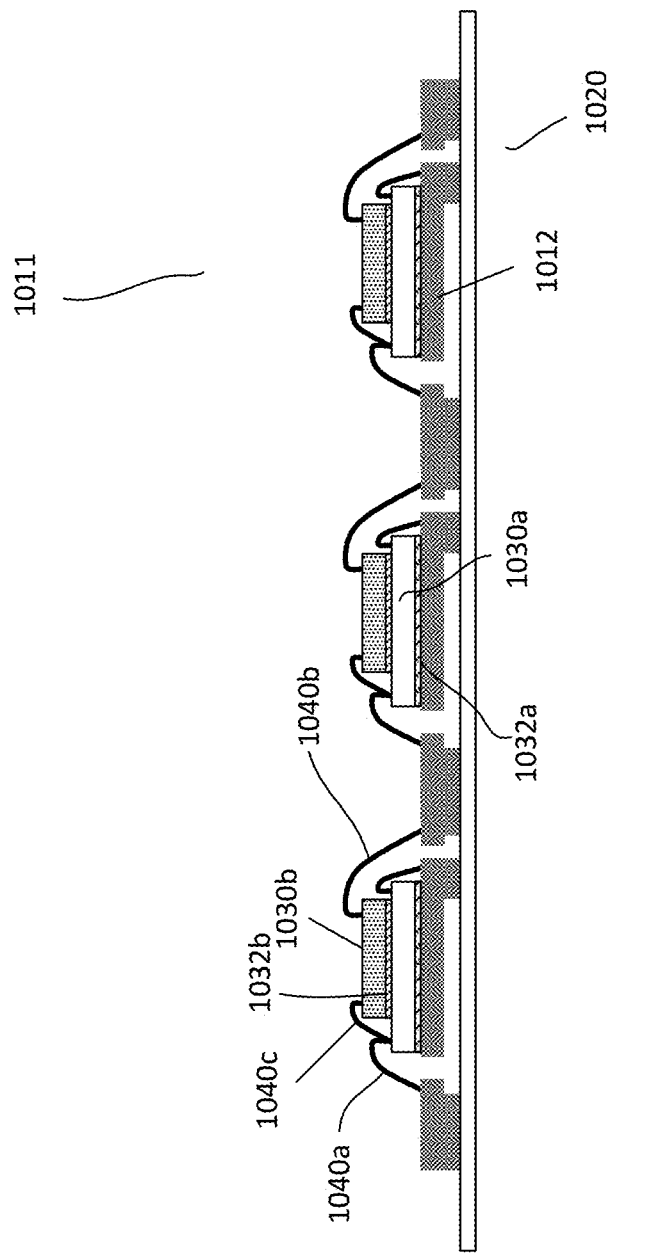
FIGS. 10a to 10g show an embodiment of a process for forming semiconductor packages with shield structures by parallel processing.

In FIG. 10*a*, a package substrate strip 1020 having a plurality of package substrates 1011 is provided. The package substrate strip, for example, is a lead frame strip with a plurality of lead frames. Other types of package substrate strips may also be useful. As shown, first dies 1030*a* are attached to DAPs 1012 of the packages and second dies 1030*b* are attached to a top surface of the first dies to form a die stack. Die adhesives 1032*a-b* are employed to attach the first and second dies as well as the first dies to the DAPs of the package substrates.

Wire bonds are formed to connect the dies to the package substrate. In one embodiment, first wire bonds 1040*a* connect the first dies to the package substrate, second wire bonds 1040*b* connect the second dies to the package substrate and inter-die wire bonds 1040*c* interconnect the first and second dies. Other configurations for connecting the dies or chips to the package substrate as well as inter-die connections may also be useful. For example, the dies may be flip chips, or a combination of both different types of dies.

Figure 10B:
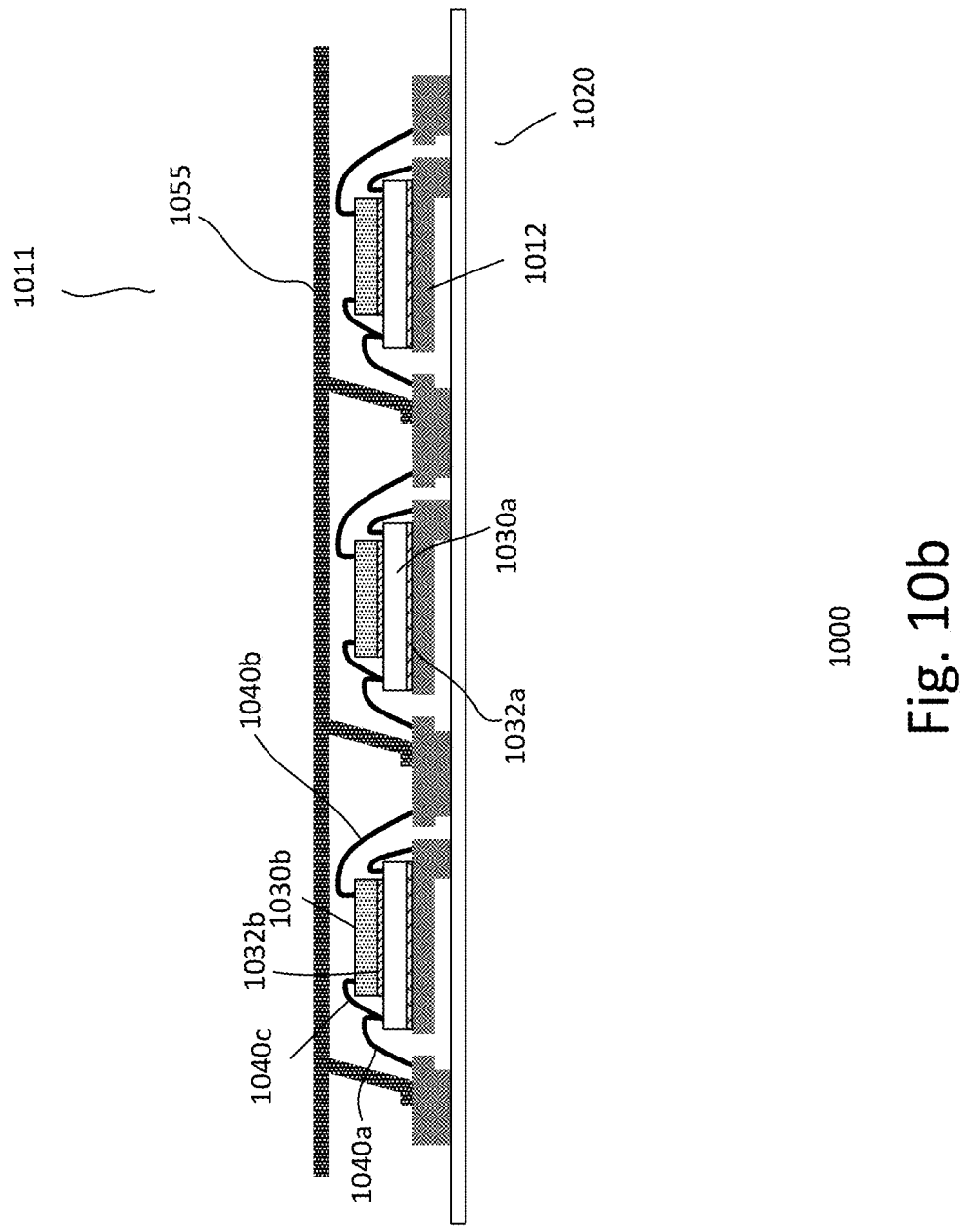

In FIG. 10*b*, a shield sheet 1055 patterned with shield structures is attached to the package substrate strip. For example, the shield sheet is patterned with L-shaped shield structures, as described in FIGS. 1*a* to 1*c* and 5*a* to 5*d*.

Figure 10C:
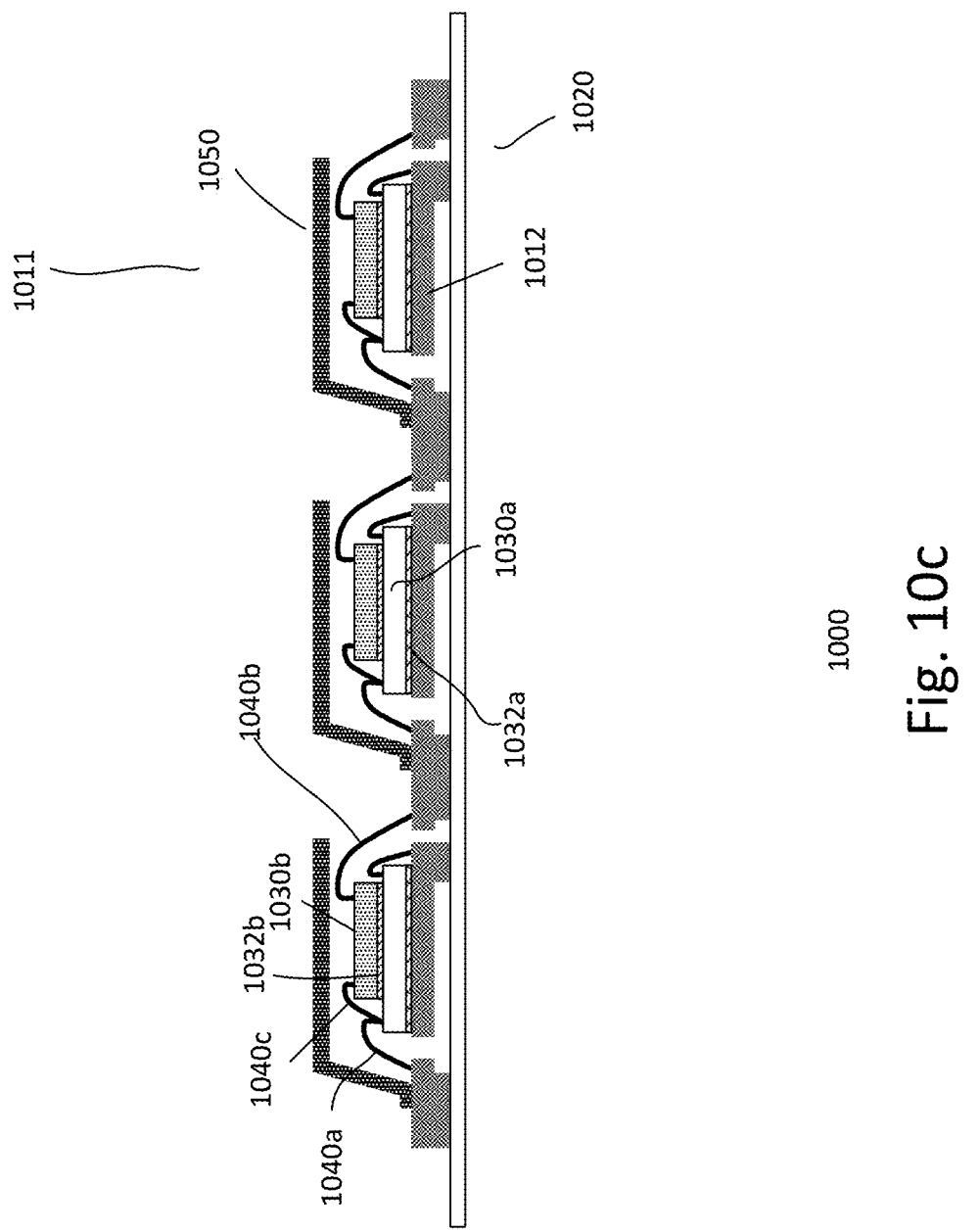

The shield sheet is singulated into individual structures 1050 in FIG. 10*c*. For example, a patterning process patterns the shield sheet and removes parts to separate it into individual L-shaped shield structures attached to the package substrate strip. The individual L-shaped shield structures may be referred to as first shield structures. Each first shield structure is configured to cover the die stack on its respective package substrate.

Figure 10D:
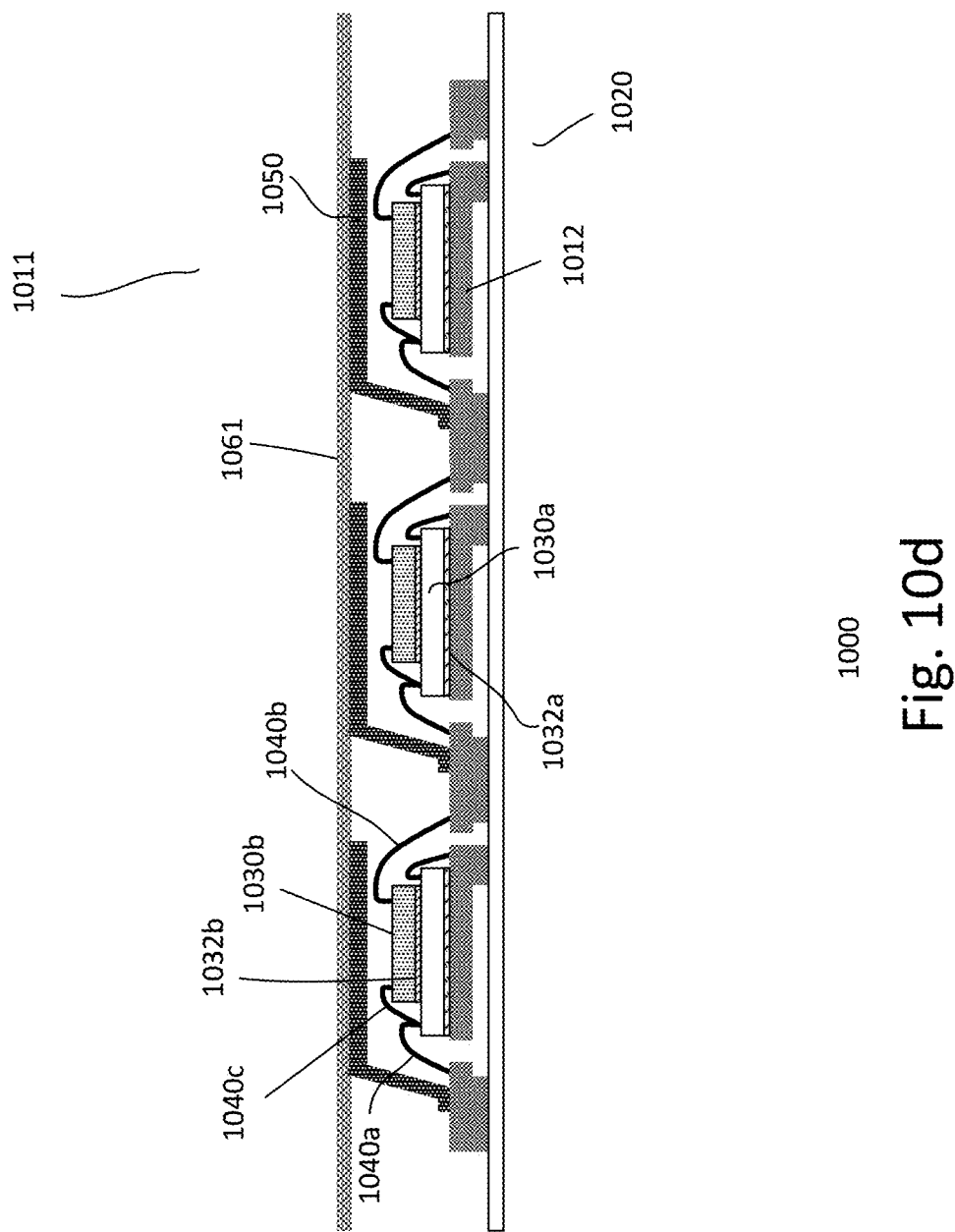

After shield sheet singulation, a shield film layer 1061 is formed over the first shield structures on the package substrate strip in FIG. 10*d*. The shield film may be a conductive film such as a silver filled film. Other conductive materials such as an epoxy-based conductive material like silver filled epoxy may also be employed. Other types of shield films may also be useful. The shield film may be, for example, a preformed shield film. Alternatively, a printing process may be performed to deposit a conductive film on the top surface of the first shield structures. The conductive film is then cured to form the shield film layer over the first shield structures.

Figure 10E:
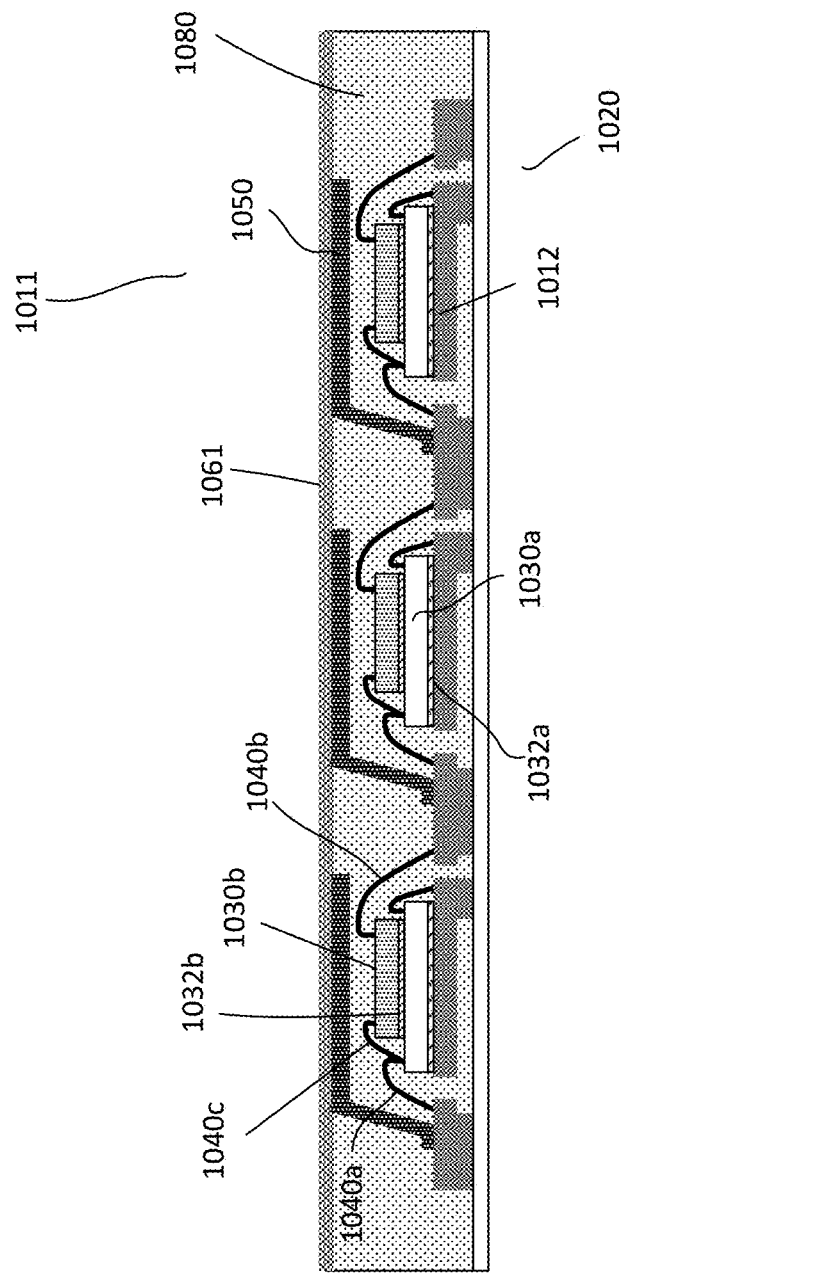

In FIG. 10*e*, a molding process using an encapsulant is performed to encapsulate the packages of the package substrate strip. In one embodiment, the encapsulant 1080 covers the dies, wire bonds, and at least sides of the shield structures on the package substrate strip. As shown, a top surface of the encapsulant may be coplanar with a top of the shield film layer.

Figure 10F:
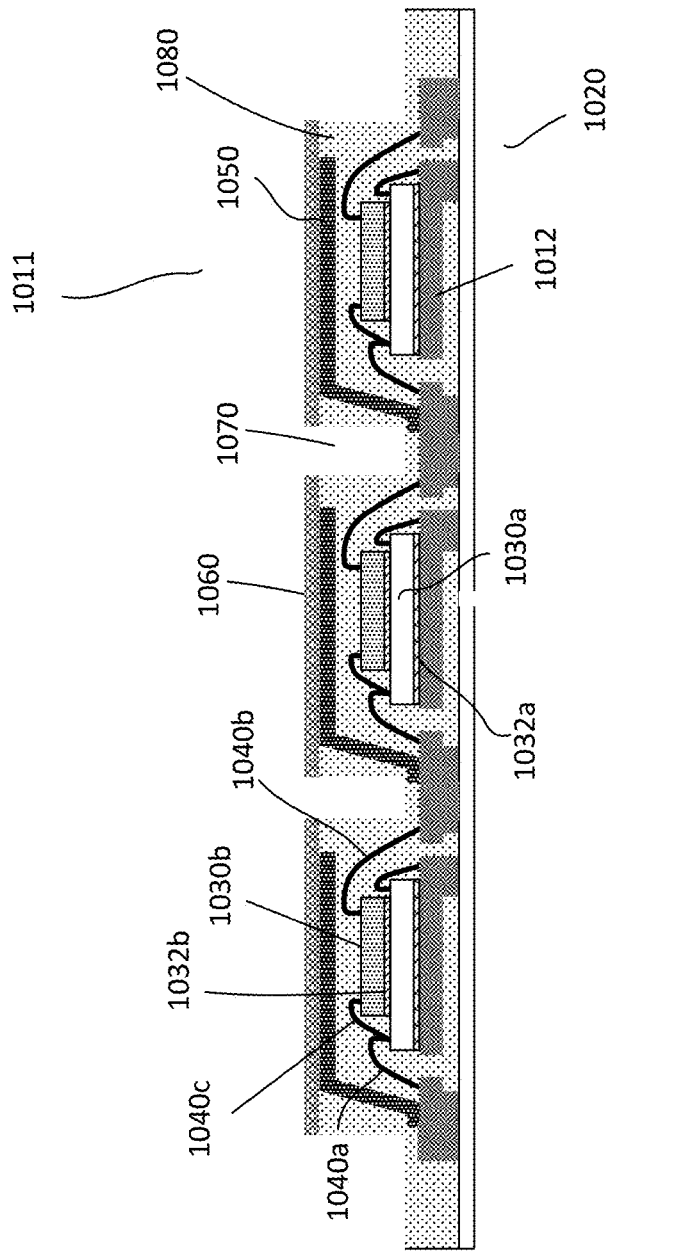

After molding, the package substrate strip is subjected to a partial singulation process in FIG. 10*f*. For example, the encapsulant is sawed in the x and y direction to form partial cuts between adjacent packages of the package substrate strip. As shown, recesses 1070 are formed in upper portions of the encapsulant to partially separate the adjacent packages of the package substrate strip. The shield film layer, as shown is also singulated to form individual second shield structures 1060 covering over respective package substrates.

Figure 10G:
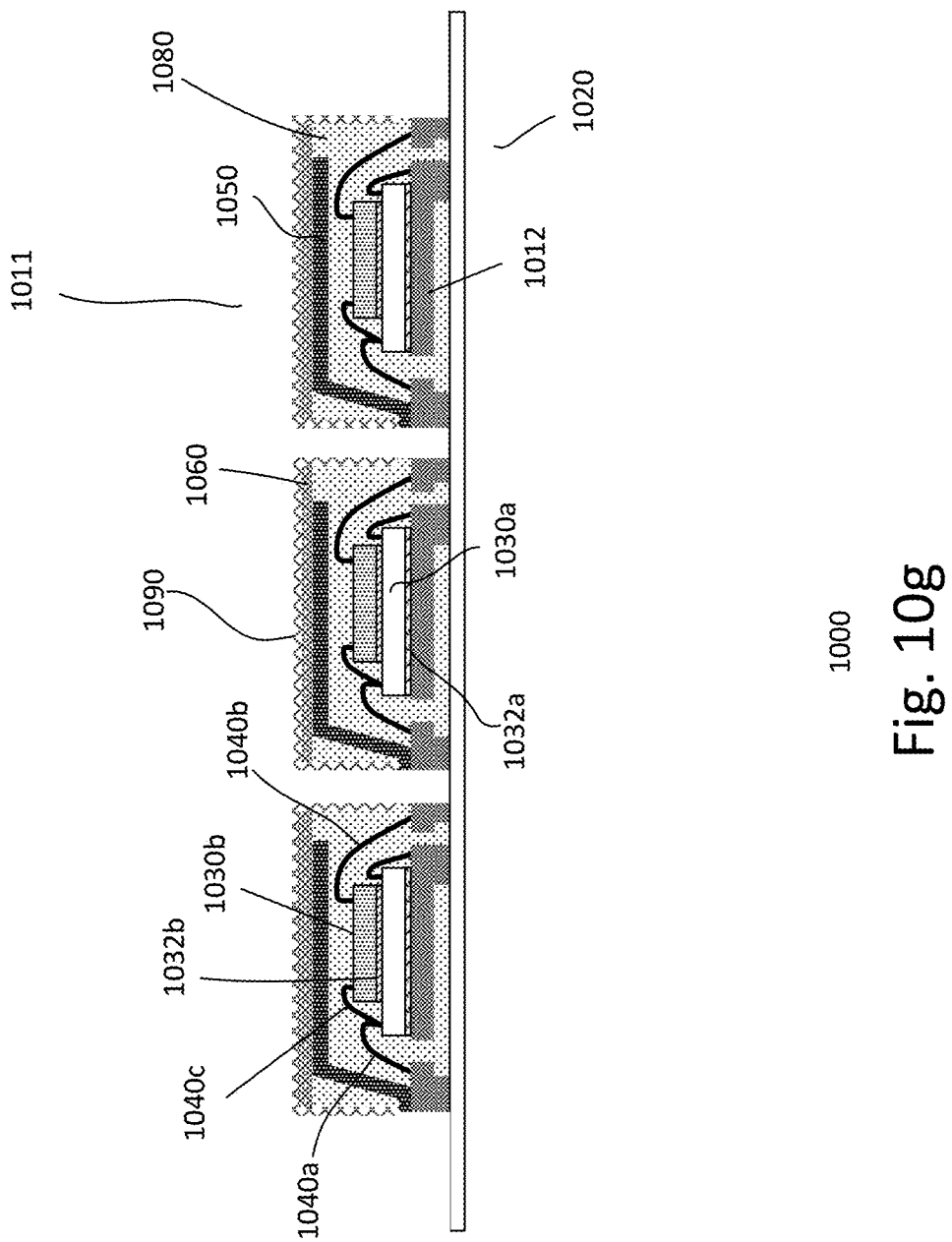

A plating process may be performed thereafter to form third shield structures 1090 over the respective package substrates in FIG. 10*g*. For example, a top surface of the second shield structures, as well as the exposed upper sidewall portions of the encapsulant of the package substrate strip are plated with a conductive material, such as a Cu or Cu-alloy using a printing technique. Other techniques, such as sputtering or spray coating may also be useful. Each third shield structure, for example, serves as an external shield structure for shielding its respective package substrate from external EMI.

A full singulation is performed thereafter to singulate the package strip into individual encapsulated packages. As shown, the encapsulant of each package includes lower sidewall portions which are aligned with the edges of the package substrate and upper sidewall portions which are recessed slightly from the lower sidewall portions. Other configurations of the encapsulated packages may also be useful.

It is appreciated that a thermal interface layer (TIL) may be optionally formed on the package substrate strip prior to attachment of the shield sheet. For example, a TIL (not shown) is formed on the top surface of an uppermost die of a die stack for each package substrate. The TIL may be an electrically or non-electrically conductive material. For example, the TIL, such as a silver filled epoxy, is formed by a plating process. Other techniques for forming the TIL may also be useful. The TIL serves as a bridging contact to enhance thermal coupling between the shield structures and the dies. This enables the shield structures to further serve as a heat dissipator or sink.

FIGS. 11*a* to 11*g* show another embodiment of a process 1100 for parallelly forming semiconductor packages with shield structures. The semiconductor packages may be similar to those described in FIGS. 6*a* to 6*b*.

Figure 11A:
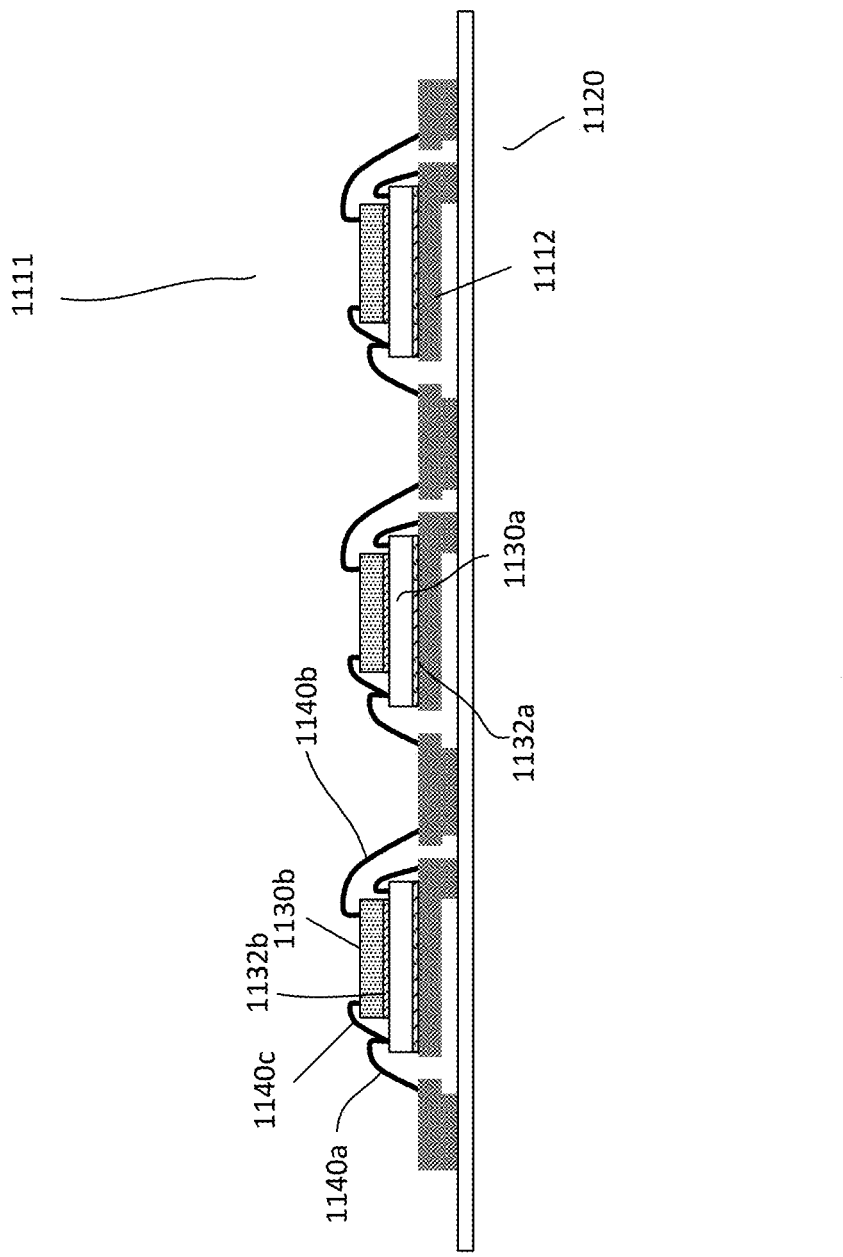
FIGS. 11a to 11g show another embodiment of a process for forming semiconductor packages with shield structures by parallel processing.

In FIG. 11*a*, a package substrate strip 1120 having a plurality of package substrates 1111 is provided. The package substrate strip, for example, is a lead frame strip with a plurality of lead frames. Other types of package substrate strips may also be useful. As shown, first dies 1130*a* are attached to DAPs 1112 of the packages and second dies 1130*b* are attached to a top surface of the first dies to form a die stack. Die adhesives 1132*a-b* are employed to attach the first and second dies as well as the first dies to the DAPs of the package substrates.

Wire bonds are formed to connect the dies to the package substrate. In one embodiment, first wire bonds 1140*a* connect the first dies to the package substrate, second wire bonds 1140*b* connect the second dies to the package substrate and inter-die wire bonds 1140*c* interconnect the first and second dies. Other configurations for connecting the dies or chips to the package substrate as well as inter-die connections may also be useful. For example, the dies may be flip chips, or a combination of both different types of dies.

Figure 11B:
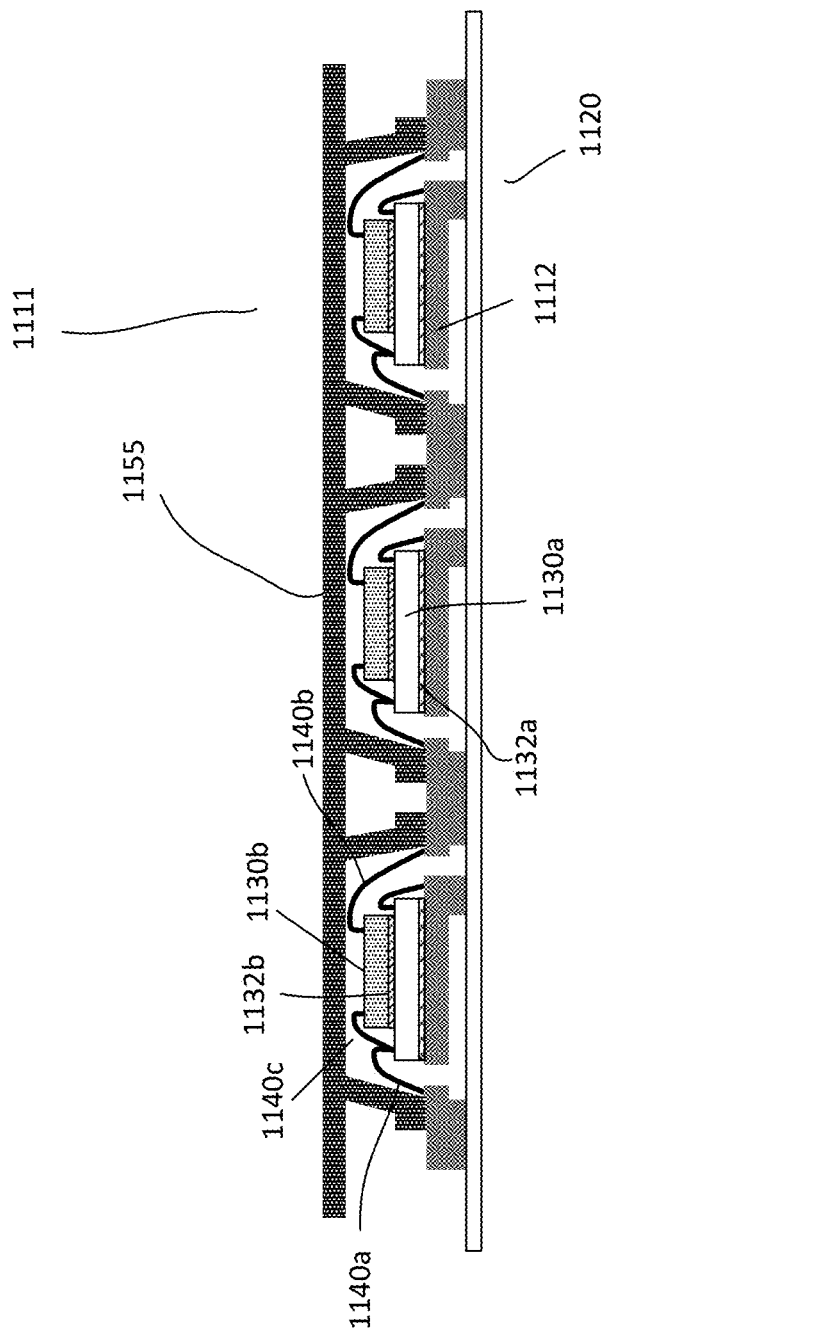

In FIG. 11*b*, a shield sheet 1155 patterned with shield structures is attached to the package substrate strip. For example, the shield sheet is patterned with U-shaped shield structures, as described in FIGS. 2*a* to 2*c* and 6*a* to 6*b*.

Figure 11C:
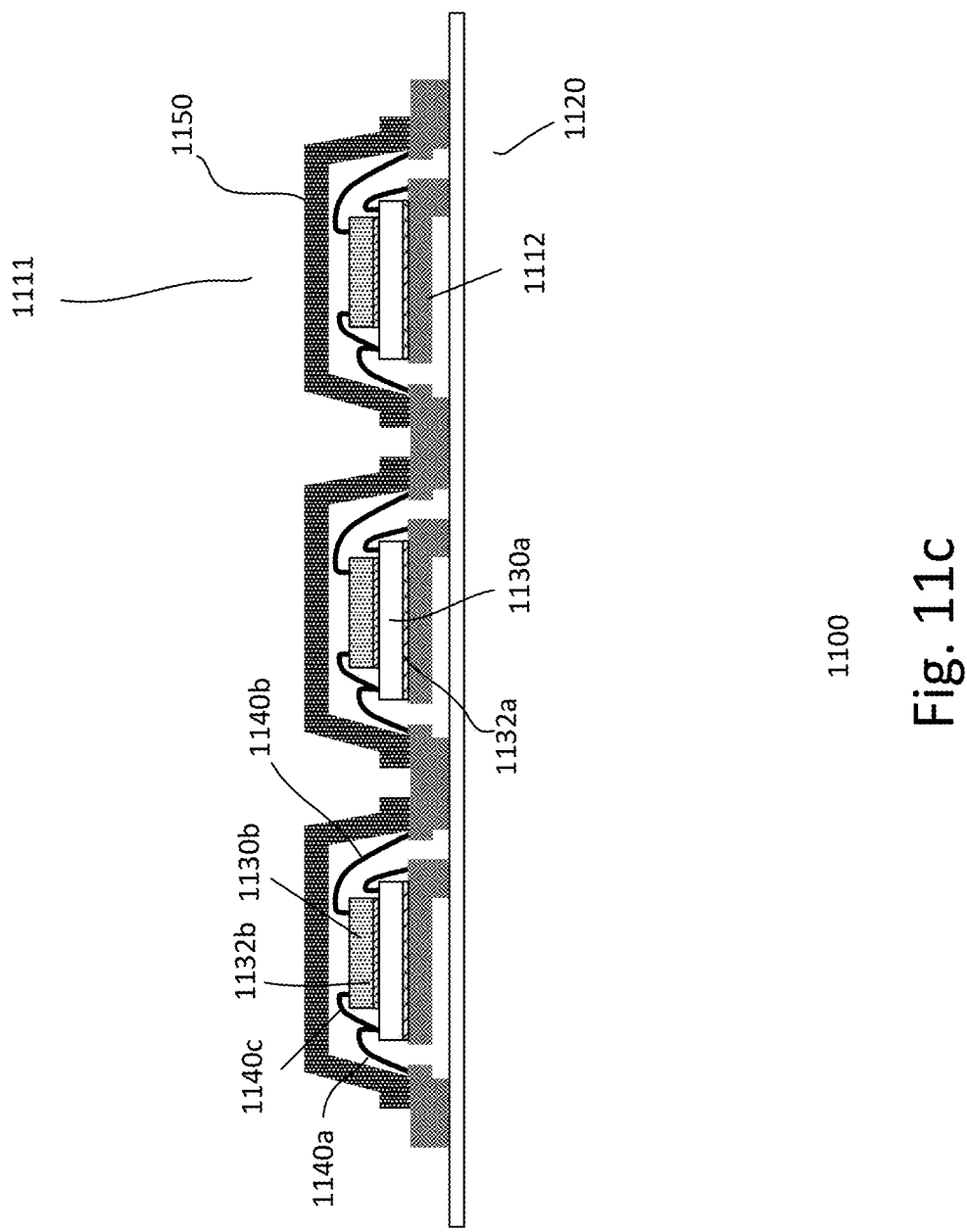

The shield sheet is singulated into individual shield structures 1150 in FIG. 11*c*. For example, a patterning process patterns the shield sheet and removes parts to separate it into individual U-shaped shield structures attached to the package substrate strip. The individual U-shaped shield structures may be referred to as first shield structures. Each first shield structure is configured to cover the die stack on its respective package substrate.

Figure 11D:
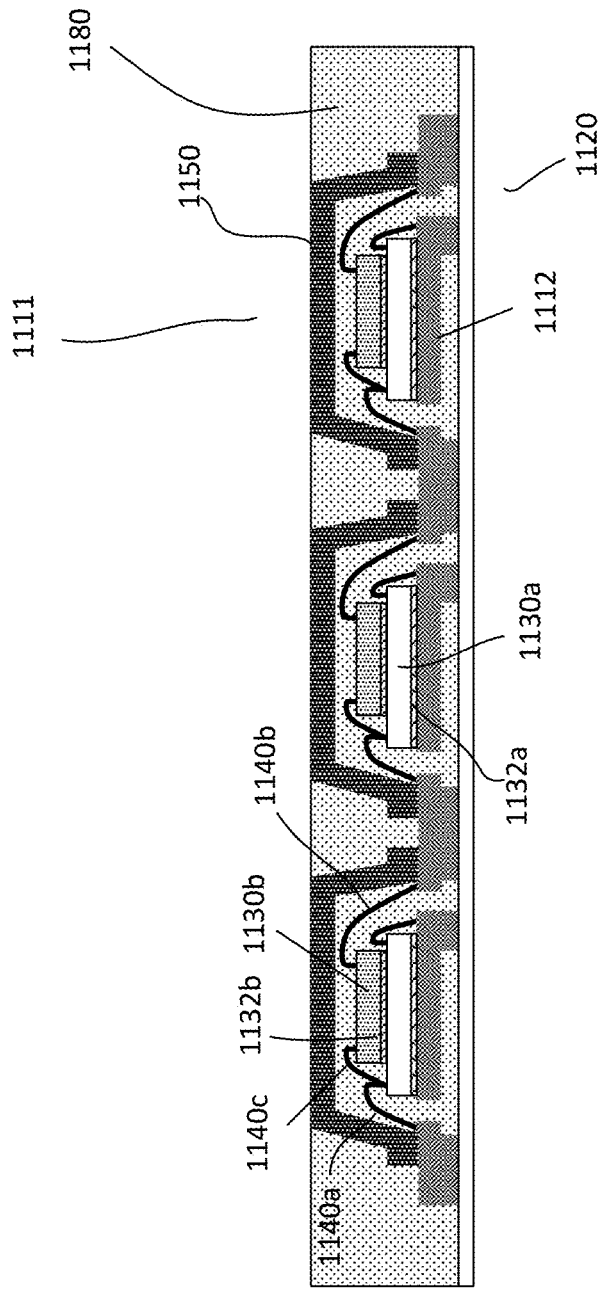

In FIG. 11*d*, a molding process using an encapsulant is performed to encapsulate the packages of the package substrate strip. In one embodiment, the encapsulant 1180 covers the dies, wire bonds, and at least sides of the first shield structures on the package substrate strip. As shown, a top surface of the encapsulant may be coplanar with a top of the first shield structures.

Figure 11E:
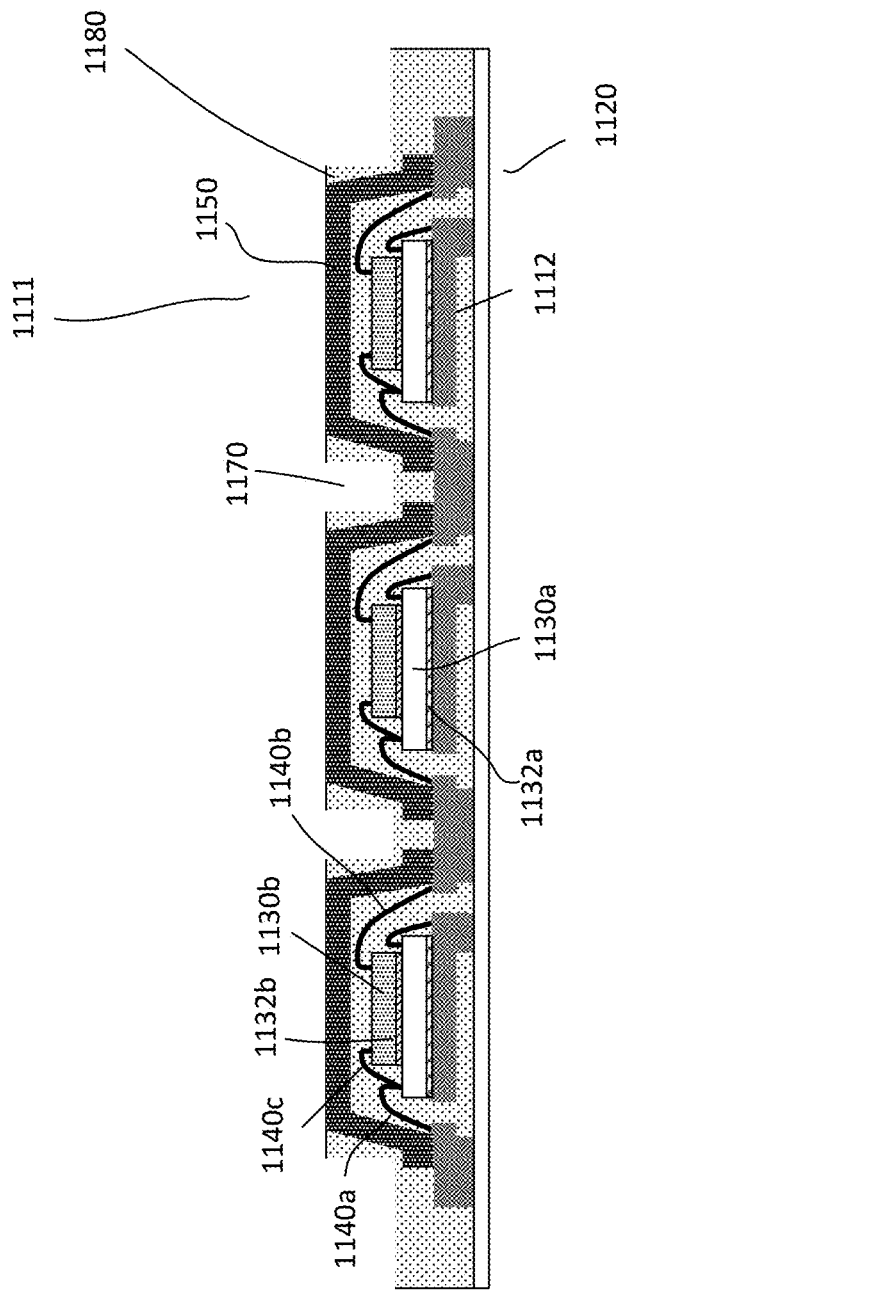

After molding, the package substrate strip is subjected to a partial singulation process in FIG. 11*e*. For example, the encapsulant is sawed in the x and y direction to form partial cuts between adjacent packages of the package substrate strip. As shown, recesses 1170 are formed in an upper portion of the encapsulant to partially separate the adjacent packages of the package substrate strip.

Figure 11F:
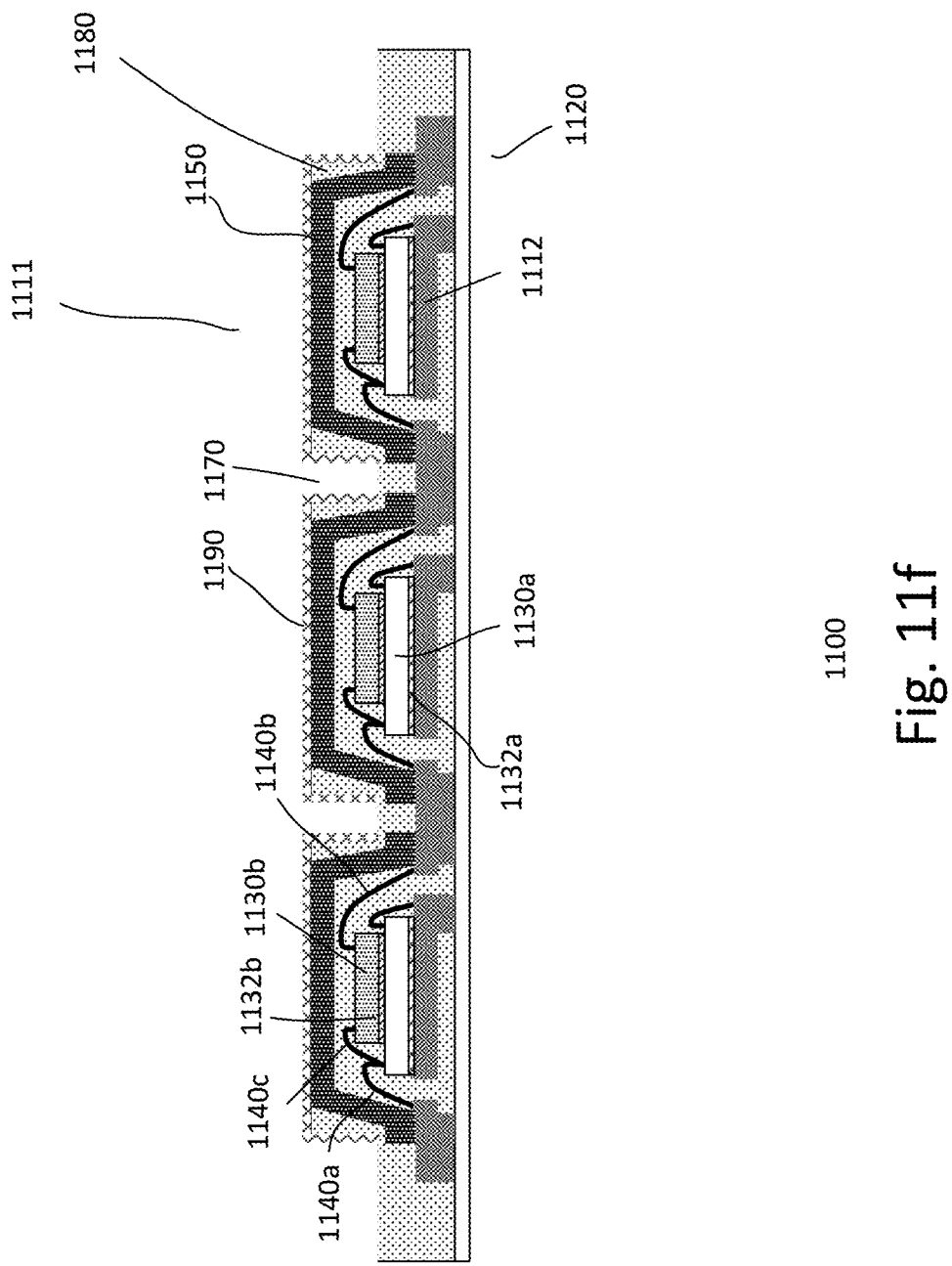

A plating process may be performed thereafter to form second shield structures 1190 over the respective package substrates in FIG. 11*f*. For example, a top surface of the first shield structures, as well as the exposed upper sidewall portions of the encapsulant of the package substrate strip is plated with a conductive material, such as a Cu or Cu-alloy using a printing technique. Other techniques, such as sputtering or spray coating may also be useful. Each second shield structure, for example, serves as an external shield structure for shielding its respective package substrate from external EMI.

Figure 11G:
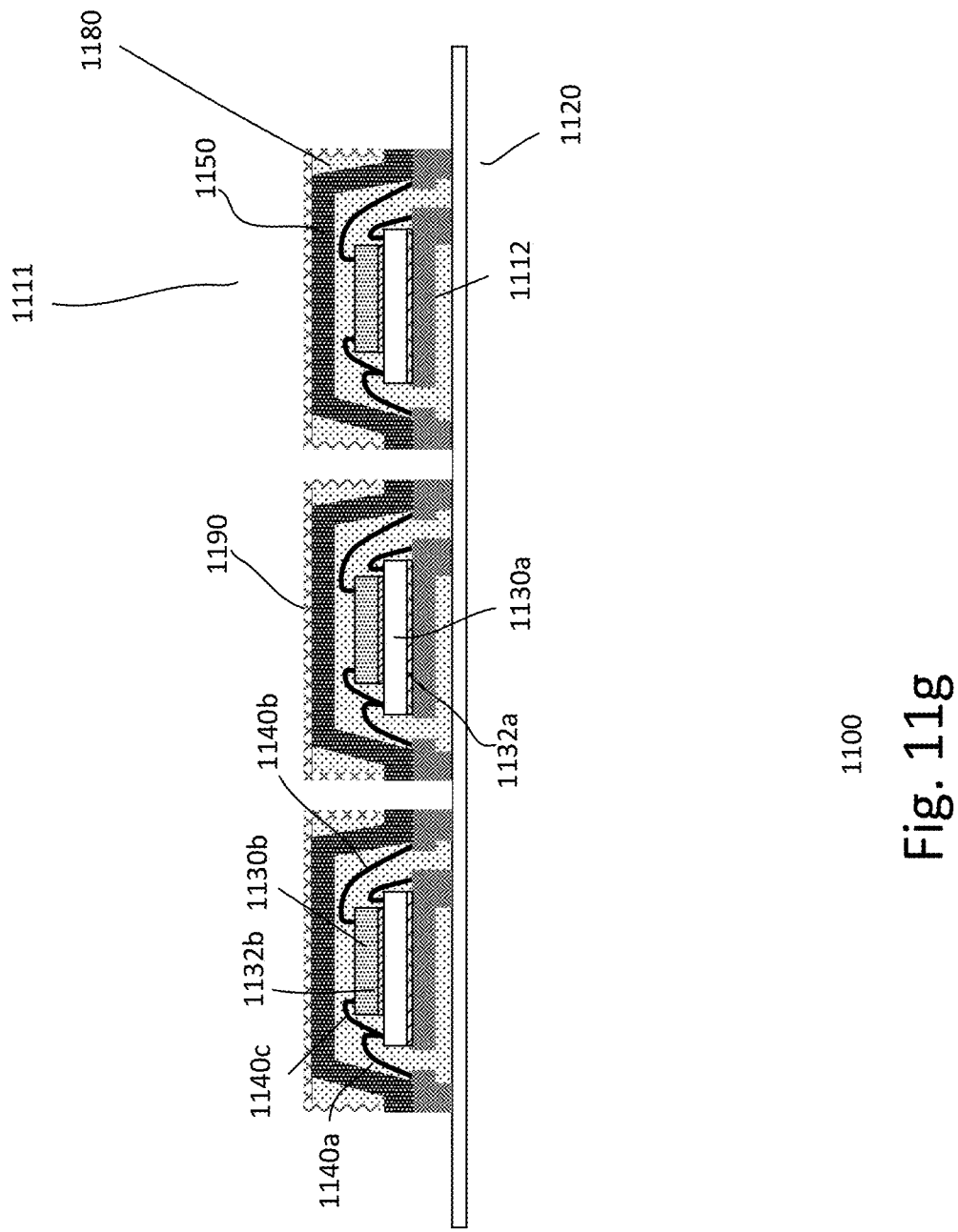

A full singulation is performed in FIG. 11*g* to singulate the package substrate strip into individual encapsulated packages. As shown, the encapsulant of each package includes lower sidewall portions which are aligned with the edges of the package substrate and upper sidewall portions which are recessed slightly from the lower sidewall portions. Other configurations of the encapsulated packages may also be useful.

It is appreciated that a thermal interface layer (TIL) may be optionally formed on the package substrate strip prior to attachment of the shield sheet. For example, a TIL (not shown) is formed on the top surface of an uppermost die of a die stack for each package substrate. The TIL may be an electrically or non-electrically conductive material. For example, the TIL, such as a silver filled epoxy, is formed by a plating process. Other techniques for forming the TIL may also be useful. The TIL serves as a bridging contact to enhance thermal coupling between the shield structures and the dies. This enables the shield structures to further serve as a heat dissipator or sink.

FIGS. 12a to 12f show another embodiment of a process 1200 for parallelly forming semiconductor packages with shield structures. The semiconductor packages may be similar to those described in FIGS. 7a to 7b.

Figure 12A:
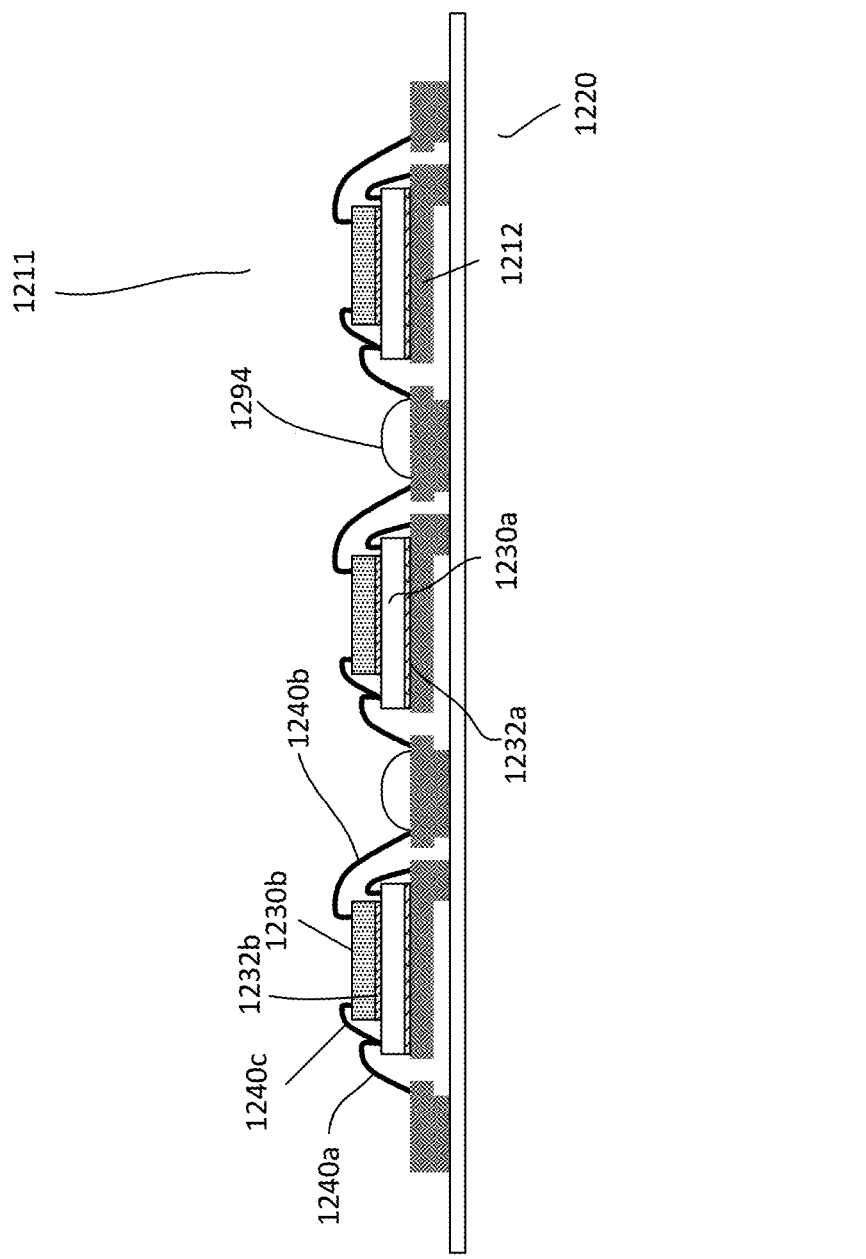

In FIG. 12a, a package substrate strip 1220 having a plurality of package substrates 1211 is provided. The package substrate strip, for example, is a lead frame strip with a plurality of lead frames. Other types of package substrate strips may also be useful. As shown, first dies 1230a are attached to DAPs 1212 of the packages and second dies 1230b are attached to a top surface of the first dies to form a die stack. Die adhesives 1232a-b are employed to attach the first and second dies as well as the first dies to the DAPs of the package substrates.

Wire bonds are formed to connect the dies to the package substrate. In one embodiment, first wire bonds 1240a connect the first dies to the package substrate, second wire bonds 1240b connect the second dies to the package substrate and inter-die wire bonds 1240c interconnect the first and second dies. Other configurations for connecting the dies or chips to the package substrate as well as inter-die connections may also be useful. For example, the dies may be flip chips, or a combination of both different types of dies.

In one embodiment, shield wire bonds are formed to interconnect ground package pads of adjacent package substrates. For example, shield wire bonds with closed wire loops 1294 connecting between adjacent package substrates are formed. Other configurations of the shield wire bonds may also be possible.

Figure 12B:
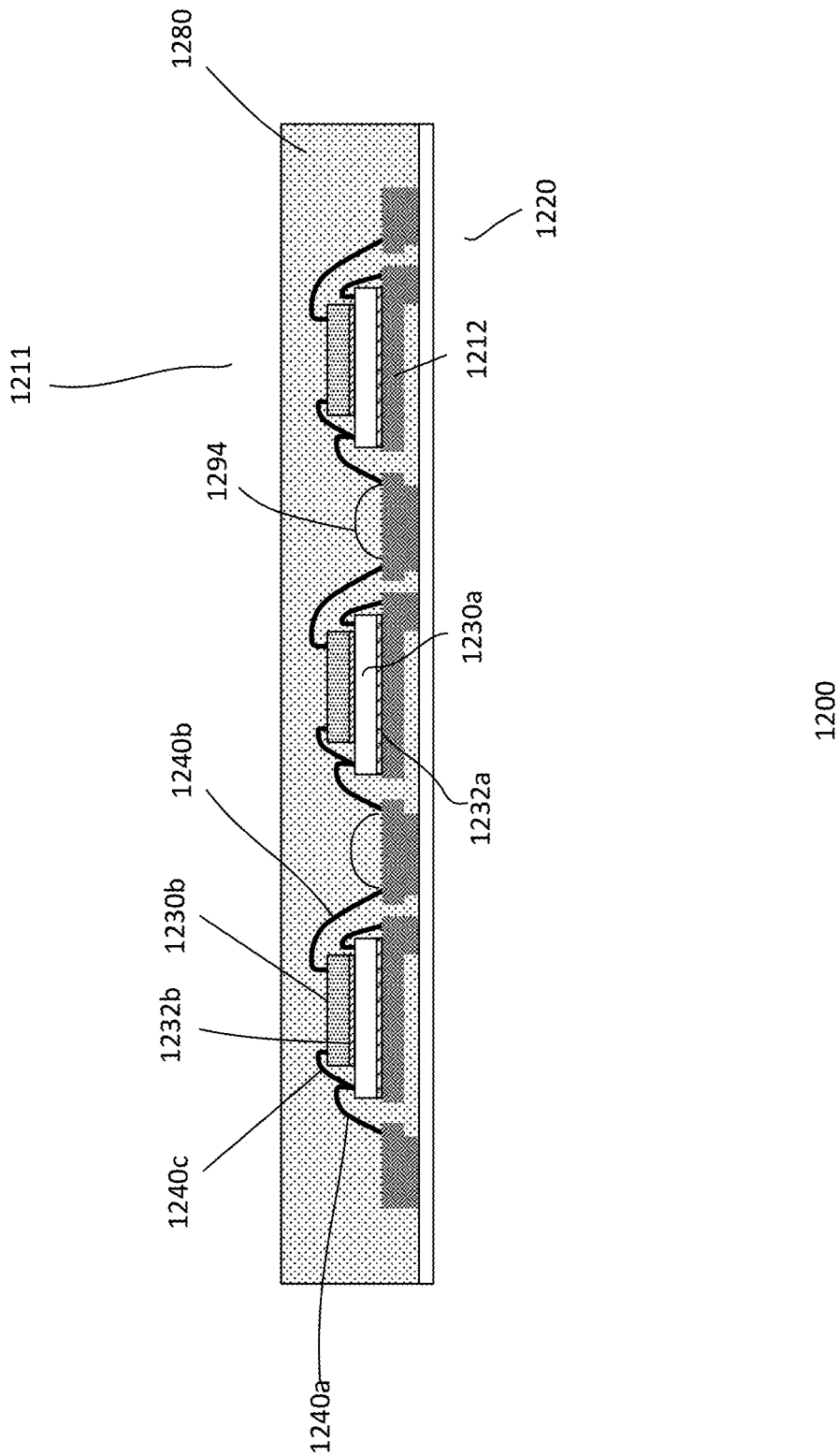

In FIG. 12b, a molding process using an encapsulant is performed to encapsulate the packages of the package substrate strip. In one embodiment, the encapsulant 1280 covers the dies and wire bonds on the package substrate strip. As shown, a top surface of the encapsulant is disposed above the dies and the wire bonds.

Figure 12C:
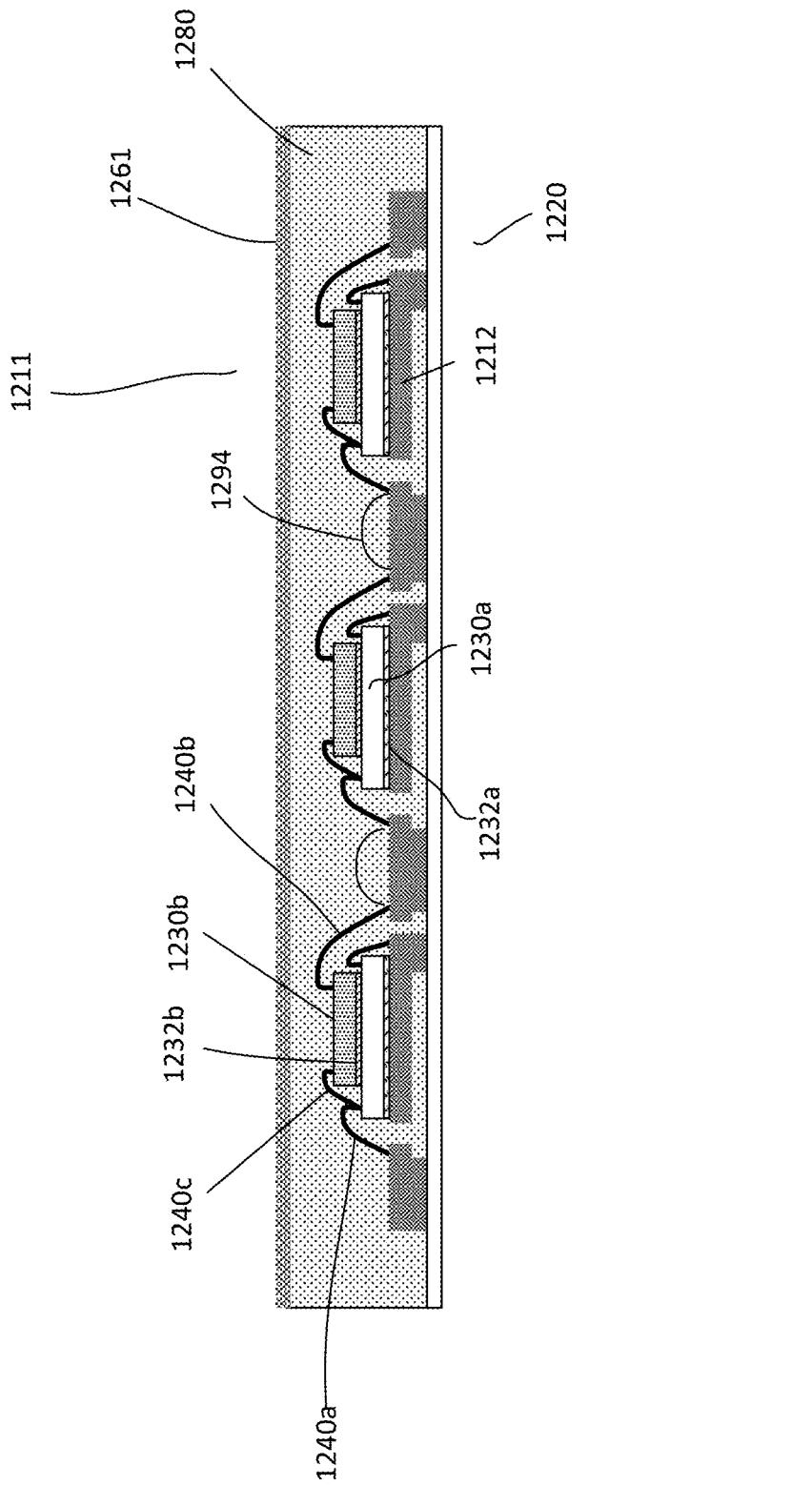

After molding, a shield film layer 1261 is formed over the encapsulant of the package substrate strip in FIG. 12c. The shield film layer may be a conductive film such as a silver filled film. Other conductive materials such as an epoxy-based conductive material like silver filled epoxy may also be employed. Other types of shield films may also be useful. A printing process may be performed to deposit a conductive film on the top surface of the encapsulant. The conductive film is then cured to form the shield film layer over the encapsulant.

Figure 12D:
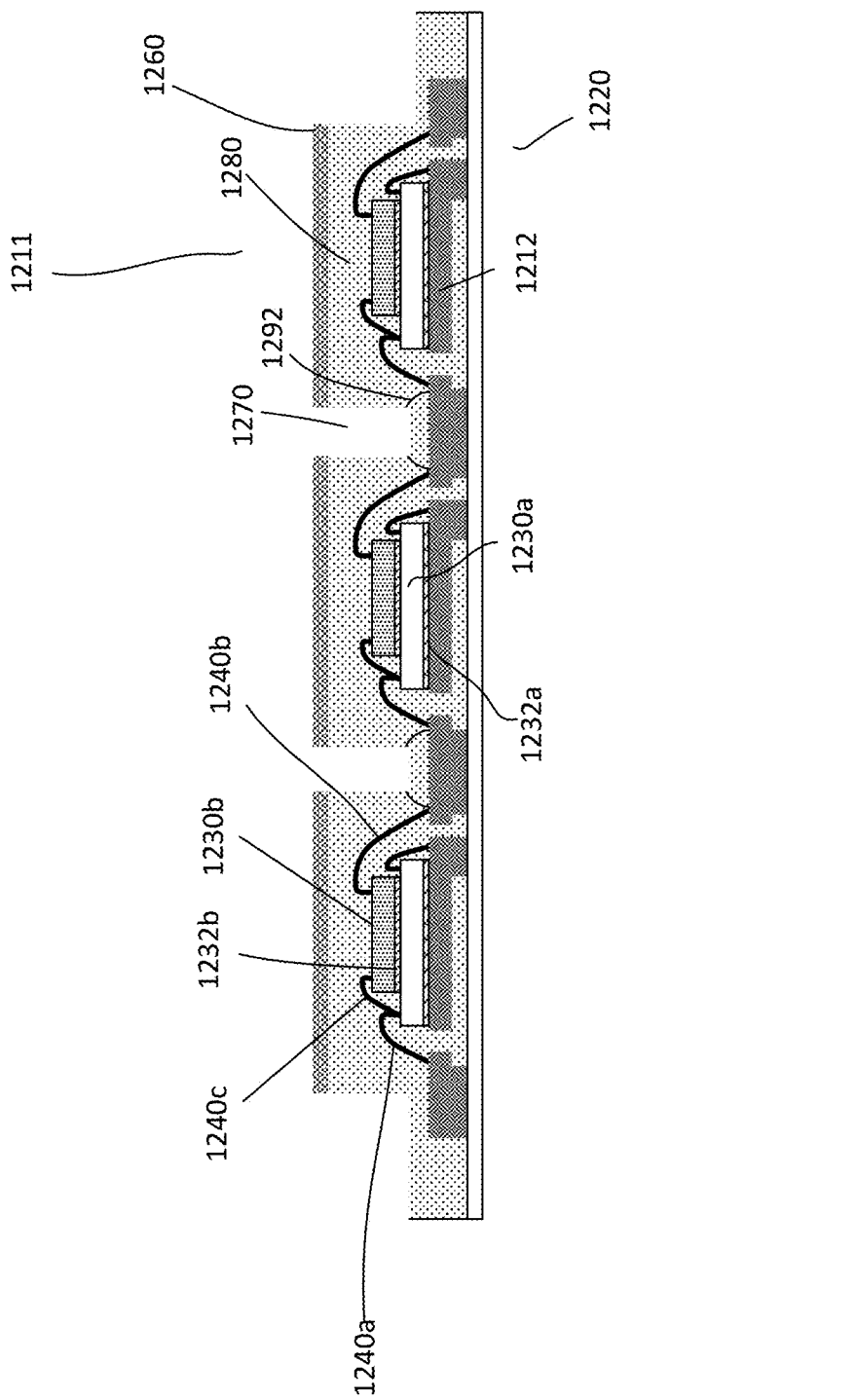

In FIG. 12d, the package substrate strip is subjected to a partial singulation process. For example, the encapsulant is sawed in the x and y direction to form partial cuts between adjacent packages of the package substrate strip. As shown, recesses 1270 are formed in an upper portion of the encapsulant to partially separate the adjacent packages of the package substrate strip. The shield film layer, as shown is also singulated to form individual first shield structures 1260 covering over respective package substrates.

In one embodiment, the closed wire loops of the shield wire bonds are singulated to form open wire loops 1292 during the partial singulation process. For example, singulated ends of the shield wire bonds are exposed at the upper sidewall portions of the partially cut encapsulant.

Figure 12E:
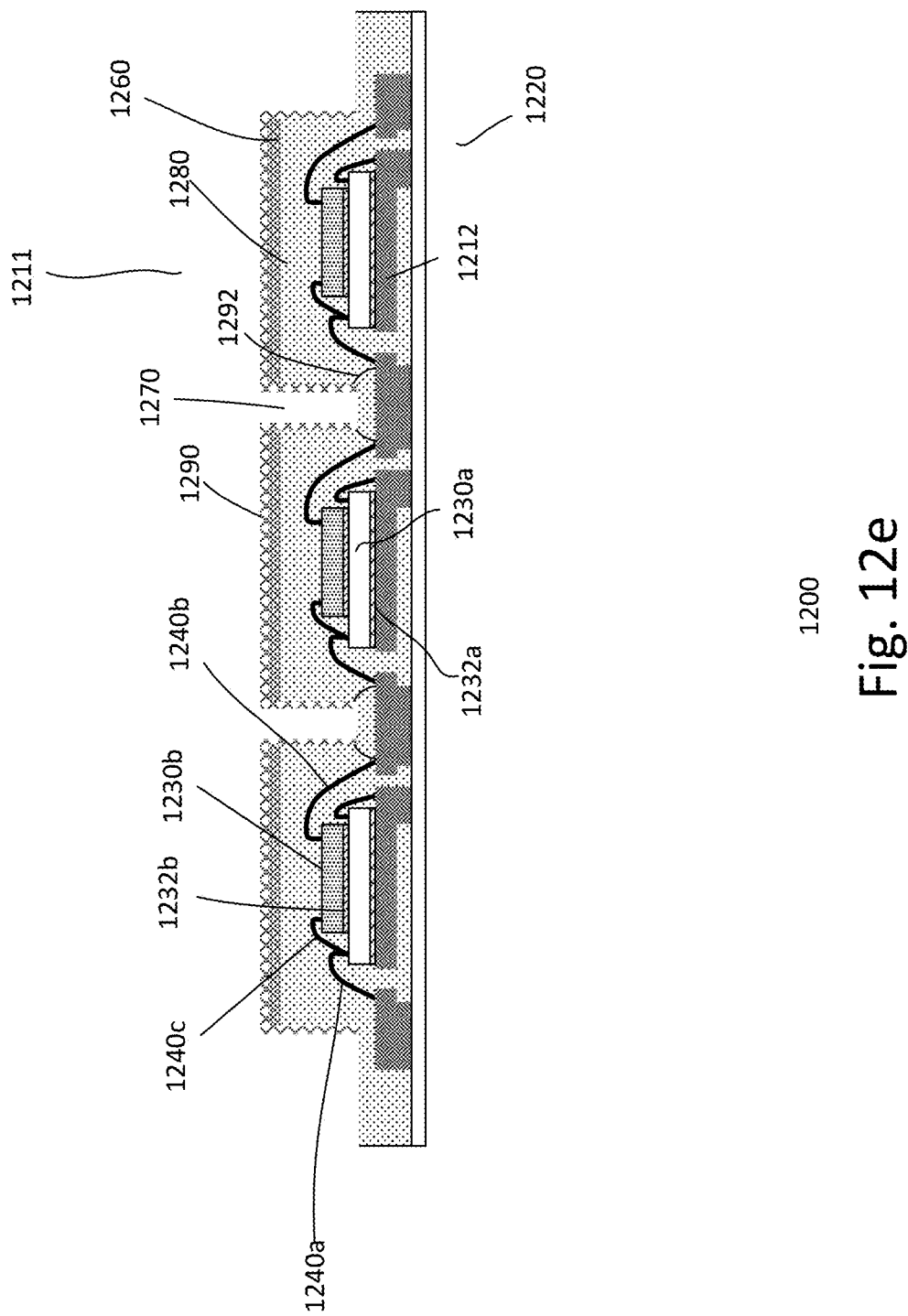

A plating process may be performed thereafter to form second shield structures 1290 over the respective package substrates in FIG. 12e. For example, a top and side surfaces of the first shield structures, as well as the exposed upper sidewall portions of the encapsulant of the package substrate strip are plated with a conductive material, such as a Cu or Cu-alloy using a printing technique. Other techniques, such as sputtering or spray coating may also be useful. Each second shield structure, for example, serves as an external shield structure for shielding its respective package substrate from external EMI.

In one embodiment, the external shield structure is connected to the singulated end of the shield wire bond. For example, the shield wire bond connects the external shield structure to a package pad on the package substrate. In one embodiment, the shield wire bond is connected to a ground package pad on the package substrate to ground the external shield structure. Since the external shield structure is connected to the shield wire bond, it is also connected to ground. Likewise, the first shield structure which is coupled and disposed below the external shield structure is also connected to ground.

A full singulation is performed in FIG. 12f to singulate the package substrate strip into individual encapsulated packages. As shown, the encapsulant of each package includes lower sidewall portions which are aligned with the edges of the package substrate and upper sidewall portions which are recessed slightly from the lower sidewall portions. Other configurations of the encapsulated packages may also be useful.

It is appreciated that a thermal interface layer (TIL) may be optionally formed on the package substrate strip prior to the molding process. For example, a TIL (not shown) is formed on the top surface of an uppermost die of a die stack for each package substrate. The TIL may be an electrically or non-electrically conductive material. For example, the TIL, such as a silver filled epoxy, is formed by a plating process. Other techniques for forming the TIL may also be useful. The TIL serves as a bridging contact to enhance thermal coupling between the shield structures and the dies. This enables the shield structures to further serve as a heat dissipator or sink.

FIGS. 13a to 13e show another embodiment of a process 1300 for parallelly forming semiconductor packages with shield structures. The semiconductor packages may be similar to those described in FIGS. 8a to 8b and 9a to 9b.

Figure 13A:
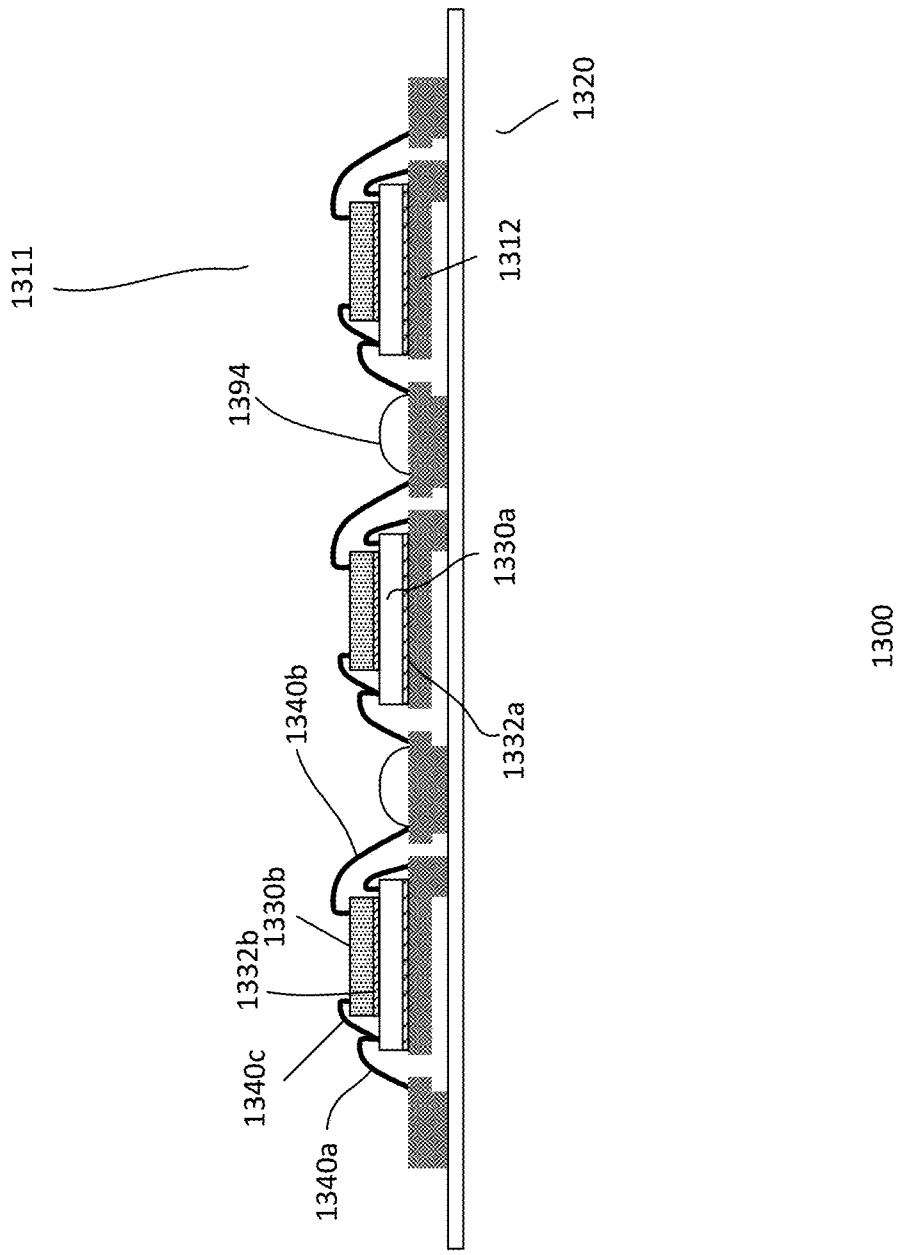
FIGS. 13a to 13e show another embodiment of a process for forming semiconductor packages with shield structures by parallel processing.

In FIG. 13a, a package substrate strip 1320 having a plurality of package substrates 1311 is provided. The package substrate strip, for example, is a lead frame strip with a plurality of lead frames. Other types of package substrate strips may also be useful. As shown, first dies 1330a are attached to DAPs 1312 of the packages and second dies 1330b are attached to a top surface of the first dies to form a die stack. Die adhesives 1332a-b are employed to attach the first and second dies as well as the first dies to the DAPs of the package substrates.

Wire bonds are formed to connect the dies to the package substrate. In one embodiment, first wire bonds 1340a connect the first dies to the package substrate, second wire bonds 1340b connect the second dies to the package substrate and inter-die wire bonds 1340c interconnect the first and second dies. Other configurations for connecting the dies or chips to the package substrate as well as inter-die connections may also be useful. For example, the dies may be flip chips, or a combination of both different types of dies.

In one embodiment, shield wire bonds are formed to interconnect ground package pads of adjacent package substrates. For example, shield wire bonds with closed wire loops 1394 connecting between adjacent package substrates are formed. Other configurations of the shield wire bonds may also be possible.

Figure 13B:
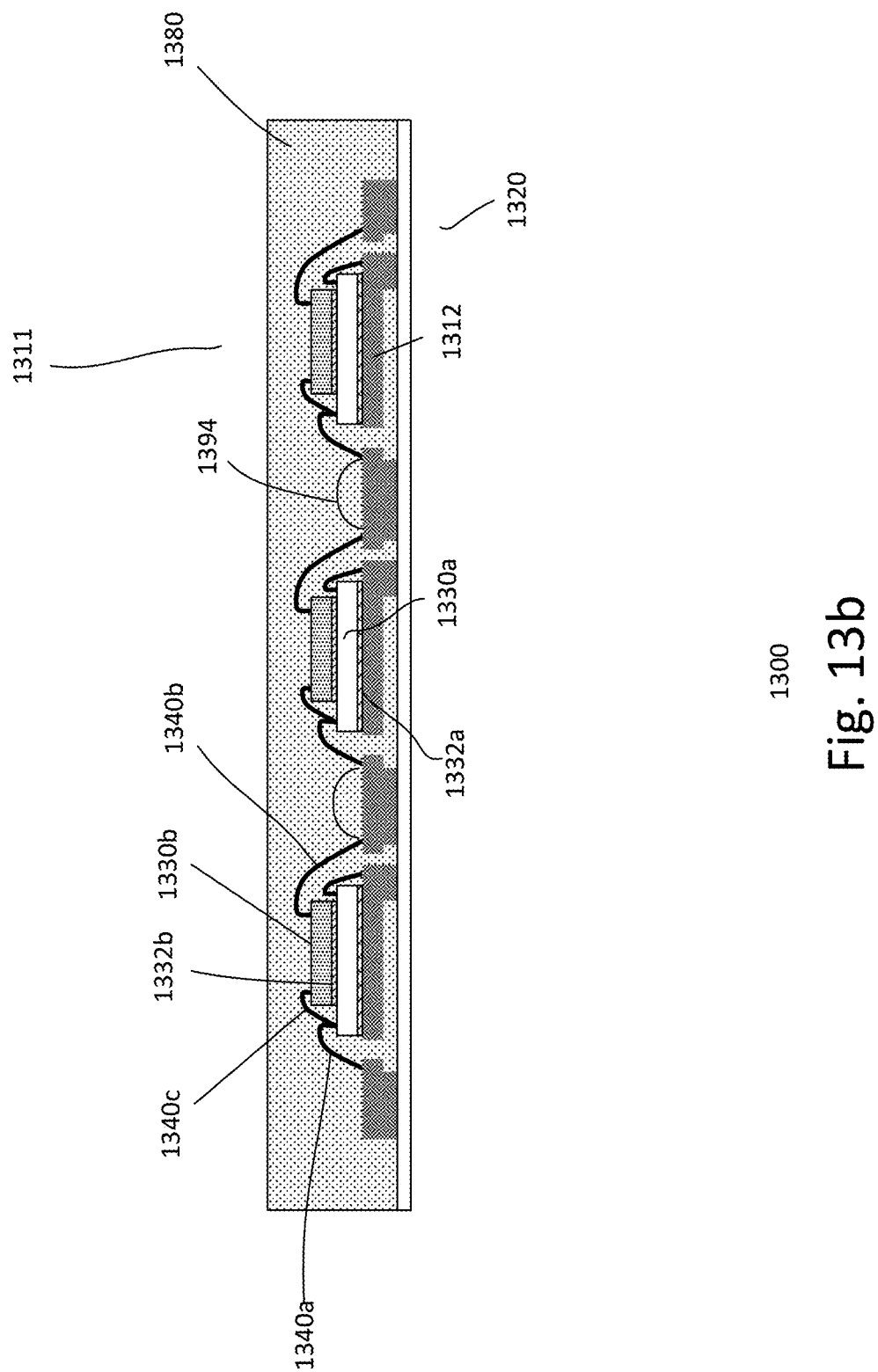

In FIG. 13*b*, a molding process using an encapsulant is performed to encapsulate the packages of the package substrate strip. In one embodiment, the encapsulant 1380 covers the dies and wire bonds on the package substrate strip. As shown, a top surface of the encapsulant is disposed above the dies and the wire bonds.

Figure 13C:
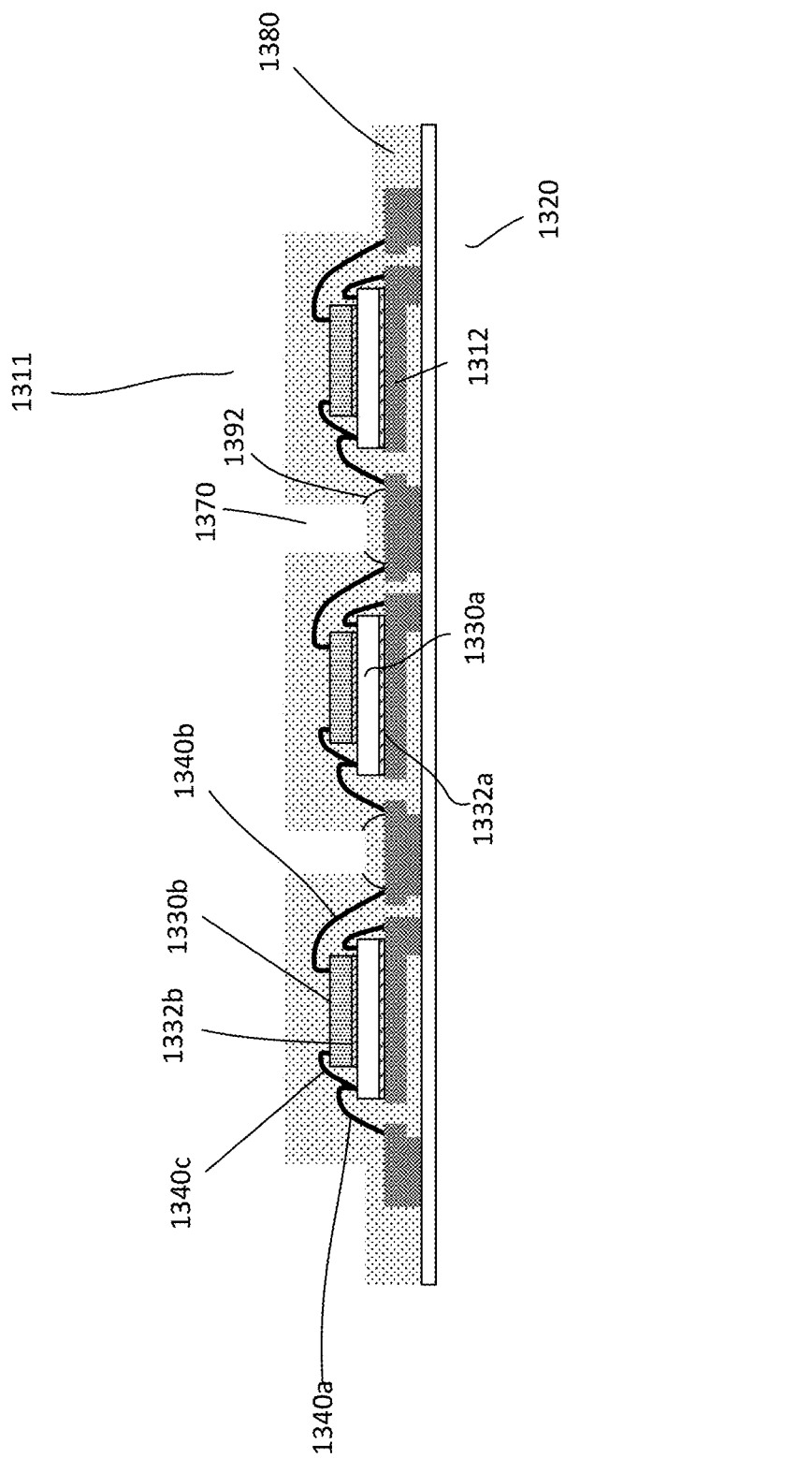

After molding, the package substrate strip is subjected to a partial singulation process in FIG. 13*c*. For example, the encapsulant is sawed in the x and y direction to form partial cuts between adjacent packages of the package substrate strip. As shown, recesses 1370 are formed in an upper portion of the encapsulant to partially separate the adjacent packages of the package substrate strip.

In one embodiment, the closed wire loops of the shield wire bonds are singulated to form open wire loops 1392 during the partial singulation process. For example, singulated ends of the shield wire bonds are exposed at the upper sidewall portions of the partially cut encapsulant.

Figure 13D:
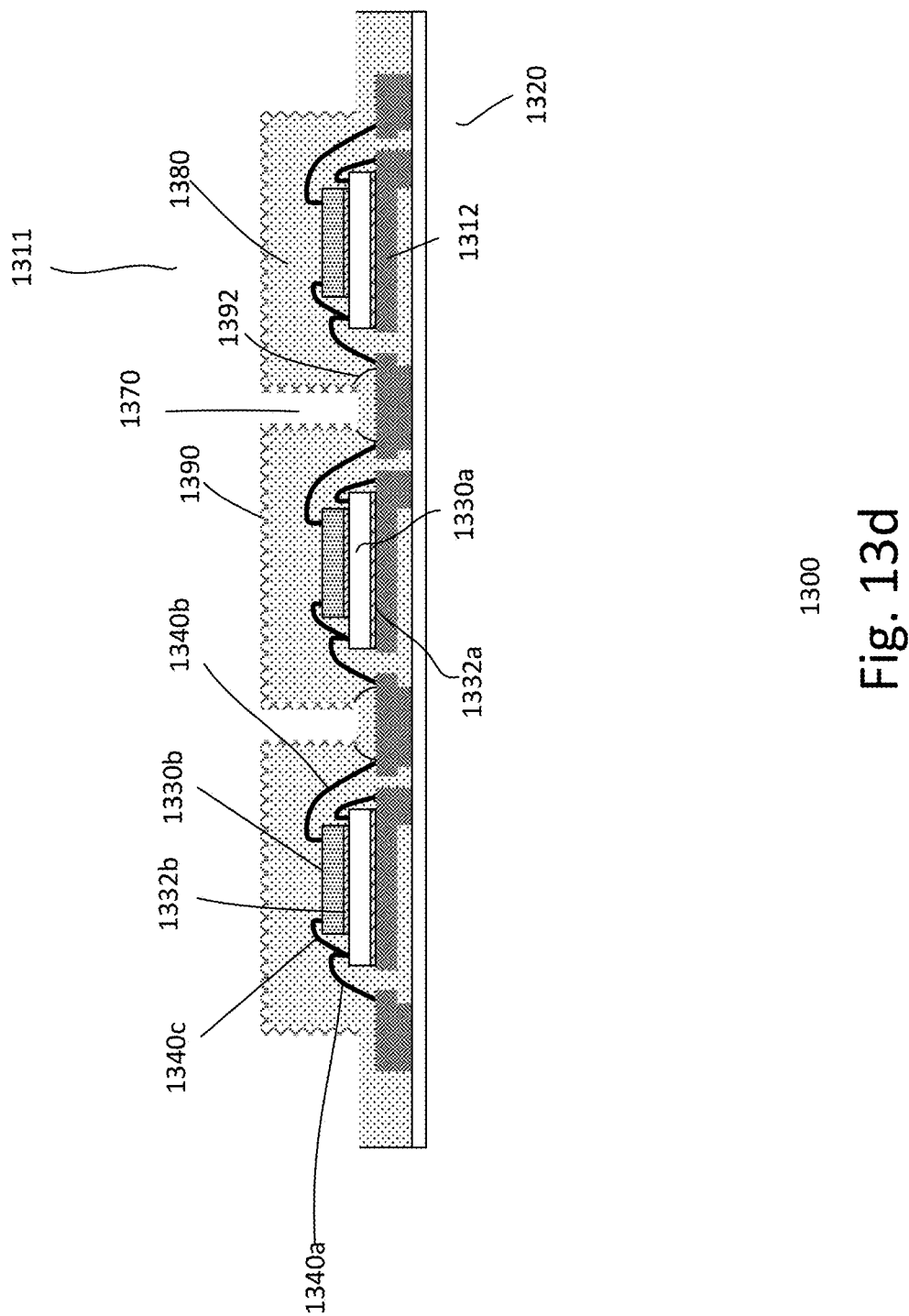

A plating process may be performed thereafter to form external shield structures 1390 over the respective package substrates in FIG. 13*d*. For example, a top surface and exposed upper sidewall portions of the encapsulant of the package substrate strip are plated with a conductive material, such as a Cu or Cu-alloy using a printing technique. Other techniques, such as sputtering or spray coating may also be useful. Each external shield structure serves to shield its respective package substrate from external EMI.

In one embodiment, the external shield structure is connected to the singulated end of the shield wire bond. For example, the shield wire bond connects the external shield structure to a package pad on the package substrate. In one embodiment, the shield wire bond is connected to a ground package pad on the package substrate to ground the external shield structure. Since the external shield structure is connected to the shield wire bond, it is also connected to ground.

Figure 13E:
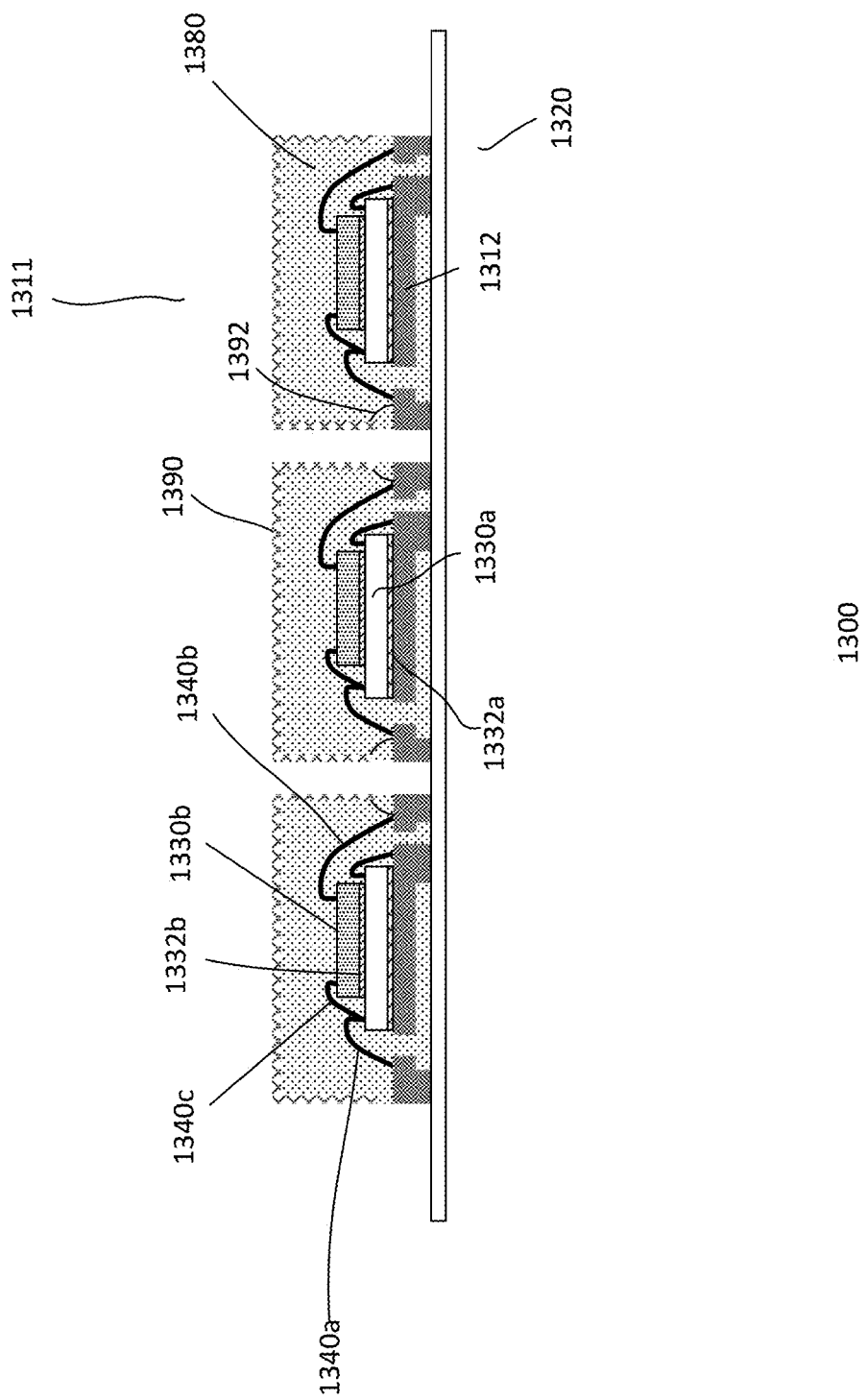

A full singulation is performed in FIG. 13*e* to singulate the package substrate strip into individual encapsulated packages. As shown, the encapsulant of each package includes lower sidewall portions which are aligned with the edges of the package substrate and upper sidewall portions which are recessed slightly from the lower sidewall portions. Other configurations of the encapsulated packages may also be useful.

It is appreciated that a thermal interface layer (TIL) may be optionally formed on the package substrate strip prior to the molding process. For example, a TIL (not shown) is formed on the top surface of an uppermost die of a die stack for each package substrate. The TIL may be an electrically or non-electrically conductive material. For example, the TIL, such as a silver filled epoxy, is formed by a plating process. Other techniques for forming the TIL may also be useful. The TIL serves as a bridging contact to enhance thermal coupling between the shield structure and the dies. This enables the shield structures to further serve as a heat dissipator or sink.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A device comprising:
    a package substrate having a die attach pad (DAP) and package pads;
    a die disposed on the DAP, the die is electrically coupled to the package pads;
    a primary electromagnetic interference (EMI) shield structure, the primary EMI shield structure comprises a primary EMI planar member covering the die,
        a first primary EMI leg member contiguous to a first side of the primary EMI planar member and extending downwards to the package substrate, the primary EMI shield structure forms a cavity over the die in which a cavity height of the cavity is defined by the first primary EMI leg member, wherein adjacent opposing sides of the first side of the primary EMI planar member do not include leg members extending downwards to the package substrate, leaving the die exposed on the adjacent opposing sides of the primary EMI planar member, and
        wherein the primary EMI shield structure is electrically coupled to ground; and
    an encapsulant, the encapsulant covers the first primary EMI leg member and the package substrate.

2. The device of claim 1 further comprises a thermal interface layer (TIL) disposed on a top die surface of the die and contacts a bottom surface of the primary EMI planar member, the TIL enables the primary EMI shield structure to further serve as a heat dissipator.

3. The device of claim 1 wherein the primary EMI shield structure comprises a second primary EMI leg member contiguous to a second side of the planar member which is an opposing side of the first side, the second primary EMI leg member extends downwards to the package substrate.

4. The device of claim 3 further comprises a thermal interface layer (TIL) disposed on a top die surface of the die and contacts a bottom surface of the primary EMI planar member, the TIL enables the primary EMI shield structure to further serve as a heat dissipator.

5. The device of claim 1 further includes a secondary EMI shield structure, wherein the secondary EMI shield structure comprises:
    a secondary EMI planar member which contacts a top surface of the primary EMI planar member; and
    the secondary EMI shield structure contacts a top encapsulant surface of the encapsulant which is coplanar with the top surface of the primary EMI planar member, wherein the top surface of the secondary EMI shield structure, the secondary EMI shield structure serves as an external EMI shield structure of the device, wherein the secondary EMI shield structure is coupled to ground by contacting the primary EMI shield structure.

6. The device of claim 5 further comprises a thermal interface layer (TIL) disposed on a top die surface of the die and contacts a bottom surface of the primary EMI planar member, the TIL enables the primary and secondary EMI shield structures to further serve as a heat dissipator.

7. The device of claim 5 wherein the secondary EMI shield structure comprises:
    the secondary EMI planar members; and secondary EMI side members, wherein the secondary EMI planar member and side members encase the primary EMI shield structure and encapsulant, the secondary EMI shield structure serves as an external EMI shield structure of the device, wherein the secondary EMI shield structure is coupled to ground by contacting the primary EMI shield structure.

8. The device of claim 7 further comprises a thermal interface layer (TIL) disposed on a top die surface of the die and contacts a bottom surface of the primary EMI planar member, the TIL enables the primary and secondary EMI shield structures to further serve as a heat dissipator 2.

9. The device of claim 7 wherein the primary EMI shield structure comprises a second primary EMI leg member contiguous to a second side of the planar member which is an opposing side of the first side, the second primary EMI leg member extends downwards to the package substrate.

10. The device of claim 9 wherein:
side surfaces of the encapsulation layer comprise a step profile, wherein
   a lower portion of the step profile of the encapsulation layer is aligned with side package substrate surfaces of the package substrate, and
   an upper portion of the step profile of the encapsulation layer is recessed from the lower portion; and
side secondary EMI members are disposed on the upper portion of step profile of the encapsulation layer and isolated from the package substrate by the lower portion of the step profile of the encapsulation layer to prevent the package pads from being shorted to ground.

11. The device of claim 7 wherein:
side surfaces of the encapsulation layer comprise a step profile, wherein
   a lower portion of the step profile of the encapsulation layer is aligned with side package substrate surfaces of the package substrate, and
   an upper portion of the step profile of the encapsulation layer is recessed from the lower portion; and
side secondary EMI members are disposed on the upper portion of step profile of the encapsulation layer and isolated from the package substrate by the lower portion of the step profile of the encapsulation layer to prevent the package pads from being shorted to ground.

12. The device of claim 1 further comprises:
a secondary EMI shield structure, wherein the secondary EMI shield structure includes
   a secondary EMI planar member which contacts a top surface of the primary EMI planar member, and
   the secondary EMI shield structure contacts a top encapsulant surface of the encapsulant which is coplanar with the top surface of the primary EMI planar member, wherein the secondary EMI shield structure is coupled to ground by contacting the primary EMI shield structure;
a tertiary EMI shield structure, the tertiary EMI shield structure includes
   a tertiary EMI planar member contacting a top surface of the secondary EMI planar member, and
   tertiary EMI side members, wherein the tertiary EMI planar member and side members encase the primary and secondary EMI shield structures to serve as an external EMI shield structure of the device, wherein the tertiary EMI shield structure is coupled to ground by contacting the secondary EMI shield structure.

13. The device of claim 12 further comprises a thermal interface layer (TIL) disposed on a top die surface of the die and contacts a bottom surface of the primary EMI planar member, the TIL enables the primary and secondary EMI shield structures to further serve as a heat dissipator.

14. A device comprising:
a package substrate having a die attach pad (DAP) and package pads;
a die disposed on the DAP, the die is electrically coupled to the package pads;
an encapsulation layer, the encapsulation layer covers the package substrate and the die, the encapsulation layer having a top encapsulation surface disposed above a top die surface;
a primary electromagnetic interference (EMI) shield structure, the primary EMI shield structure comprises a primary EMI planar member, the primary EMI planar member is disposed on the top encapsulation surface; and
a secondary EMI shield structure, the secondary EMI shield structure comprises
   a secondary EMI planar member the secondary EMI planar member disposed on a top primary planar surface of the primary EMI planar member,
   secondary EMI side members, the secondary EMI side members extend downwards from second planar member side surfaces of the secondary EMI planar member towards the package substrate,
   the secondary EMI shield structure encases the primary EMI shield structure, the die and encapsulation layer, the secondary EMI shield structure serves as an external EMI shield structure of the device, and
   wherein the secondary EMI shield structure is coupled to ground.

15. The device of claim 14 further comprises a thermal interface layer (TIL) disposed on a top die surface of the die and contacts a bottom surface of the primary EMI planar member, the TIL enables the primary and secondary EMI shield structures to further serve as a heat dissipator.

16. The device of claim 14 wherein:
side surfaces of the encapsulation layer comprise a step profile, wherein
   a lower portion of the step profile of the encapsulation layer is aligned with side package substrate surfaces of the package substrate, and
   an upper portion of the step profile of the encapsulation layer is recessed from the lower portion; and
side secondary EMI members are disposed on the upper portion of step profile of the encapsulation layer and isolated from the package substrate by the lower portion of the step profile of the encapsulation layer to prevent the package pads from being shorted to ground.

17. The device of claim 14 wherein the secondary EMI shield structure is coupled to ground by a wirebond connecting the secondary EMI shield structure to a ground package pad of the package pads.

18. A device comprising:
a package substrate having a die attach pad (DAP) and package pads;
a die disposed on the DAP, the die is electrically coupled to the package pads;
an encapsulation layer, the encapsulation layer covers the package substrate and the die, the encapsulation layer having a top encapsulation surface disposed above a top die surface;
an electromagnetic interference (EMI) shield structure, the EMI shield structure comprises
   an EMI planar member disposed on the top encapsulation layer surface, EMI side members, the EMI side members extend downwards from along a complete length of planar member side surfaces of the EMI planar member towards the package substrate without contacting the package substrate, the EMI shield structure encases the die and encapsulation layer, the EMI shield structure serves as an external EMI shield structure of the device, and wherein the EMI shield structure is coupled to ground by wire bonds connected to at least one of the EMI side members.

19. The device of claim 18 wherein:

side surfaces of the encapsulation layer comprise a step profile, wherein a lower portion of the step profile of the encapsulation layer is aligned with side package substrate surfaces of the package substrate, and an upper portion of the step profile of the encapsulation layer is recessed from the lower portion; and side secondary EMI members are disposed on the upper portion of step profile of the encapsulation layer and isolated from the package substrate by the lower portion of the step profile of the encapsulation layer to prevent the package pads from being shorted to ground.

20. The device of claim 18 further comprises a thermal interface layer (TIL) disposed on a top die surface of the die and contacts a bottom surface of the EMI planar member, the TIL enables the EMI shield structures to further serve as a heat dissipator.

\* \* \* \* \*